US009128376B2

(12) United States Patent
Kato et al.

(10) Patent No.: US 9,128,376 B2
(45) Date of Patent: Sep. 8, 2015

(54) PATTERN FORMING METHOD, ACTINIC RAY-SENSITIVE OR RADIATION-SENSITIVE RESIN COMPOSITION, RESIST FILM, METHOD FOR MANUFACTURING ELECTRONIC DEVICE, AND ELECTRONIC DEVICE

(71) Applicant: FUJIFILM Corporation, Minato-Ku, Tokyo (JP)

(72) Inventors: Keita Kato, Haibara-gun (JP); Michihiro Shirakawa, Haibara-gun (JP); Hidenori Takahashi, Haibara-gun (JP); Sou Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/280,128

(22) Filed: May 16, 2014

(65) Prior Publication Data

US 2014/0248556 A1 Sep. 4, 2014

Related U.S. Application Data

(63) Continuation of application No. PCT/JP2012/081427, filed on Nov. 28, 2012.

(30) Foreign Application Priority Data

Nov. 30, 2011 (JP) .................................. 2011-263003
Nov. 20, 2012 (JP) .................................. 2012-254323

(51) Int. Cl.
G03F 7/004 (2006.01)
G03F 7/32 (2006.01)
G03F 7/038 (2006.01)
H01L 21/027 (2006.01)
G03F 7/039 (2006.01)
C08F 220/18 (2006.01)

(52) U.S. Cl.
CPC ............ G03F 7/0388 (2013.01); C08F 220/18 (2013.01); G03F 7/0392 (2013.01); G03F 7/0397 (2013.01); G03F 7/325 (2013.01); H01L 21/0274 (2013.01)

(58) Field of Classification Search
CPC ......... G03F 7/004; G03F 7/0382; G03F 7/32; H01L 21/0274
USPC ....................... 430/270.1, 434, 435, 322, 325
See application file for complete search history.

(56) References Cited

U.S. PATENT DOCUMENTS

| 2007/0059632 | A1* | 3/2007 | Oguro et al. ............... 430/270.1 |
| 2010/0035192 | A1 | 2/2010 | Ando et al. |
| 2010/0331440 | A1* | 12/2010 | Maruyama et al. ........... 522/108 |
| 2011/0129777 | A1* | 6/2011 | Hatakeyama et al. ..... 430/270.1 |
| 2011/0177462 | A1* | 7/2011 | Hatakeyama et al. ........ 430/325 |
| 2011/0212390 | A1* | 9/2011 | Masunaga et al. ................ 430/5 |
| 2011/0236826 | A1* | 9/2011 | Hatakeyama et al. ..... 430/270.1 |
| 2011/0300485 | A1 | 12/2011 | Tsubaki et al. |
| 2012/0009529 | A1* | 1/2012 | Hatakeyama ................. 430/325 |
| 2012/0058427 | A1* | 3/2012 | Enomoto et al. ........... 430/270.1 |
| 2012/0244472 | A1 | 9/2012 | Tsuchimura et al. |
| 2012/0315449 | A1 | 12/2012 | Tsubaki et al. |
| 2013/0337385 | A1* | 12/2013 | Furukawa et al. ......... 430/285.1 |
| 2014/0212810 | A1* | 7/2014 | Hatakeyama et al. ..... 430/285.1 |

FOREIGN PATENT DOCUMENTS

| JP | 2008-292975 A | 12/2008 |
| JP | 2010-040849 A | 2/2010 |
| JP | 2010-217884 A | 9/2010 |
| JP | 2010204187 A * | 9/2010 |
| JP | 2011-113065 A | 6/2011 |
| JP | 2011-221513 A | 11/2011 |
| WO | 2012/114963 A1 | 8/2012 |

OTHER PUBLICATIONS

Machine translation of JP 2010-204187 (no date).*
Notice of Reasons for Rejection, dated Sep. 30, 2014, issued in corresponding JP Application No. 2012-254323, 12 pages in English and Japanese.
International Search Report of PCT/JP2012/081427 dated Jan. 22, 2013, 2 pages.
Written Opinion of the International Searching Authority of PCT/JP2012/081427 dated Jan. 22, 2013, 5 pages.

* cited by examiner

*Primary Examiner* — Amanda C Walke
(74) *Attorney, Agent, or Firm* — Sughrue Mion, PLLC

(57) ABSTRACT

A pattern forming method including: (i) forming a film using an actinic ray-sensitive or radiation-sensitive resin composition containing a resin (A) having a repeating unit having a group generating a polar group upon being decomposed by the action of an acid, and a repeating unit having an aromatic group, a compound (B) generating an acid upon irradiation with actinic rays or radiation, and a solvent (C); (ii) exposing the film; and (iii) developing the exposed film using a developer including an organic solvent to form a negative tone pattern, wherein the resin (A) is a resin having a repeating unit having a naphthyl group, and the like, and/or the actinic ray-sensitive or radiation-sensitive resin composition contains a compound (D) having a naphthalene ring, and the like.

30 Claims, No Drawings

PATTERN FORMING METHOD, ACTINIC RAY-SENSITIVE OR RADIATION-SENSITIVE RESIN COMPOSITION, RESIST FILM, METHOD FOR MANUFACTURING ELECTRONIC DEVICE, AND ELECTRONIC DEVICE

BACKGROUND OF THE INVENTION

1. Field of the Invention

The invention relates to a pattern forming method, an actinic ray-sensitive or radiation-sensitive resin composition, a resist film, a method for manufacturing an electronic device, and an electronic device, each of which is suitably used in a process for manufacturing semiconductors such as ICs, a process for manufacturing liquid crystals or circuit boards such as a thermal head, and lithographic processes in photofabrication in addition to these. In particular, the invention relates to a pattern forming method favorably used in exposure with a KrF exposure apparatus, an actinic ray-sensitive or radiation-sensitive resin composition, a resist film, a method for manufacturing an electronic device, and an electronic device.

2. Description of the Related Art

Since the development of a resist for use with a KrF excimer laser (248 nm), an image forming method known as chemical amplification has been used as an image forming method of a resist in order to compensate for sensitivity deterioration caused by light absorption. As an example, description will be given of a positive type chemical amplification image forming method, which is an image forming method in which, by exposure such as an excimer laser, electron beams, extreme ultraviolet light, or the like, an acid generator is decomposed at exposed portions to generate an acid, the generated acid is used as a reaction catalyst in a post exposure bake (PEB: Post Exposure Bake) to convert an alkali-insoluble group into an alkali-soluble group, and the exposed portions are removed using an alkali developer.

In the above-described method, various alkali developers have been proposed; however, an aqueous alkali developer having 2.38%-by-mass TMAH (tetramethylammonium hydroxide aqueous solution) is generally used. In patterning in which developing is performed with the above-described alkali developer, there is a problem of development defects generated after development since the peeling property of the film formed from the resist composition is poor.

As patterning in which developing is performed with the above-described alkali developer, for example, for the purpose of improving the sensitivity, high solubility contrast, pattern profile, and line edge roughness, and reducing standing waves and development defects, there is known a resist composition containing an anthracene compound (refer to JP2011-113065A).

On the other hand, as uses of the above-described resist technique, microfabrication applications such as ion implantation applications using the resist composition in ion implanting (charge injection) which is one step during the creation of a logic device or the like are continuing to be developed.

In a case where the resist composition is used as an ion implantation application, the resist composition may be coated, exposed, and developed on a substrate patterned in advance, and there is a demand for fine processing on an uneven substrate.

However, according to the influence of standing waves due to reflection of the exposure light from the substrate and the diffuse reflection of the exposure light due to an uneven portion in the above-described uneven substrate, the shape of the obtained pattern may be adversely affected.

In addition, a method providing an antireflection film (Bottom Anti-Reflective Coating: BARC) between the resist film and the substrate is known; however, if an antireflection film is provided, in particular, in a case where the resist composition is used as an ion implantation application, a step of removing the antireflection film by etching before the ion implantation is necessary, and the manufacturing costs are increased.

In addition, from the demand from the above-described fine processing technique, development is also being carried out on fine pattern forming using a negative image, as well as the current mainstream positive type, (for example, refer to JP2010-40849A, JP2008-292975A, and JP2010-217884A). This is because, in the manufacturing of semiconductor elements or the like, while there is a demand for forming a pattern having various shapes such as lines, trenches (grooves), and holes, there are patterns of trenches, holes, and the like which are difficult to form using the current positive type resist.

However, in the negative type pattern forming method according to such organic solvent development, there are problems in that the pattern easily takes on an undercut shape. In addition, there is room for improvement in the roughness property such as the line width roughness (Line Width Roughness: LWR), the exposure latitude (EL), and the reduction of developer defects.

SUMMARY OF THE INVENTION

Thus, unlike the positive type pattern forming method using an alkali developer, in the pattern forming method using organic solvent development, there is a demand for high solubility contrast, and, on the other hand, the problem of the standing waves in that the influence of the standing waves is clearly apparent in the optical image is remarkable, and this has become an inherent problem of the negative type pattern forming method using organic solvent development.

In consideration of the above-described problems, the object of the invention is to provide: a pattern forming method which inhibits the generation of standing waves having a remarkable influence in the negative type pattern forming method using organic solvent development without the need for an antireflection film, which is capable of forming a pattern having high rectangularity, which is capable of forming a fine trench (groove) pattern, which is excellent in exposure latitude and LWR, which is capable of reducing development defects, and which is particularly favorable in KrF exposure; an actinic ray-sensitive or radiation-sensitive resin composition used therein, a resist film, a method of manufacturing an electronic device, and an electronic device.

The invention has the configurations below, thereby accomplishing the above-described objects of the invention.

[1] A pattern forming method including:

(i) forming a film using an actinic ray-sensitive or radiation-sensitive resin composition containing a resin (A) having a repeating unit having a group generating a polar group upon being decomposed by the action of an acid, and a repeating unit having an aromatic group, a compound (B) generating an acid upon irradiation with actinic rays or radiation, and a solvent (C);

(ii) exposing the film; and (iii) developing the exposed film using a developer including an organic solvent to form a negative tone pattern, wherein the resin (A) is a resin having a repeating unit having a naphthyl group, a biphenyl group, an anthryl group, a fluorenone structure, an anthrone structure, a xanthone structure, a thioxanthone structure, a vinyl benzene structure or a diphenyl sulfone structure as the repeating unit having an aromatic group, and/or the actinic ray-sensitive or radiation-sensitive resin composition contains a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure.

[2] The pattern forming method according to [1], wherein the repeating unit having a group generating a polar group upon being decomposed by an action of an acid is a repeating unit represented by the following general formula (I).

[Chem. 1]

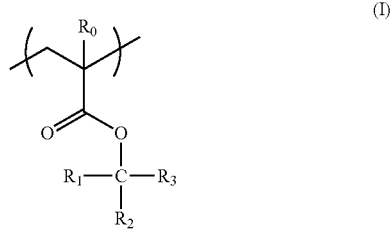
(I)

In the above-described general formula (I), $R_0$ represents a hydrogen atom or an alkyl group.

$R_1$ to $R_3$ each independently represent an alkyl group or a cycloalkyl group.

Two of $R_1$ to $R_3$ may be combined to form a monocyclic or polycyclic cycloalkyl group.

[3] The pattern forming method according to [1] or [2], wherein the repeating unit having an aromatic group is a repeating unit represented by the following general formula (II)

[Chem. 2]

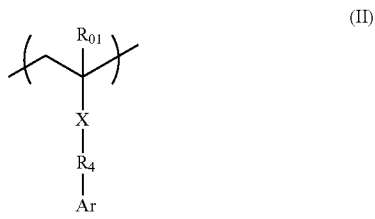
(II)

In the above-described general formula (II), $R_{01}$ represents a hydrogen atom or an alkyl group.

X represents a single bond or a divalent linking group.

Ar represents an aromatic group.

$R_4$ represents a single bond or an alkylene group.

[4] The pattern forming method according to [3], wherein, in the general formula (II), X is —COO— or —CONH—.

[5] The pattern forming method according to any one of [1] to [4], wherein content of the repeating unit represented by the following general formula (III) is 20 mol % or less, based on all the repeating units in the resin (A).

[Chem. 3]

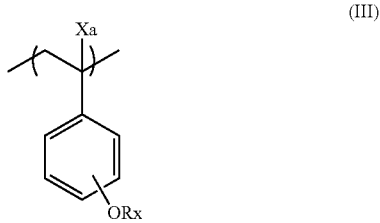
(III)

In the above-described general formula (III),

Xa represents a hydrogen atom or an alkyl group.

Rx represents a hydrogen atom or a group which leaves upon being decomposed by an action of an acid.

[6] The pattern forming method according to [5], wherein the resin (A) does not contain the repeating unit represented by the general formula (III).

[7] The pattern forming method according to any one of [1] to [6], wherein content of the repeating unit having a naphthyl group, a biphenyl group, an anthryl group, a fluorenone structure, an anthrone structure, a xanthone structure, a thioxanthone structure, a vinyl benzene structure or a diphenyl sulfone structure is 5 to 65 mol %, based on all the repeating units in the resin (A).

[8] The pattern forming method according to any one of [1] to [7], wherein the content of the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure is 0.1 to 6.0% by mass, based on a total solid content of the actinic ray-sensitive or radiation-sensitive resin composition.

[9] The pattern forming method according to any one of [1] to [8], wherein the content of the repeating unit having a group generating a polar group upon being decomposed by an action of an acid is 35 mol % or more, based on all the repeating units in the resin (A).

[10] The pattern forming method according to any one of [1] to [9], wherein the exposure in (ii) is exposure using a KrF excimer laser.

[11] The pattern forming method according to any one of [1] to [10], wherein the developer is a developer including at least one organic solvent selected from a group consisting of a ketone-based solvent, an ester-based solvent, an alcohol-based solvent, an amide-based solvent, and an ether-based solvent.

[12] An actinic ray-sensitive or radiation-sensitive resin composition used in the pattern forming method according to any one of [1] to [11], the composition including a resin (A) having a repeating unit having a group generating a polar group upon being decomposed by the action of an acid, and a repeating unit having an aromatic group, a compound (B) generating an acid upon irradiation with actinic rays or radiation; and a solvent (C), wherein the resin (A) is a resin having a repeating unit having a naphthyl group, a biphenyl group, an anthryl group, a fluorenone structure, an anthrone structure, a xanthone structure, a thioxanthone structure, a vinyl benzene structure or a diphenyl sulfone structure as the repeating unit having an aromatic group, and/or the actinic ray-sensitive or radiation-sensitive resin composition contains a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure.

[13] A resist film formed with the actinic ray-sensitive or radiation-sensitive resin composition according to [12]

[14] A method for manufacturing an electronic device including the pattern forming method according to any one of [1] to [11]

[15] An electronic device prepared by the method for manufacturing an electronic device described in [14].

The invention preferably has the following configurations.

[16] The pattern forming method according to any one of [1] to [11], wherein the repeating unit having the naphthyl group, the biphenyl group, the anthryl group, a fluorenone structure, an anthrone structure, a xanthone structure, a thioxanthone structure, a vinyl benzene structure or a diphenyl sulfone structure is a repeating unit represented by the following general formula (II')

[Chem. 4]

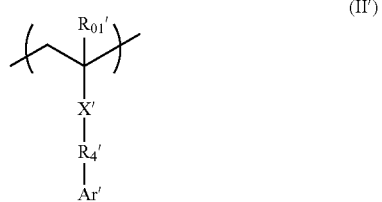

(II')

In the above-described general formula (II'),

Ar' represents a naphthyl group, a biphenyl group or an anthryl group, a fluorenone structure, an anthrone structure, a xanthone structure, a thioxanthone structure, a vinyl benzene structure or a diphenyl sulfone structure. $R_{01}'$, $X'$, and $R_4'$ respectively have the same meanings as $R_{01}$, $X$, and $R_4$ is the general formula (II).

[17] The pattern forming method according to any one of [1] to [11] and [16], wherein the film formed using the actinic ray-sensitive or radiation-sensitive resin composition is formed on a substrate which is not coated with an antireflection film.

[18] The pattern forming method according to [17] wherein the substrate which is not coated with an antireflection film is an uneven substrate.

[19] The pattern forming method according to any one of [1] to [11] and [16] to [18], wherein the content of the organic solvent in the developer including an organic solvent is from 90% by mass to 100% by mass, based on the total mass of the developer.

[20] The actinic ray-sensitive or radiation-sensitive resin composition according to [12], which is a chemically amplified resist composition for organic solvent development.

The present invention can provide a pattern forming method which inhibits the generation of standing waves having a remarkable influence in the negative type pattern forming method using organic solvent development without the need for an antireflection film, which is capable of forming a pattern having high rectangularity, which is capable of forming a fine trench (groove) pattern, which is excellent in exposure latitude and LWR, which is capable of reducing development defects, and which is particularly favorable in KrF exposure; an actinic ray-sensitive or radiation-sensitive resin composition used therein, a resist film, a method of manufacturing an electronic device, and an electronic device.

DESCRIPTION OF THE PREFERRED EMBODIMENTS

Hereinbelow, the embodiments of the invention will be described in detail.
In the description of a group (atomic group) in the present specification, when the group (atomic group) is described without specifying whether substituted or unsubstituted, the group includes both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

In the invention, the term "actinic ray" or "radiation" refers to, for example, a bright line spectrum of a mercury lamp, far ultraviolet rays typified by an excimer laser, extreme ultraviolet rays (EUV light), X-rays, an electron beam (EB), or the like. Further, the light in the invention refers to actinic rays or radiation.

Furthermore, unless otherwise specifically indicated, the term "exposure" in the present specification includes not only exposure to a mercury lamp, far ultraviolet rays typified by an excimer laser, X-rays, EUV light, or the like but also lithography with a particle beam such as an electron beam and an ion beam.

The pattern forming method of the invention includes:
(i) forming a film using an actinic ray-sensitive or radiation-sensitive resin composition containing a resin (A) having a repeating unit having a group (below referred to simply as "acid-decomposable group") generating a polar group upon being decomposed by the action of an acid, and a repeating unit having an aromatic group, a compound (B) generating an acid upon irradiation with actinic rays or radiation, and a solvent (C);
(ii) exposing the film; and
(iii) developing the exposed film using a developer including an organic solvent to form a negative tone pattern,
wherein the resin (A) is a resin having a repeating unit having a naphthyl group, a biphenyl group, an anthryl group, a fluorenone structure, an anthrone structure, a xanthone structure, a thioxanthone structure, a vinyl benzene structure or a diphenyl sulfone structure as the repeating unit having an aromatic group, and/or the actinic ray-sensitive or radiation-sensitive resin composition contains a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure.

The reason why the pattern forming method of the invention inhibits the generation of standing waves having a remarkable influence in the negative type pattern forming method using organic solvent development without the need for an antireflection film, is capable of forming a pattern having high rectangularity, is capable of forming a fine trench pattern, is excellent in exposure latitude (EL) and LWR, and is capable of reducing development defects, particularly in negative type pattern forming using developer including an organic solvent with KrF exposure, is not clear; however, it may be inferred to be as follows.

In the pattern forming method using organic solvent development, there is a demand for high solubility contrast from the viewpoint of forming a fine trench pattern or the like, and, on the other hand, the problem of the standing waves in that the influence of the standing waves is clearly apparent in the optical image is remarkable. In this respect, a reason may be inferred to be that, in the pattern forming method of the invention, since the resin (A) is a resin having a repeating unit having a naphthyl group, a biphenyl group, an anthryl group, a fluorenone structure, an anthrone structure, a xanthone structure, a thioxanthone structure, a vinyl benzene structure or a diphenyl sulfone structure as the repeating unit having an aromatic group, and/or the actinic ray-sensitive or radiation-sensitive resin composition contains a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure, the exposure light of the KrF excimer laser or the like can be absorbed without the need for an antireflection film, whereby the influence of standing waves due to reflection of the exposure light from the substrate and the diffuse reflection of the exposure light due to an uneven portion in the uneven substrate can be reduced, and a pattern having high rectangularity can be formed.

In addition, a reason may be inferred to be that, by sufficiently decreasing the solubility with respect to the organic based developer of the exposed portion by combining the repeating unit having the acid-decomposable group and the repeating unit having the aromatic group in the resin (A) while sufficiently preserving the solubility of unexposed portions and improving the solubility contrast, excellent EL and LWR and high rectangularity could be obtained in the resist patterns such as the fine trench patterns which could be formed by the negative type pattern forming using the organic based developer.

For the pattern forming method of the invention, the developer is preferably a developer including at least one organic solvent selected from a group consisting of a ketone-based solvent, an ester-based solvent, an alcohol-based solvent, an amide-based solvent, and an ether-based solvent.

The pattern forming method of the invention preferably further includes (iv) washing with a rinsing liquid including an organic solvent.

The rinsing liquid is preferably a rinsing liquid including at least one organic solvent selected from a group consisting of a hydrocarbon-based solvent, a ketone-based solvent, an ester-based solvent, an alcohol-based solvent, an amide-based solvent, and an ether-based solvent.

The pattern forming method of the invention preferably includes (v) heating after the (ii) exposure.

For the pattern forming method of the invention, the resin (A) is a resin having an increased polarity by the action of an acid, and thus, having an increased solubility in an alkali developer, and the pattern forming method may further include (vi) developing using an alkali developer.

The pattern forming method of the invention may include (ii) exposure plural times. The pattern forming method of the invention may include (v) heating plural times.

The resist film of the invention is a film formed by the actinic ray-sensitive or radiation-sensitive resin composition, and is also a film formed by, for example, coating a substrate with the actinic ray-sensitive or radiation-sensitive resin composition.

Hereinbelow, the actinic ray-sensitive or radiation-sensitive resin composition that is used and obtained in the invention will be described.

Furthermore, the invention also relates to the actinic ray-sensitive or radiation-sensitive resin composition as described later.

The actinic ray-sensitive or radiation-sensitive resin composition according to the invention is used for negative type development (development in which the solubility in a developer decreases upon exposure, and thus, the exposed area remains as a pattern and the non-exposed area is removed). That is, the actinic ray-sensitive or radiation-sensitive resin composition according to the invention can be used as an actinic ray-sensitive or radiation-sensitive resin composition for organic solvent development, that is used for development using a developer including an organic solvent. Here, the use for an organic solvent development refers to a use for development using at least a developer including an organic solvent.

The actinic ray-sensitive or radiation-sensitive resin composition of the invention is typically a resist composition, and is preferably a negative type resist composition (that is, a resist composition for organic solvent development) from the viewpoint of obtaining particularly superior effects. In addition, the composition according to the invention is typically a chemically amplified resist composition.

[1] Resin (A) Having a Repeating Unit Having an Acid-Decomposable Group (Below, Simply Referred to as "Resin (A)")

The resin (A) used in the actinic ray-sensitive or radiation-sensitive resin composition according to the invention is a resin having an acid-decomposable group (below, simply referred to as "acid-decomposable resin"), and is a resin in which the solubility with respect to the developer including the organic solvent is decreased by increasing the polarity using the action of an acid.

Examples of the resin (A) used in the actinic ray-sensitive or radiation-sensitive resin composition according to the invention can include resins having at least one kind of acid-decomposable group at the main chain or the side chain of the resin, or both the main chain and the side chain.

Repeating Unit Having an Acid-Decomposable Group

The acid-decomposable group preferably has a structure in which the polar group is protected by a group which leaves upon being decomposed by an action of an acid. The polar group is not particularly limited as long as it is a group that is sparingly soluble or insoluble in a developer including an organic solvent, but examples thereof include acidic groups such as a carboxyl group and a sulfonic acid group (groups that are dissociated in a 2.38%-by-mass aqueous tetramethylammonium hydroxide solution used as a developer for a resist), and an alcoholic hydroxyl group.

Herein, the alcoholic hydroxyl group refers to a hydroxyl group other than a hydroxyl group directly bonded to an aromatic ring as a hydroxyl group bonded to a hydrocarbon skeleton (phenolic hydroxyl group), excluding an aliphatic alcohol having the α-position substituted with an electron withdrawing group such as a fluorine atom (for example, a fluorinated alcohol group (a hexafluoroisopropanol group or the like)). As the alcoholic hydroxyl group, a hydroxyl group having a pKa of 12 to 20 is preferred.

The acid-decomposable group is preferably a group formed by substituting a group which leaves by the action of an acid for a hydrogen atom of the polar group. Examples of the group which leaves by the action of an acid include $-C(R_{36})(R_{37})(R_{38})$, $-C(R_{36})(R_{37})(OR_{39})$, and $-C(R_{01})(R_{02})(OR_{39})$.

In the general formula, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring. $R_{01}$ and $R_{02}$ each independently represent a hydrogen atom, an alkyl group, a cycloalkyl group, an aryl group, an aralkyl group, or an alkenyl group.

The alkyl group of $R_{36}$ to $R_{39}$, $R_{01}$, and $R_{02}$ is preferably an alkyl group having 1 to 8 carbon atoms, and examples thereof include a methyl group, an ethyl group, a propyl group, an n-butyl group, a sec-butyl group, a hexyl group, and an octyl group.

The cycloalkyl group of $R_{36}$ to $R_{39}$, $R_{01}$, and $R_{02}$ may be either monocyclic or polycyclic. The monocyclic cycloalkyl group is preferably a cycloalkyl group having 3 to 8 carbon atoms, and examples thereof include a cyclopropyl group, a cyclobutyl group, a cyclopentyl group, a cyclohexyl group, and a cyclooctyl group. The polycyclic cycloalkyl group is preferably a cycloalkyl group having 6 to 20 carbon atoms, and examples thereof include an adamantyl, a norbornyl group, an isobornyl group, a camphanyl group, a dicyclopentyl group, an α-pinel group, a tricyclodecanyl group, a tetracyclododecyl group, and an androstanyl group. Further, at least one carbon atom in the cycloalkyl group may be substituted with a heteroatom such as an oxygen atom.

The aryl group of $R_{36}$ to $R_{39}$, $R_{01}$, and $R_{02}$ is preferably an aryl group having 6 to 10 carbon atoms, and examples thereof include a phenyl group, a naphthyl group, and an anthryl group.

The aralkyl group of $R_{36}$ to $R_{39}$, $R_{01}$, and $R_{02}$ is preferably an aralkyl group having 7 to 12 carbon atoms, and examples thereof include a benzyl group, a phenethyl group, and a naphthylmethyl group.

The alkenyl group of $R_{36}$ to $R_{39}$, $R_{01}$, and $R_{02}$ is preferably an alkenyl group having 2 to 8 carbon atoms, and examples thereof include a vinyl group, an allyl group, a butenyl group, and a cyclohexenyl group.

The ring formed by the mutual bonding of $R_{36}$ and $R_{37}$ is preferably a cycloalkyl group (monocyclic or polycyclic) The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. A monocyclic cycloalkyl group having 5 or 6 carbon atoms is more preferred, and a monocyclic cycloalkyl group having 5 carbon atoms is particularly preferred.

As the repeating unit having an acid-decomposable group, which is contained in the resin (A), a repeating unit represented by the following general formula (I) is preferred

[Chem. 5]

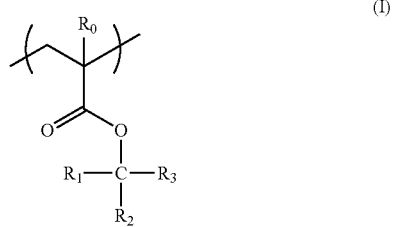

(I)

In the above-described general formula (I), $R_0$ represents a hydrogen atom or a linear or branched alkyl group.

$R_1$ to $R_3$ each independently represent a linear or branched alkyl group or a monocyclic or polycyclic cycloalkyl group.

Two of $R_1$ to $R_3$ may be bonded to form a monocyclic or polycyclic cycloalkyl group.

As the linear or branched alkyl group for $R_0$, a linear or branched alkyl group having 1 to 4 carbon atoms which may have a substituent is preferred, and examples thereof include a methyl group, an ethyl group, an n-propyl group, an isopropyl group, an n-butyl group, an isobutyl group, and a t-butyl group. As the substituent, examples include a hydroxyl group, and a halogen atom (for example, a fluorine atom).

$R_0$ is preferably a hydrogen atom, a methyl group, a trifluoromethyl group or a hydroxymethyl group.

The alkyl group of $R_1$ to $R_3$ is preferably an alkyl group having 1 to 4 carbon atoms, such as a methyl group, an ethyl group, an n-propyl group, an isopropyl group, an n-butyl group, an isobutyl group, and a t-butyl group.

The cycloalkyl group of $R_1$ to $R_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group.

The cycloalkyl group formed by the bonding of at least two members of $R_1$ to $R_3$ is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group, and particularly preferably a monocyclic cycloalkyl group having 5 to 6 carbon atoms.

As a preferred embodiment, examples include an embodiment where $R_1$ is a methyl group or an ethyl group, and $R_2$ and $R_3$ are bonded to each other to form the above-described cycloalkyl group.

Each of the groups above may have a substituent, and examples of the substituent include a hydroxyl group, a halogen atom (for example, a fluorine atom), an alkyl group (having 1 to 4 carbon atoms), a cycloalkyl group (having 3 to 8 carbon atoms), an alkoxy group (having 1 to 4 carbon atoms), a carboxyl group, and an alkoxycarbonyl group (having 2 to 6 carbon atoms), and the substituent preferably has 8 or less carbon atoms.

As a particularly preferred embodiment of the repeating units represented by the general formula (I), there is one in which $R_1$, $R_2$, and $R_3$ each independently represent a linear or branched alkyl group.

In this embodiment, as the linear or branched alkyl group for $R_1$, $R_2$, and $R_3$, an alkyl group having 1 to 4 carbon atoms is preferred, and examples thereof include a methyl group, an ethyl group, an n-propyl group, an isopropyl group, an n-butyl group, an isobutyl group, and a tert-butyl group.

As $R_1$, a methyl group, an ethyl group, an n-propyl group, and an n-butyl group are preferred, a methyl group and an ethyl group are more preferred, and a methyl group is particularly preferred.

As $R_2$, a methyl group, an ethyl group, an n-propyl group, an isopropyl group, and an n-butyl group are preferred, a methyl group and an ethyl group are more preferred, and a methyl group is particularly preferred.

As $R_3$, a methyl group, an ethyl group, an n-propyl group, an isopropyl group, an n-butyl group, an isobutyl group, and a tert-butyl group are preferred, a methyl group, an ethyl group, an isopropyl group, and an isobutyl group are more preferred, and a methyl group, an ethyl group, and an isopropyl group are particularly preferred.

Preferred specific examples of the repeating unit having an acid-decomposable group are illustrated below, but the invention is not limited thereto.

In the specific examples, Rx represents a hydrogen atom, $CH_3$, $CF_3$, or $CH_2OH$. Rxa and Rxb each represent an alkyl group having 1 to 4 carbon atoms. Z represents a substituent, and when a plurality of Z's are present, they may be the same as or different from each other p represents 0 or a positive integer. Specific examples and preferred examples of Z are the same as specific examples and preferred examples of the substituent that each group of $R_1$ to $R_3$ and the like may have.

[Chem. 6]

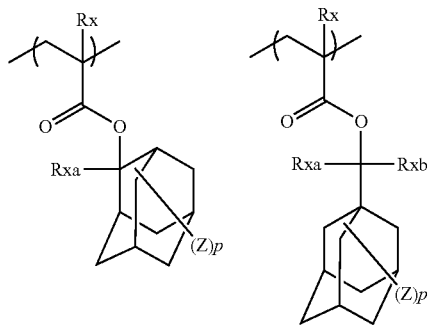

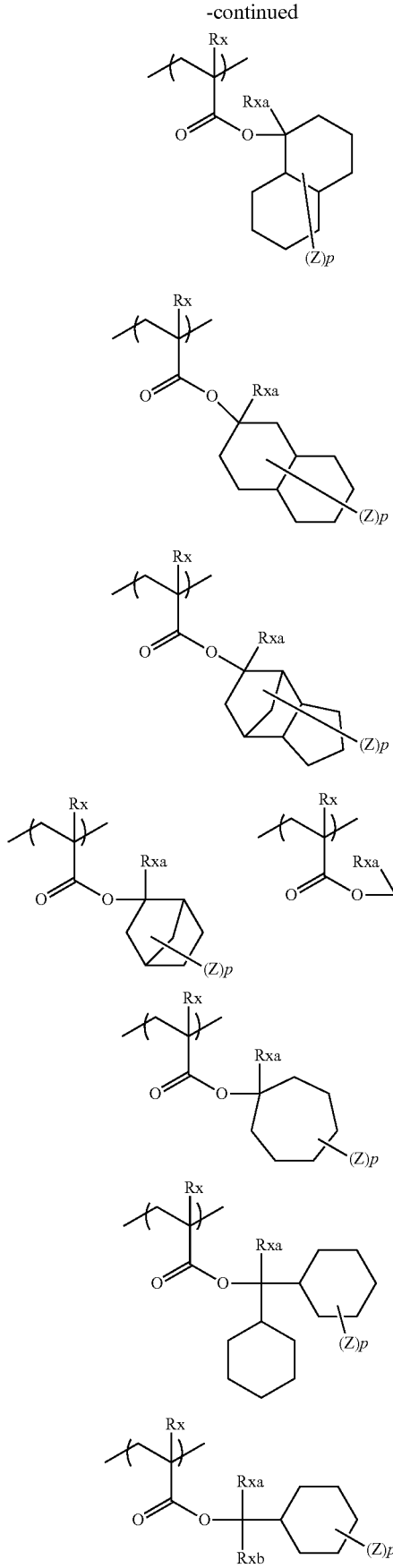
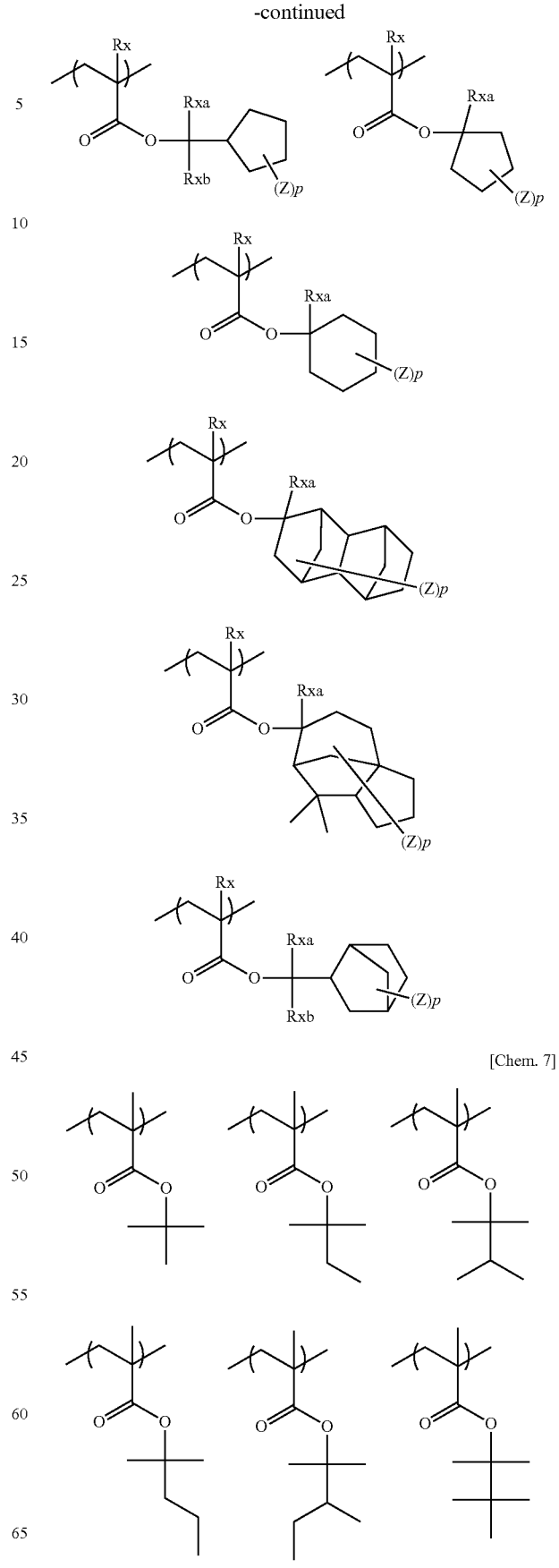
[Chem. 7]

-continued
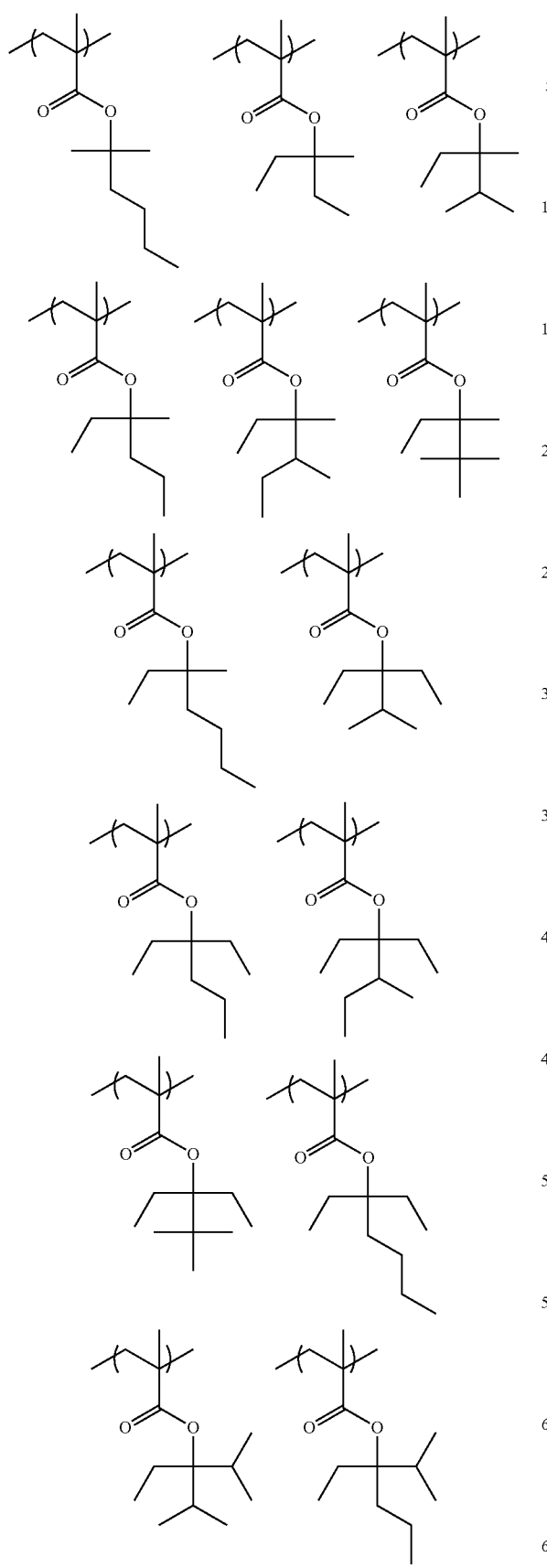
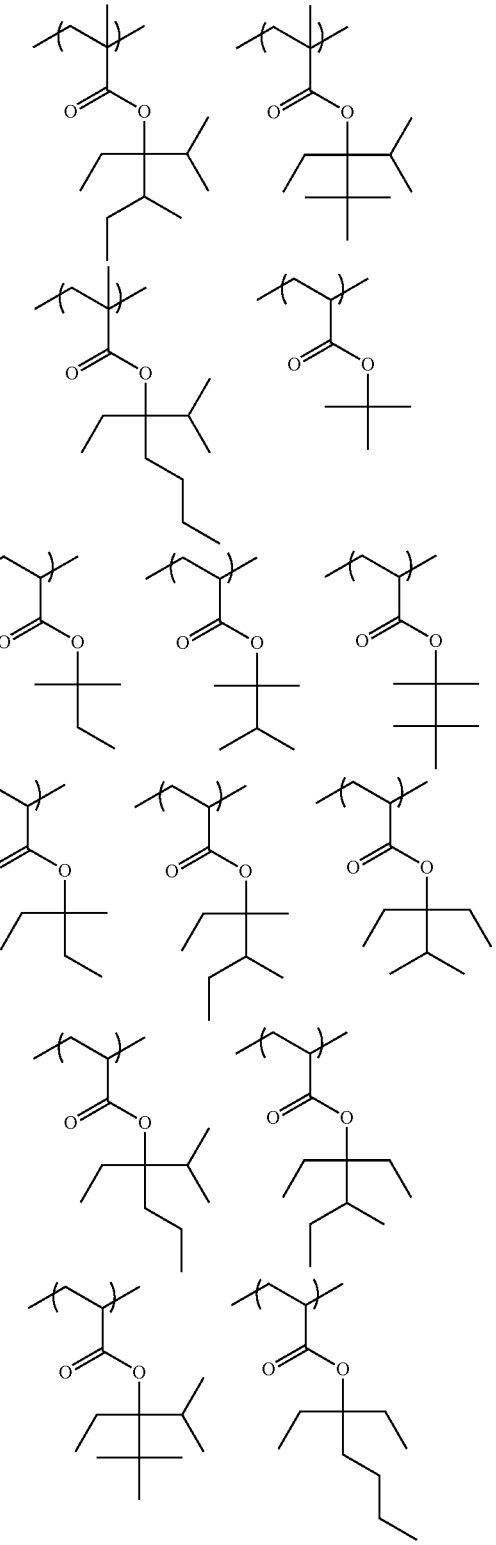
The repeating unit having the acid-decomposable group of the resin (A) may be used singly or in combination of two or more kinds thereof.
In the resin (A) in the invention, the content (in a case where a plurality of types are contained, the total thereof) of the repeating unit (preferably, the repeating unit represented by the general formula (I)) having the acid-decomposable group is preferably 35 mol % or more based on all the repeating units in the resin (A), more preferably 35 to 95 mol %, even more preferably 40 to 85 mol %, and particularly preferably 45 to 75 mol %, from the viewpoint of sufficiently decreasing the solubility with respect to the organic based developer of the exposed portions while sufficiently preserving the solubility of the unexposed portions and improving the solubility contrast.

Repeating Unit Having an Aromatic Group

In the invention, the resin (A) has a repeating unit having an aromatic group.

The aromatic group may have a substituent, and is preferably an aryl group having 6 to 20 carbon atoms and examples thereof include a phenyl group, a naphthyl group, a biphenyl group, an anthryl group, a fluorenone structure, an anthrone structure, a xanthone structure, a thioxanthone structure, a vinyl benzene structure or a diphenyl sulfone structure, and the combination of two or more kinds thereof.

The substituent is not particularly limited, and examples thereof include a linear or branched alkyl group having 1 to 4 carbon atoms, a cycloalkyl group having 3 to 10 carbon atoms, an aryl group having 6 to 10 carbon atoms, a halogen atom such as a fluorine atom, a cyano group, an amino group, a nitro group, or a carboxyl group. As the substituent the linear or branched alkyl group having 1 to 4 carbon atoms, the cycloalkyl group having 3 to 10 carbon atoms, and the aryl group having 6 to 10 carbon atoms may have a further substituent, examples thereof including a halogen atom such as a fluorine atom.

In a case where the aromatic group is a phenyl group and the phenyl group has a substituent, the substituent is preferably substituted at the fourth position of the phenyl group.

As the aromatic group, a phenyl group which may be substituted is preferred from the viewpoint of etching resistance. The repeating unit having the aromatic group of the resin (A) may be used singly or in combination of two or more kinds thereof.

In the invention, it is preferred that the repeating unit having the aromatic group be the repeating unit represented by the following general formula (II).

[Chem. 8]

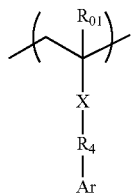

(II)

In the above-described general formula (II), $R_{01}$ represents a hydrogen atom or a linear or branched alkyl group.

X represents a single bond or a divalent linking group.

Ar represents an aromatic group.

$R_4$ represents a single bond or an alkylene group.

Specific examples and preferred examples of the linear or branched alkyl group for $R_{01}$ are the same as previously described for the specific examples and preferred examples of the linear or branched alkyl group for $R_0$ in the general formula (I).

X is preferably a divalent linking group. Preferable examples of this divalent linking group include —COO— and —CONH—.

Specific examples and preferred examples of the aromatic group Ar are the same as those previously described for the specific examples and preferred examples of aromatic groups. The alkylene group for $R_4$ may have a substituent, and is preferably an alkylene group having 1 to 4 carbon atoms and examples thereof include a methylene group, an ethylene group, and a propylene group.

As substituents which the alkylene group for $R_4$ may have, examples include an alkyl group having 1 to 4 carbon atoms, or a halogen atom such as a fluorine atom.

The substituents which the alkylene group for $R_4$ may have and the substituents which the aromatic group Ar may have may be bonded to form a ring, and examples of the groups forming the ring include alkylene groups (for example, an ethylene group, and a propylene group).

$R_4$ is preferably a methylene group which may be substituted with a single bond or a substituent from the viewpoint of a suitable glass transition temperature (Tg) of the resin in the pattern forming.

In the resin (A) in the invention, the content (in a case where a plurality of types are contained, the total thereof) of the repeating unit (preferably, the repeating unit represented by the general formula (II)) having the aromatic group is preferably 5 to 70 mol % based on all the repeating units in the resin (A), more preferably 10 to 60 mol %, and particularly preferably 20 to 50 mol %, from the viewpoint of sufficiently decreasing the solubility with respect to the organic based developer of the exposed portions while sufficiently preserving the solubility of the unexposed portions and improving the solubility contrast and from the viewpoint of imparting etching resistance.

Specific examples of the repeating unit having an aromatic group are shown; however, the invention is not limited thereto. In the formula, a is an integer of 1 or 2.

[Chem. 9]

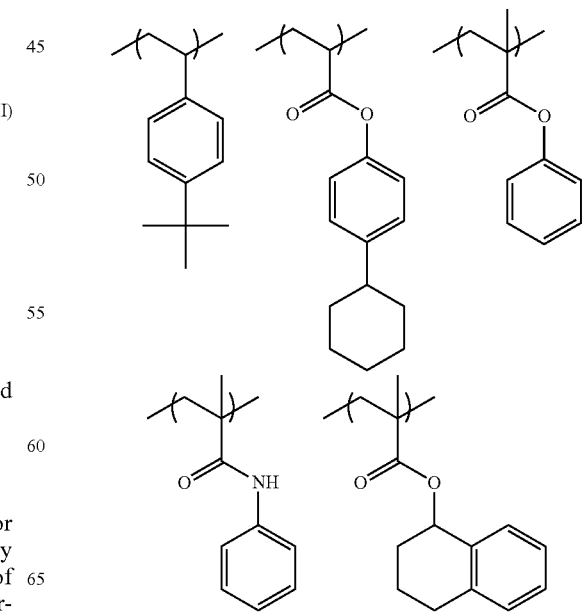

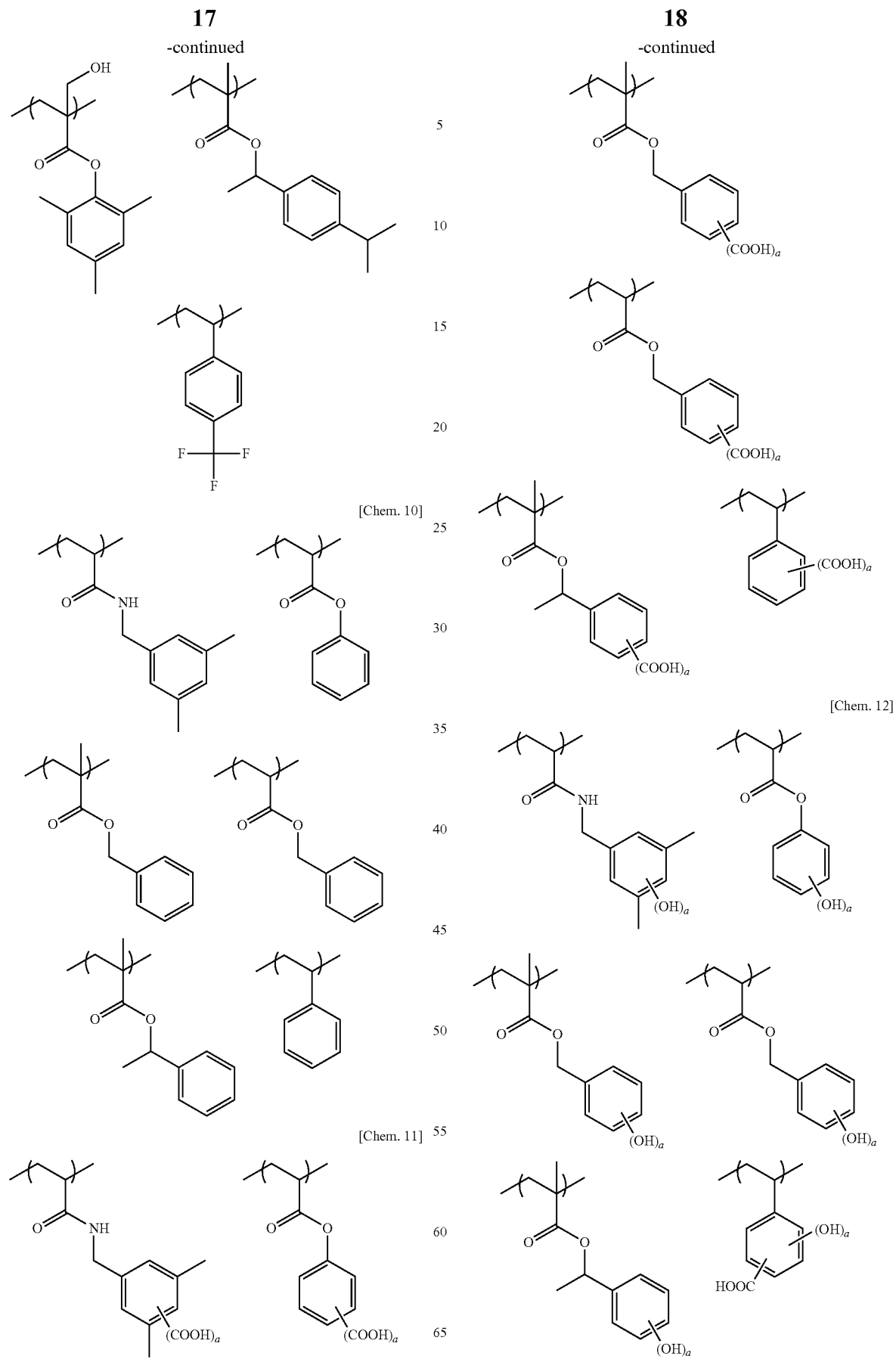

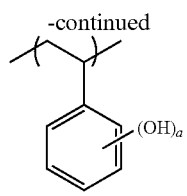

Repeating unit having a naphthyl group, a biphenyl group, an anthryl group, a fluorenone structure, an anthrone structure, a xanthone structure, a thioxanthone structure, a vinyl benzene structure or a diphenyl sulfone structure In the invention, as one embodiment, the resin (A) is a resin having a repeating unit having a naphthyl group, a biphenyl group, an anthryl group, a fluorenone structure, an anthrone structure, a xanthone structure, a thioxanthone structure, a vinyl benzene structure or a diphenyl sulfone structure as an aromatic group in the repeating unit having an aromatic group.

Since the repeating unit having a naphthyl group, a biphenyl group, an anthryl group, a fluorenone structure, an anthrone structure, a xanthone structure, a thioxanthone structure, a vinyl benzene structure or a diphenyl sulfone structure can absorb the exposure light of the KrF excimer laser or the like, the influence of standing waves due to reflection of the exposure light from the substrate and the diffuse reflection of the exposure light due to an uneven portion in the uneven substrate can be reduced, and a pattern having high rectangularity can be formed.

Regardless of whether or not the actinic ray-sensitive or radiation-sensitive resin composition contains a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure, the resin (A) can have a repeating unit having a naphthyl group, a biphenyl group, an anthryl group, a fluorenone structure, an anthrone structure, a xanthone structure, a thioxanthone structure, a vinyl benzene structure or a diphenyl sulfone structure.

The naphthyl group, the biphenyl group the anthryl group, the fluorenone structure, the anthrone structure, the xanthone structure, the thioxanthone structure, the vinyl benzene structure or the diphenyl sulfone structure in the repeating unit having a naphthyl group, a biphenyl group, an anthryl group, a fluorenone structure, an anthrone structure, a xanthone structure, a thioxanthone structure, a vinyl benzene structure or a diphenyl sulfone structure, may be substituted, and examples of the substituent include the same ones that the aromatic group may have in the above-described Repeating unit having an aromatic group.

In the invention, preferred embodiments include one in which, as the repeating unit having a naphthyl group, a biphenyl group, an anthryl group, a fluorenone structure, an anthrone structure, a xanthone structure, a thioxanthone structure, a vinyl benzene structure or a diphenyl sulfone structure, the aromatic group Ar in the general formula (II) of the above-described Repeating unit having an aromatic group is a repeating unit which is a naphthyl group, a biphenyl group, an anthryl group, a fluorenone structure, an anthrone structure, a xanthone structure, a thioxanthone structure, a vinyl benzene structure or a diphenyl sulfone structure.

Specifically, the repeating unit is preferably a repeating unit represented by the following general formula (II').

[Chem. 13]

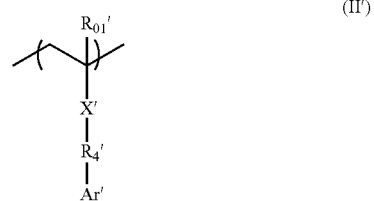

In the above-described general formula (II'),

Ar' represents a naphthyl group, a biphenyl group, an anthryl group, a fluorenone structure, an anthrone structure, a xanthone structure, a thioxanthone structure, a vinyl benzene structure or a diphenyl sulfone structure.

$R_{01}'$, $X'$, and $R_4'$ respectively have the same meanings as $R_{01}$, $X$, and $R_4$ in the general formula (II).

The naphthyl group, the biphenyl group, the anthryl group, the fluorenone structure, the anthrone structure, the xanthone structure, the thioxanthone structure, the vinyl benzene structure or the diphenyl sulfone structure (Ar') may have a substituent, and examples of the substituent include the same ones that the aromatic group may have in the above-described repeating unit having an aromatic group.

The content of the repeating unit having the naphthyl group, the biphenyl group, the anthryl group, the fluorenone structure, the anthrone structure, the xanthone structure, the thioxanthone structure, the vinyl benzene structure or the diphenyl sulfone structure based on all the repeating units in the resin (A) is preferably 5 to 65 mol %, more preferably 10 to 55 mol %, and even more preferably 15 to 45 mol %.

If the content of the repeating unit having the naphthyl group, the biphenyl group, the anthryl group, the fluorenone structure, the anthrone structure, the xanthone structure, the thioxanthone structure, the vinyl benzene structure or the diphenyl sulfone structure is excessively large, there may be cases where the pattern shape is deteriorated due to a decrease in the transmittance with respect to exposure light such as the KrF excimer laser.

Specific examples of the repeating unit having the naphthyl group, the biphenyl group, the anthryl group, the fluorenone structure, the anthrone structure, the xanthone structure, the thioxanthone structure, the vinyl benzene structure or the diphenyl sulfone structure are shown; however, the invention is not limited thereto. In the formula, a is an integer of 1 or 2.

[Chem. 14]

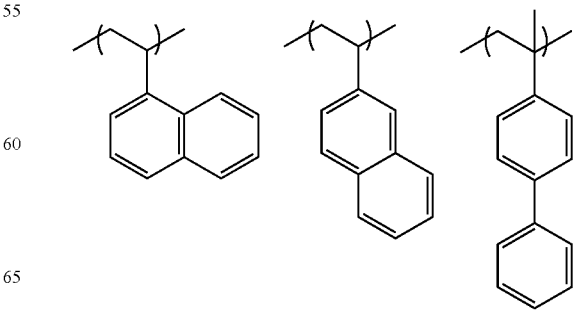

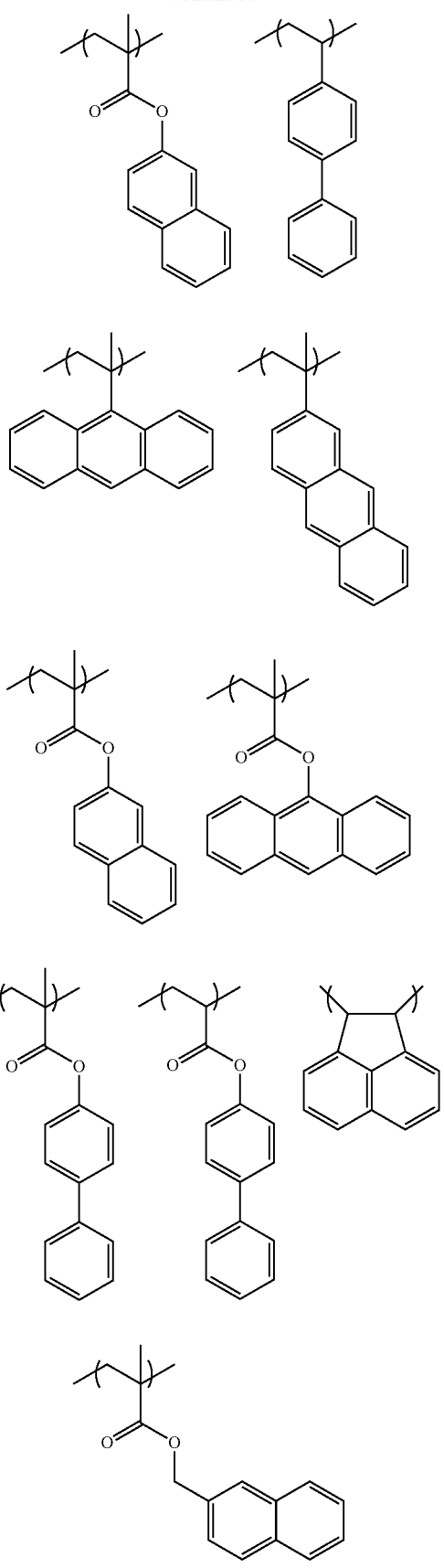
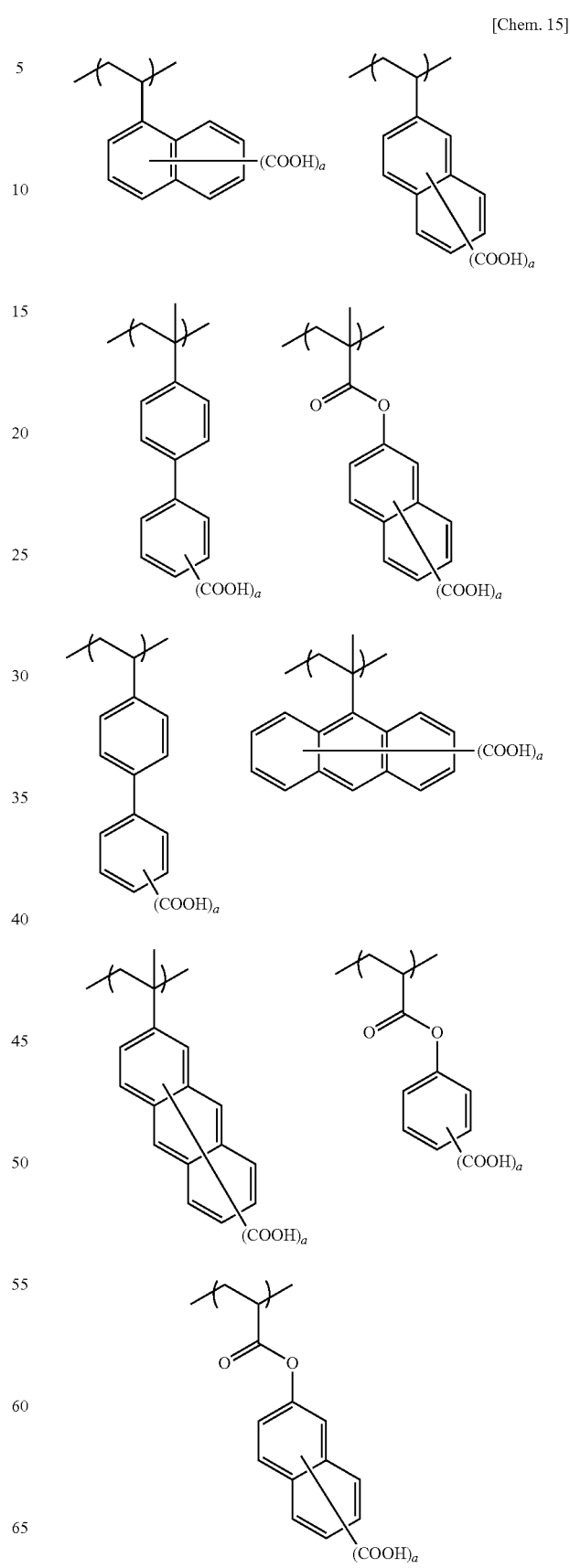

-continued
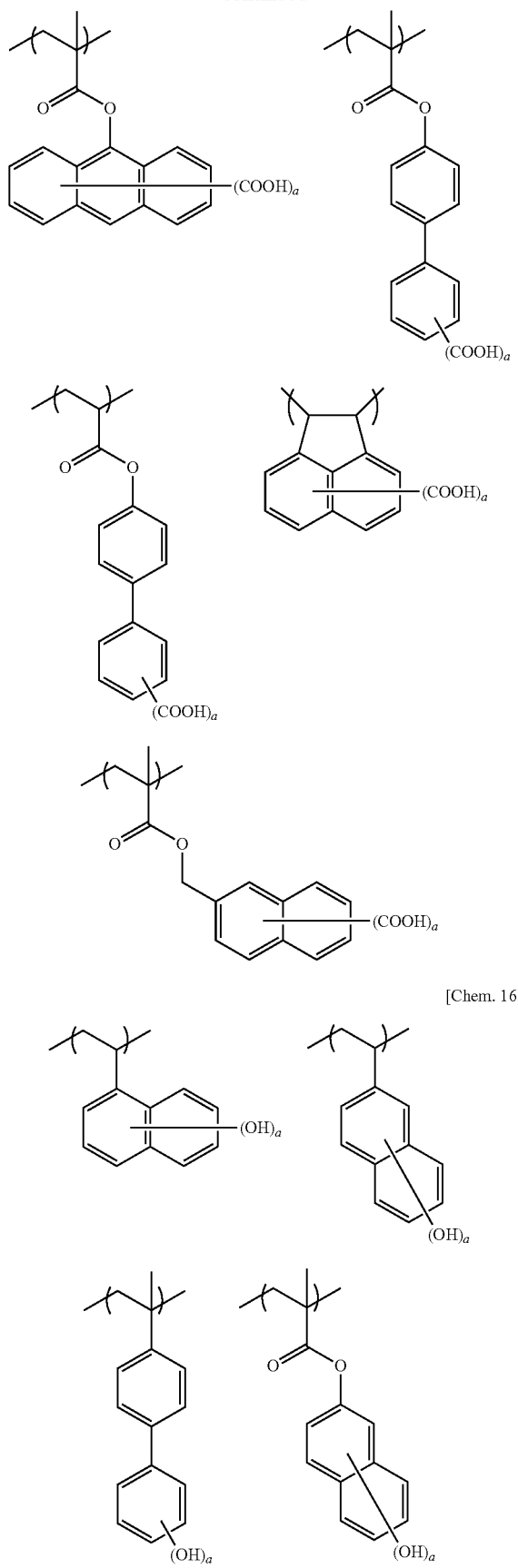
[Chem. 16]
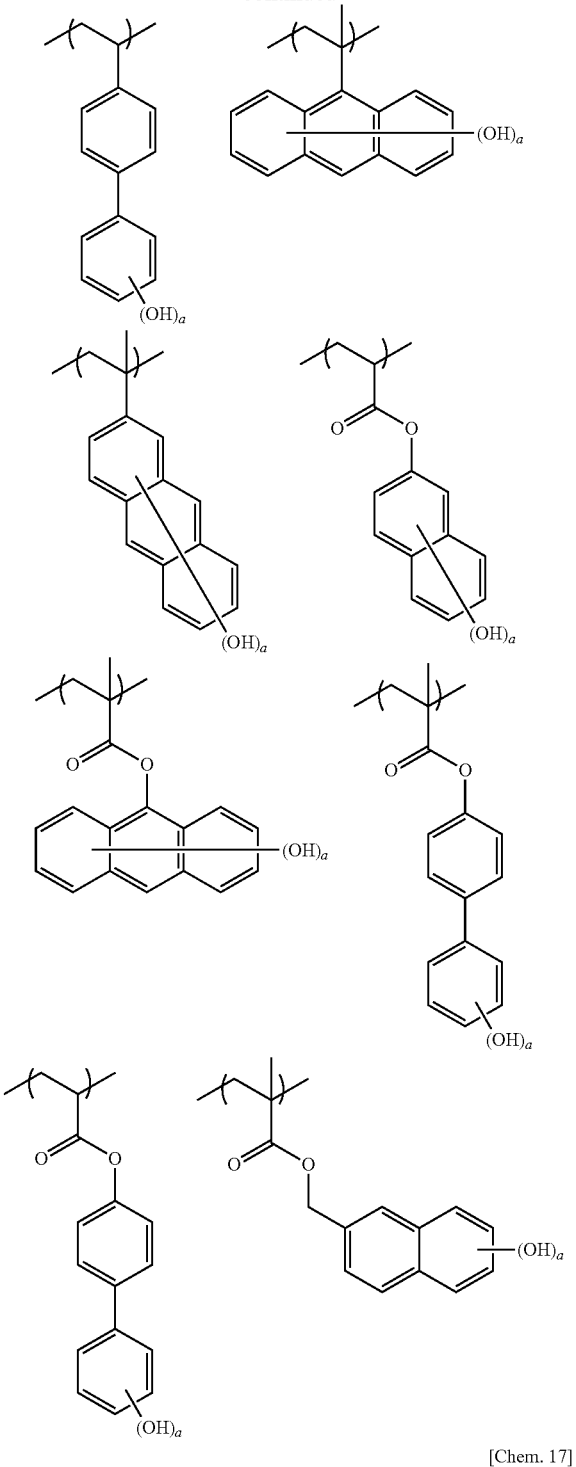
[Chem. 17]

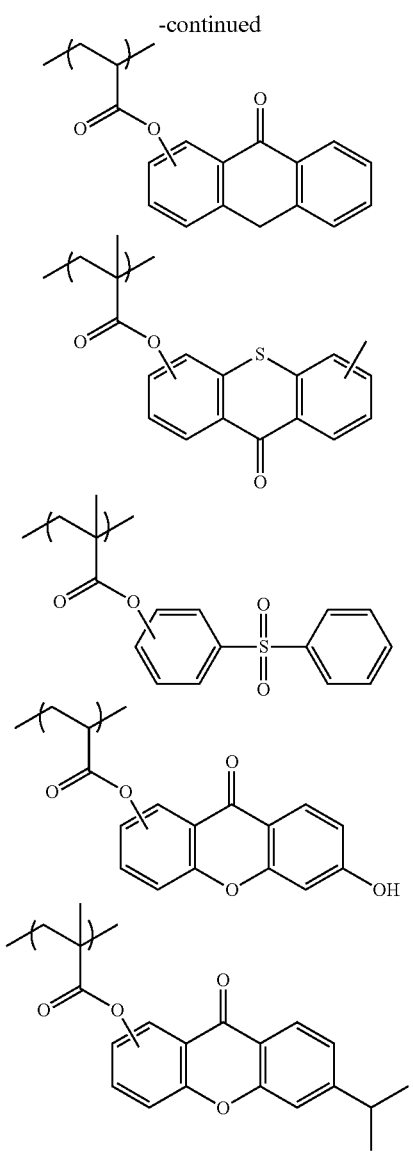

Repeating Unit Represented by the General Formula (III)

In the invention, among the repeating units having the aromatic group, it is preferred that the content of the repeating unit represented by the following general formula (III) be 20 mol % or less based on all the repeating units in the resin (A).

[Chem. 18]

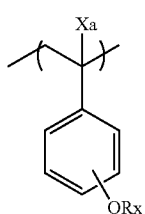

In the above-described general formula (III),

Xa represents a hydrogen atom or a linear or branched alkyl group.

Rx represents a hydrogen atom or a group which leaves upon being decomposed by an action of an acid.

Specific examples and preferred examples of the linear or branched alkyl group for Xa are the same as those previously described for the specific examples and preferred examples of the linear or branched alkyl group for $R_0$ in the general formula (I).

Specific examples and preferred examples of the group which leaves upon being decomposed by an action of an acid for Rx are the same as those previously described for the specific examples and preferred examples of the group which leaves upon being decomposed by an action of an acid protecting the polar group and configuring the acid-decomposable group in the resin (A).

In the resin (A) in the invention, the content (in a case where a plurality of types are contained, the total thereof) of the repeating unit represented by the general formula (III) is preferably 10 mol % or less, more preferably 5 mol % or less, and ideally 0 mol % based on all the repeating units in the resin (A), that is, it is particularly preferred that the repeating unit not be contained, from the viewpoint of sufficiently decreasing the solubility with respect to the organic based developer of the exposed portions while sufficiently preserving the solubility of the unexposed portions and improving the solubility contrast. There is a tendency that, if the repeating unit represented by the general formula (III) is excessively large, there will be excessive dissolution with respect to the organic solvent, and the resolution and rectangularity of the pattern will not be obtained.

Other Repeating Units

The resin (A) may have a repeating unit having a lactone structure. As the repeating unit having a lactone structure, a repeating unit represented by the following general formula (AII) is more preferred.

[Chem. 19]

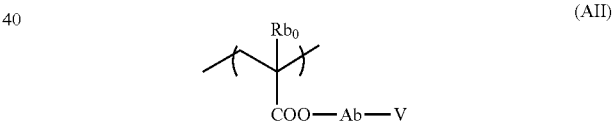

In the general formula (AII), $Rb_0$ represents a hydrogen atom, a halogen atom, or an alkyl group (having 1 to 4 carbon atoms), which may have a substituent.

Preferred examples of the substituent which the alkyl group of $Rb_0$ may have include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic cycloalkyl structure, an ether bond, an ester bond, a carbonyl group, or a divalent linking group formed by combination thereof, and is preferably a single bond or a divalent linking group represented by $-Ab_1-CO_2-$.

$Ab_1$ is a linear or branched alkylene group or a monocyclic or polycyclic cycloalkylene group, and is preferably a methylene group, an ethylene group, a cyclohexylene group, an adamantylene group, or a norbornylene group.

V represents a group having a lactone structure.

Any group having a lactone structure may be used as long as it has a lactone structure, but a 5- to 7-membered ring lactone structure is preferred, and a 5- to 7-membered ring lactone structure to which another ring structure is condensed to form a bicyclo structure or a spiro structure is preferred. Having a repeating unit having a lactone structure represented by any of the following general formulae (LC1-1) to (LC1-17) is more preferred. In addition, the lactone structure may be directly bonded to the main chain. Preferred examples of the lactone structure include (LC1-1), (LC1-4), (LC1-5), (LC1-6), (LC1-8), (LC1-13), and (LC1-14).

[Chem. 20]

LC1-1
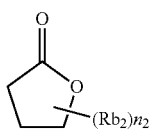

LC1-2
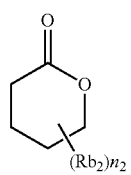

LC1-3
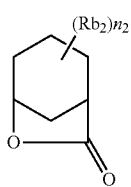

LC1-4
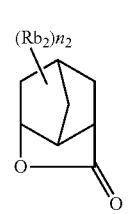

LC1-5
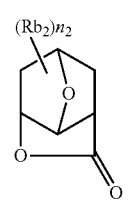

LC1-6
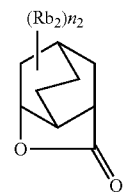

-continued

LC1-7
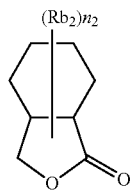

LC1-8
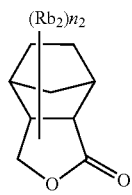

LC1-9
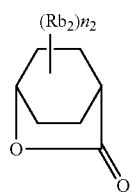

LC1-10
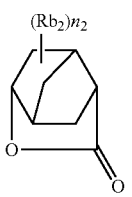

LC1-11
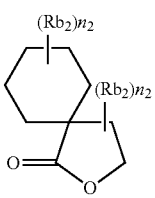

LC1-12
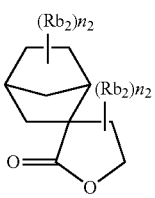

LC1-13
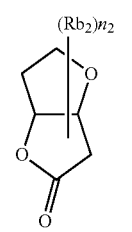

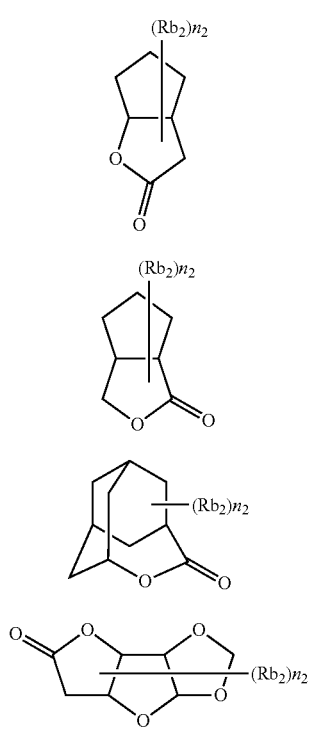

LC1-14

LC1-15

LC1-16

LC1-17

The lactone structure moiety may or may not have a substituent (Rb₂). Preferred examples of the substituent (Rb₂) include an alkyl group having 1 to 8 carbon atoms, a monovalent cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, and an acid-decomposable group. Among these, an alkyl group having 1 to 4 carbon atoms, a cyano group and an acid-decomposable group are more preferred. n₂ represents an integer of 0 to 4. When n₂ is an integer of 2 or more, the substituents (Rb₂) may be the same as or different from each other, and the plurality of substituents (Rb₂) may be bonded to each other to form a ring.

The repeating unit having a lactone structure usually has an optical isomer, but any optical isomer may be used. One optical isomer may be used singly or a mixture of a plurality of optical isomers may be used. In the case of mainly using one optical isomer, the optical purity (ee) thereof is preferably 90% or more, and more preferably 95% or more.

The resin (A) may or may not contain a repeating unit having a lactone structure, however, in a case where a repeating unit having a lactone structure is contained, the content of the repeating unit in the resin (A) is preferably in a range of 0.5 to 50 mol % based on all of the repeating units, more preferably in a range of 1 to 40 mol %, and even more preferably in a range of 3 to 30 mol %. The repeating unit can be used singly or in combination of two or more kinds thereof. By using a specific lactone structure, the resolution of the pattern is improved and the rectangular profile becomes favorable.

Below, specific examples of the repeating unit having a lactone structure in resin (A) are shown; however, the present invention is not limited thereto. In the formula, Rx represents H, CH₃, CH₂OH, or CF₃.

[Chem. 21]

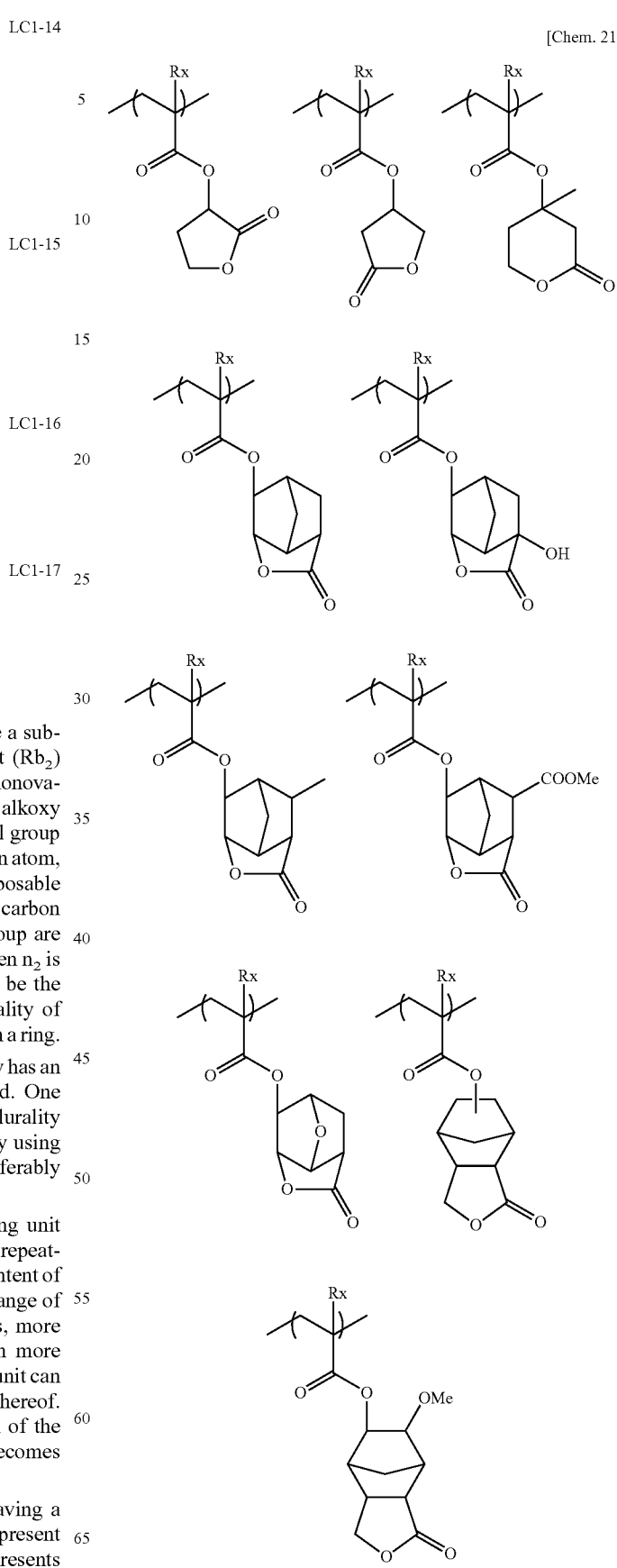

[Chem. 22]

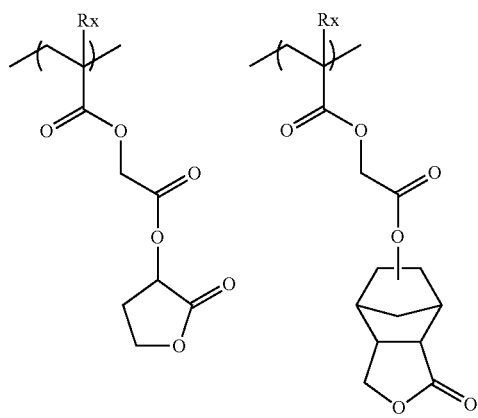

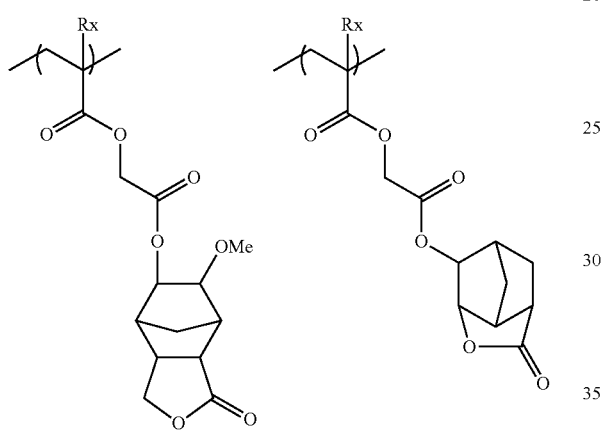

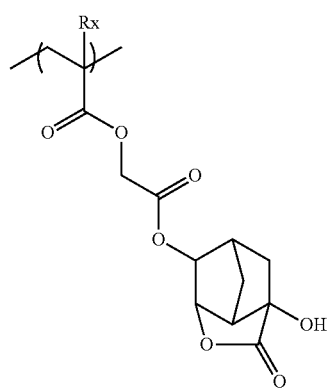

The resin (A) may have a repeating unit having an acid group. Examples of the acid group include a carboxyl group, a sulfonamide group, a sulfonylimide group, a bissulfonylimide group, and an aliphatic alcohol substituted with an electron withdrawing group at the α-position (for example, a hexafluoroisopropanol group), with repeating units having a carboxyl group being more preferred. By containing the repeating units having an acid group, the resolution increases in the usage of forming contact holes. As for the repeating units having an acid group, all of a repeating unit in which an acid group is directly bonded to the main chain of the resin, such as a repeating unit of an acrylic acid or methacrylic acid, a repeating unit in which an acid group is bonded to the main chain of the resin through a linking group, and a repeating unit in which an acid group is introduced into the polymer chain terminal by using an acid group-containing polymerization initiator or chain transfer agent during the polymerization, are preferred. The linking group may have a monocyclic or polycyclic cyclic hydrocarbon structure. In particular, a repeating unit of an acrylic acid or a methacrylic acid is preferred.

Specific examples of the repeating units having an acid group are shown below; however, the invention is not limited thereto. In the specific examples, Rx represents H, $CH_3$, $CH_2OH$, or $CF_3$.

[Chem. 23]

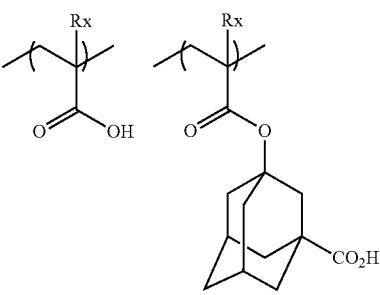

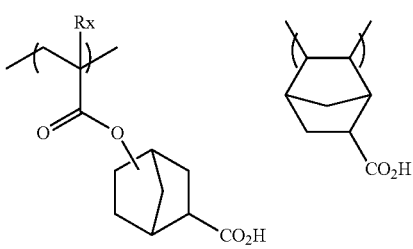

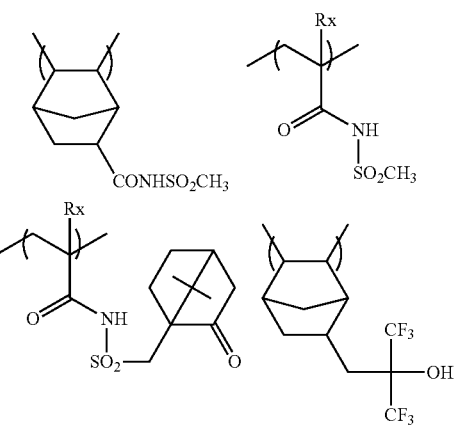

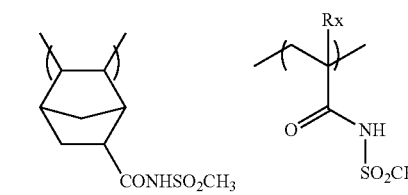

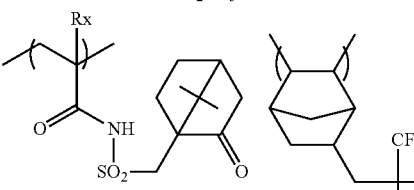

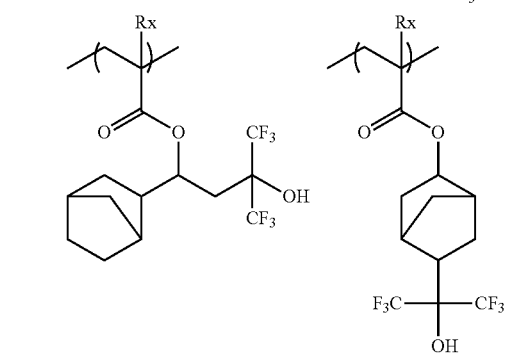

-continued

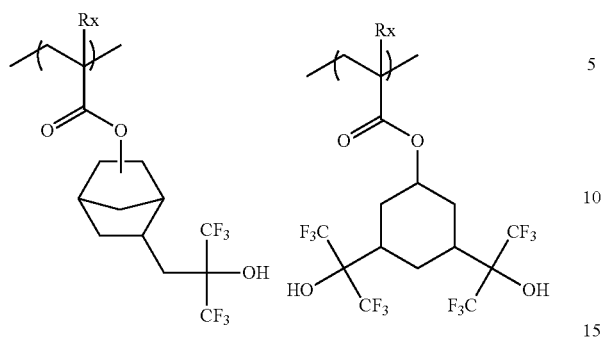

The resin (A) may or may not contain a repeating unit having an acid group; however, in a case where the resin (A) contains a repeating unit having an acid group, the content of the repeating unit is preferably in a range of 1 to 25 mol % based on all of the repeating units in the resin (A), more preferably in a range of 1 to 20 mol %, and even more preferably in a range of 3 to 15 mol %.

The resin (A) may further contain a repeating unit having a hydroxyl group or a cyano group, other than the above-described repeating units. This repeating unit can improve adhesion to a substrate and affinity for a developer. The repeating unit having a hydroxyl group or a cyano group is preferably a repeating unit having an alicyclic hydrocarbon structure substituted with a hydroxyl group or a cyano group and preferably has no acid-decomposable group. The alicyclic hydrocarbon structure in the alicyclic hydrocarbon structure substituted with a hydroxyl group or a cyano group is preferably an adamantyl group, a diamantyl group, or a norbornane group, and more preferably an adamantyl group. Further, the alicyclic hydrocarbon structure substituted with a hydroxyl group is preferred, and the alicyclic hydrocarbon structure containing a repeating unit having an adamantyl group substituted with at least one hydroxyl group is more preferred.

Particularly, it is most preferred that the resin (A) contain a repeating unit having a hydroxyadamantyl group or a dihydroxyadamantyl group from the viewpoint of inhibition of diffusion of the generated acids.

As the alicyclic hydrocarbon structure substituted with a hydroxyl group or a cyano group, a partial structure represented by any of the following general formulae (VIIa) to (VIId) is preferred, and a partial structure represented by the following general formula (VIIa) is more preferred.

[Chem. 24]

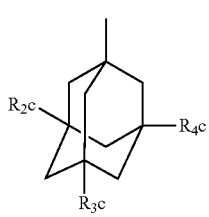
(VIIa)

-continued

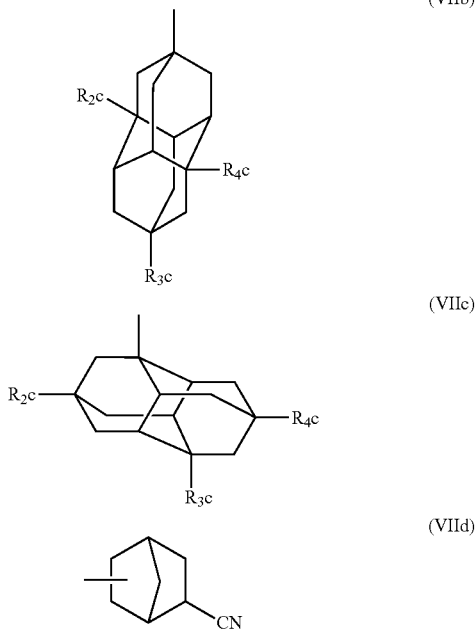

In the general formulae (VIIa) to (VIIc),
$R_2c$ to $R_4c$ each independently represent a hydrogen atom, a hydroxyl group or a cyano group, provided that at least one of $R_2c$ to $R_4c$ represents a hydroxyl group or a cyano group. A structure where one or two members out of $R_2c$ to $R_4c$ are hydroxyl groups with the remaining being a hydrogen atom is preferred. In the general formula (VIIa) it is more preferred that two members out of $R_2c$ to $R_4c$ be hydroxyl groups and the remaining be a hydrogen atom.

The repeating unit having a partial structure represented by the general formulae (VIIa) to (VIId) includes repeating units represented by the following general formulae (AIIa) to (AIId).

[Chem. 25]

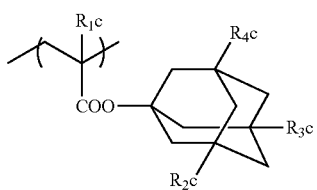
(AIIa)

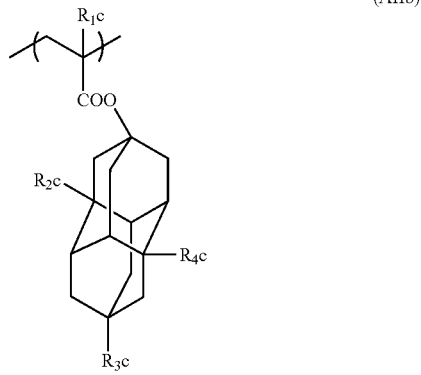
(AIIb)

-continued

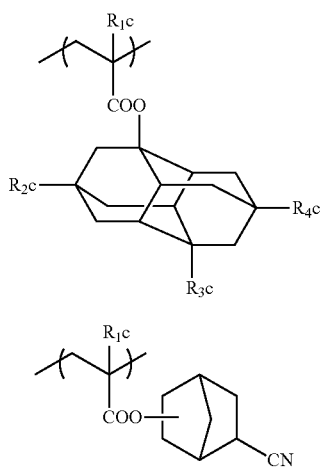

(AIIc)

(AIId)

In the general formulae (AIIa) to (AIId), $R_1c$ represents a hydrogen atom, a methyl group, a trifluoromethyl group or a hydroxymethyl group; and $R_2c$ to $R_4c$ have the same meanings as $R_2c$ to $R_4c$ in the general formulae (VIIa) to (VIIc). Specific examples of the repeating unit having a hydroxyl group or a cyano group are shown below, but the invention is not limited thereto.

[Chem. 26]

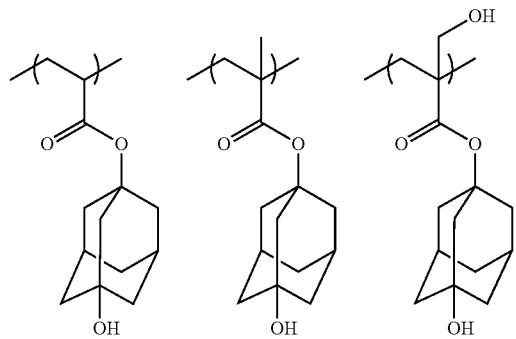

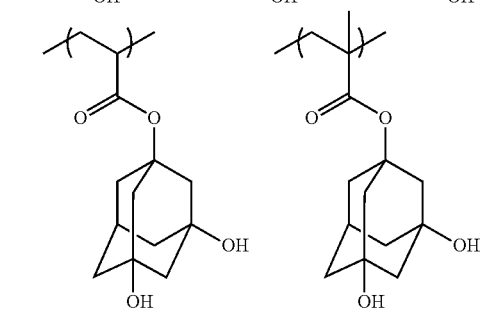

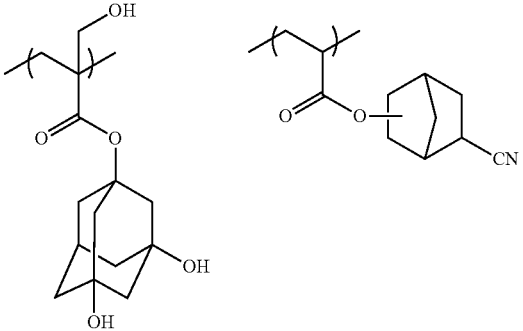

-continued

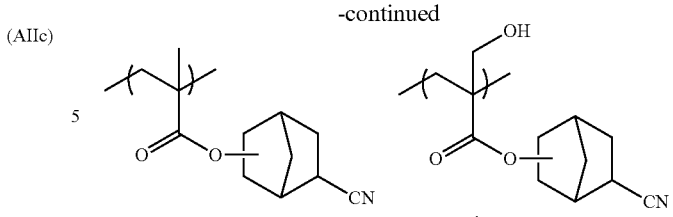

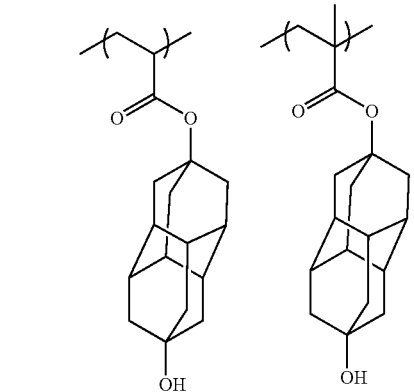

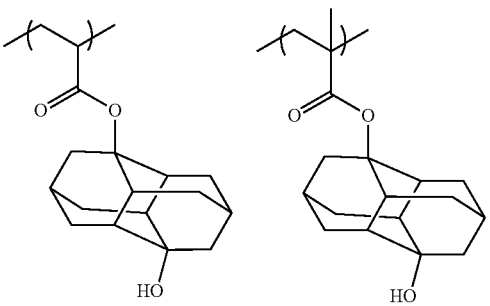

The resin (A) may or may not contain a repeating unit having a hydroxyl group or a cyano group; however, in a case where the resin (A) contains a repeating unit having a hydroxyl group or a cyano group, the content of the repeating unit is preferably in a range of 1 to 40 mol % based on all of the repeating units in the resin (A), more preferably in a range of 3 to 35 mol %, and even more preferably in a range of 5 to 30 mol %.

The resin (A) in the invention may further contain a repeating unit having an alicyclic hydrocarbon structure free from a polar group (for example, the above-described acid group, a hydroxyl group, or a cyano group) and not exhibiting acid decomposability. In this manner, the solubility of the resin may be suitably adjusted when using the developer including the organic solvent. Examples of the repeating unit include a repeating unit represented by the general formula (IV).

[Chem. 27]

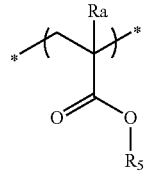

(IV)

In the general formula (IV), $R_5$ represents a hydrocarbon group having at least one ring structure and having no polar group;

Ra represents a hydrogen atom, an alkyl group or a —CH$_2$—O—Ra$_2$ group, wherein Ra$_2$ represents a hydrogen atom, an alkyl group or an acyl group. Ra is preferably a hydrogen atom, a methyl group, a hydroxymethyl group, or a trifluoromethyl group, and particularly preferably a hydrogen atom or a methyl group.

The ring structure contained in R$_5$ includes a monocyclic hydrocarbon group and a polycyclic hydrocarbon group. Examples of the monocyclic hydrocarbon group include a cycloalkyl group having 3 to 12 carbon atoms, such as a cyclopentyl group, a cyclohexyl group, a cycloheptyl group or a cyclooctyl group, and a cycloalkenyl group having 3 to 12 carbon atoms, such as a cyclohexenyl group. The monocyclic hydrocarbon group is preferably a monocyclic hydrocarbon group having 3 to 7 carbon atoms, and more preferably a cyclopentyl group or a cyclohexyl group.

The polycyclic hydrocarbon group includes a ring system hydrocarbon group and a cross-linked cyclic hydrocarbon group. Examples of the ring system hydrocarbon group include a bicyclohexyl group and a perhydronaphthalenyl group. Examples of the cross-linked cyclic hydrocarbon ring include a bicyclic hydrocarbon ring such as a pinane ring, a bornane ring, a norpinane ring, a norbornane ring or a bicyclooctane ring (for example, a bicyclo[2.2.2]octane ring, or a bicyclo[3.2.1]octane ring), a tricyclic hydrocarbon ring such as a homobrendane ring, an adamantane ring, a tricyclo[5.2.1.0$^{2,6}$]decane ring or a tricyclo[4.3.1.1$^{2,5}$]undecane ring, and a tetracyclic hydrocarbon ring such as a tetracyclo[4.4.0.1$^{2,5}$.1$^{7,10}$]dodecane ring and a perhydro-1,4-methano-5,8-methanonaphthalene ring. Further, the cross-linked cyclic hydrocarbon ring also includes a condensed cyclic hydrocarbon ring, for example, a condensed ring formed by fusing a plurality of 5- to 8-membered cycloalkane rings, such as a perhydronaphthalene (decalin) ring, a perhydroanthracene ring, a perhydrophenanthrene ring, a perhydroacenaphthene ring, a perhydrofluorene ring, a perhydroindene ring and a perhydrophenalene ring.

Preferred examples of the cross-linked cyclic hydrocarbon ring include a norbornyl group, an adamantyl group, a bicyclooctanyl group and a tricyclo[5.2.1.0$^{2,6}$]decanyl group. More preferred examples of the cross-linked cyclic hydrocarbon ring include a norbornyl group and an adamantyl group.

These alicyclic hydrocarbon groups may have a substituent, and preferred examples of the substituent include a halogen atom, an alkyl group, a hydroxyl group substituted with a hydrogen atom, and an amino group substituted with a hydrogen atom. The halogen atom is preferably a bromine atom, a chlorine atom, or a fluorine atom, and the alkyl group is preferably a methyl group, an ethyl group, a butyl group, or a t-butyl group. The alkyl group may further have a substituent, and the substituent which the alkyl group may further have includes a halogen atom, an alkyl group, a hydroxyl group substituted with a hydrogen atom, and an amino group substituted with a hydrogen atom.

Examples of the substituent for the hydrogen atom include an alkyl group, a cycloalkyl group, an aralkyl group, a substituted methyl group, a substituted ethyl group, an alkoxycarbonyl group, and an aralkyloxycarbonyl group. The alkyl group is preferably an alkyl group having 1 to 4 carbon atoms; the substituted methyl group is preferably a methoxymethyl group, a methoxythiomethyl group, a benzyloxymethyl group, a t-butoxymethyl group, or a 2-methoxyethoxymethyl group; the substituted ethyl group is preferably a 1-ethoxyethyl group or a 1-methyl-1-methoxyethyl group, the acyl group is preferably an aliphatic acyl group having 1 to 6 carbon atoms, such as a formyl group, an acetyl group, a propionyl group, a butyryl group, an isobutyryl group, a valeryl group, and a pivaloyl group, and the alkoxycarbonyl group is preferably an alkoxycarbonyl group having 1 to 4 carbon atoms.

The resin (A) may or may not contain a repeating unit having an alicyclic hydrocarbon structure free from a polar group and not exhibiting acid decomposability, but in the case where the resin (A) contains the repeating unit having an alicyclic hydrocarbon structure free from a polar group and not exhibiting acid decomposability, the content of the repeating unit is preferably from 1 to 40 mol %, and more preferably from 1 to 20 mol % based on all the repeating units in the resin (A).

Specific examples of the repeating unit having an alicyclic hydrocarbon structure free from a polar group and not exhibiting acid decomposability are shown below; however, the invention is not limited thereto. In the formula, Ra represents H, CH$_3$, CH$_2$OH, or CF$_3$.

[Chem. 28]

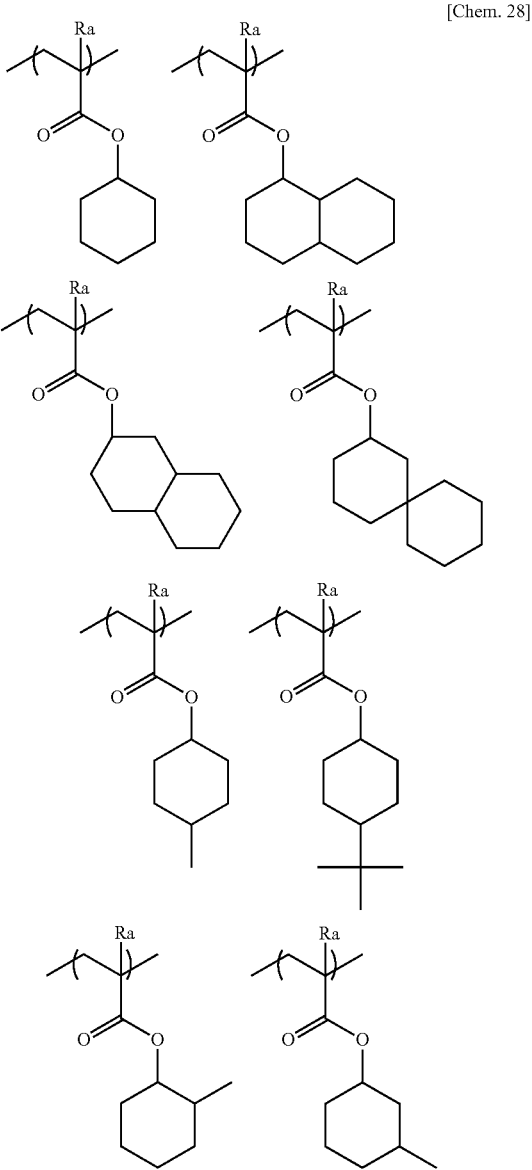

-continued

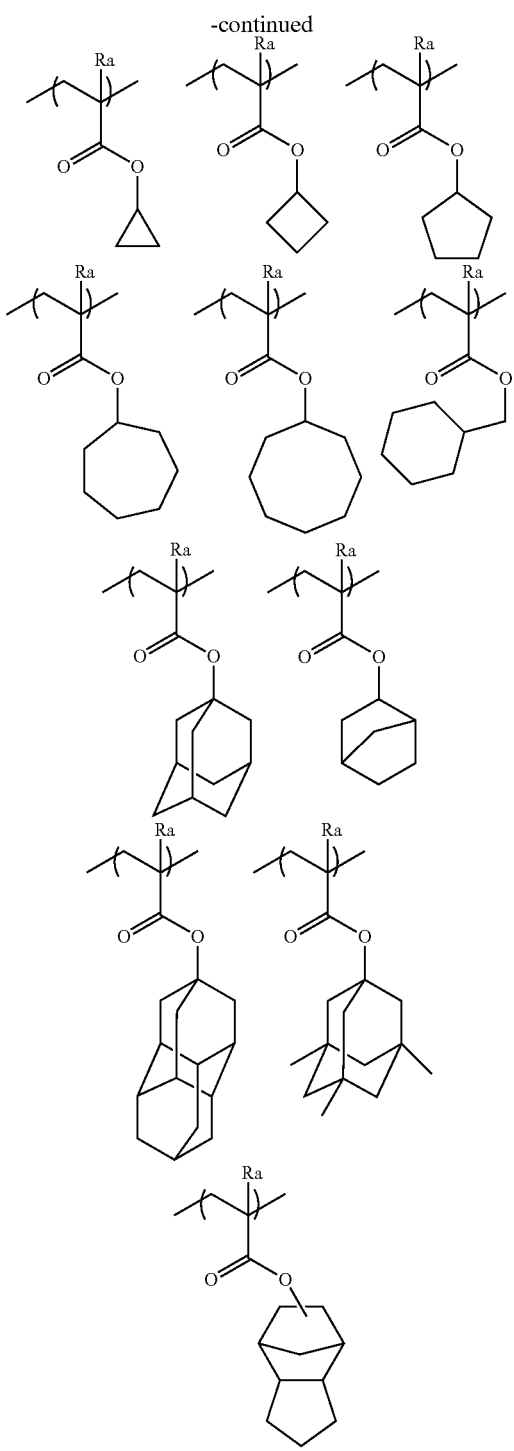

The resin (A) used in the composition of the invention may contain, in addition to the above-described repeating structural units, various repeating structural units for the purpose of controlling the dry etching resistance, suitability for standard developer, adhesion to a substrate, a resist profile, and characteristics generally required for an actinic ray-sensitive or radiation-sensitive resin composition, such as resolving power, heat resistance, and sensitivity.

Examples of such a repeating structural unit include, but are not limited to, repeating structural units corresponding to the monomers described below.

The use of such a repeating structural unit enables fine adjustment of the performance demanded of the resin used in the composition of the invention, particularly (1) solubility in a coating solvent,
(2) a film-forming property (glass transition point),
(3) alkaline developability,
(4) film loss (selection of hydrophilic, hydrophobic, or alkali-soluble group),
(5) adhesion of an unexposed area to a substrate,
(6) dry etching resistance, and the like.

Examples of the monomer include a compound having one addition-polymerizable unsaturated bond selected from acrylic acid esters, methacrylic acid esters, acrylamides, methacrylamides, allyl compounds, vinyl ethers, vinyl esters, styrenes, crotonic acid esters, or the like.

In addition to the above, an addition-polymerizable unsaturated compound copolymerizable with the monomers corresponding to the above-described various repeating structural units may be copolymerized.

In the resin (A) used in the composition of the invention, the molar ratio of the respective repeating structural units, is appropriately set for the purpose of controlling the dry etching resistance or suitability for a standard developer of an actinic ray-sensitive or radiation-sensitive resin composition, adhesion to a substrate, resist profile, and properties generally required for a resist, such as resolving power, heat resistance, and sensitivity.

The type of the resin (A) in the invention may be any one of a random type, a block type, a comb type, and a star type. The resin (A) can be synthesized by, for example, radical, cationic, or anionic polymerization of unsaturated monomers corresponding to the respective structures. Further, it may also be that polymerization is carried out using unsaturated monomers corresponding to the precursors of the respective structures, and then a polymer reaction is carried out, thereby obtaining a desired resin.

The resin (A) of the invention may be synthesized by a conventional method (for example, radical polymerization). Examples of the general synthetic method include a batch polymerization method in which a monomer species and an initiator are dissolved in a solvent and heated so as to accomplish polymerization and a dropping polymerization method in which a solution of monomer species and initiator is added by dropwise addition to a heated solvent over a period of 1 to 10 hours. The dropping polymerization method is preferred. Examples of the reaction solvent include tetrahydrofuran, 1,4-dioxane, ethers such as diisopropyl ether, ketones such as methylethyl ketone and methyl isobutyl ketone, an ester solvent such as ethyl acetate, an amide solvent such as dimethylformamide and dimethylacetamide, and the later-described solvents capable of dissolving the composition of the invention, such as propylene glycol monomethyl ether acetate, propylene glycol monomethyl ether, and cyclohexanone. The polymerization is more preferably carried out using the same solvent as the solvent used in the actinic ray-sensitive or radiation-sensitive resin composition of the invention. By the use of the same solvent, generation of particles during storage may be inhibited.

The polymerization reaction is preferably carried out in an inert gas atmosphere such as nitrogen and argon. Regarding the polymerization initiator, the polymerization is started using a commercially available radical initiator (for example, an azo-based initiator, or peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added or added in parts, if desired. After the completion of the reaction, the reaction solution is poured into a solvent, and the desired polymer is collected by powder or solid recovery, or other methods. The concentration during the reaction is in the range of 5 to 50% by mass, preferably 10 to 30% by mass, and the reaction temperature is usually in the range of 10 to 150° C., preferably 30 to 120° C., more preferably 60 to 100° C.

After the completion of the reaction, the reaction solution is allowed to cool to room temperature and purified. The purification may be carried out by a normal method, for example, a liquid-liquid extraction method of applying water washing or combining appropriate solvents to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin may be precipitated as a solid by contacting the reaction solution with a solvent in which the resin is sparingly soluble or insoluble (poor solvent) and which has a volumetric amount of 10 times or less, preferably from 10 to 5 times, the reaction solution.

The solvent used during the operation of precipitation or reprecipitation from the polymer solution (a precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, and more preferably from 300 to 1,000 parts by mass, based on 100 parts by mass of the polymer solution.

The temperature during the precipitation or reprecipitation may be appropriately selected by taking into consideration the efficiency or operability but is usually approximately of 0 to 50° C., and preferably in the vicinity of room temperature (for example, approximately from 20 to 35° C.). The precipitation or reprecipitation operation may be carried out using a commonly employed mixing vessel such as stirring tank by a known method such as a batch system or a continuous system.

The precipitated or reprecipitated polymer is usually subjected to commonly employed solid-liquid separation such as filtration and centrifugation, then dried and used. The filtration is carried out using a solvent-resistant filter element preferably under pressure. The drying is carried out under atmospheric pressure or reduced pressure (preferably under reduced pressure) at a temperature of approximately from 30 to 100° C., preferably on the order of 30 to 50° C.

Incidentally, after the resin is once precipitated and separated, the resin may be dissolved again in a solvent and then put into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin again in a solvent to prepare a resin solution A (step c), bringing the resin solution A into contact with a solvent in which the resin is sparingly soluble or insoluble and which has a volumetric amount of less than 10 times (preferably 5 times or less) the resin solution A, to precipitate a resin solid (step d), and separating the precipitated resin (step e).

Moreover, in order to inhibit the aggregation or the like of the resin after preparation of the composition, for example, as described in JP2009-037108A, steps of dissolving the synthesized resin in a solvent to form a solution and heating the resulting solution at a temperature of about 30° C. to 90° C. for about 30 minutes to 4 hours may be added.

The weight average molecular weight of the resin (A) used in the composition of the invention is preferably from 1,000 to 200,000, more preferably from 2,000 to 100,000, still more preferably from 3,000 to 70,000, and particularly preferably from 5,000 to 50,000, in terms of a polystyrene reduced value by a GPC method. When the weight average molecular weight is from 1,000 to 200,000, the deterioration of heat resistance and dry etching resistance, and the deterioration of developability or a film-forming property due to an increase in viscosity may be prevented.

The degree of dispersion (molecular weight distribution, Mw/Mn) is normally from 1.0 to 3.0, and may be used preferably from 1.0 to 2.6, more preferably from 1.2 to 2.4, and particularly preferably in the range of 1.4 to 2.2. When the molecular weight distribution is within the above-described ranges, the resolution and the resist shape are superior, the side wall of the resist pattern is smoother, and the roughness is more improved. In the present specification, the weight average molecular weight (Mw) and the number average molecular weight (Mn) of the resin (A) may be calculated by using, for example, an HLC-8120 (manufactured by Tosoh Corporation) using TSK gel Multipore HXL-M columns (manufactured by Tosoh Corporation, 7.8 mm ID×30.0 cm) and THF (tetrahydrofuran) as an eluent. In addition, in the invention, the resin (A) may be used singly or in combination of a plurality of kinds thereof.

In the actinic ray-sensitive or radiation-sensitive resin composition in the invention, the content of the resin (A) in the entire composition is preferably from 30 to 99% by mass, and more preferably from 60 to 95% by mass, based on the total solid content.

Further, the actinic ray-sensitive or radiation-sensitive resin composition in the invention may further contain the resin (A) as well as acid-decomposable resins (a resin which has increased polarity by the action of an acid and has reduced solubility in a developer including an organic solvent) other than resin (A). The acid-decomposable resin other than the resin (A) is an acid-decomposable resin including the same repeating units as those that may be included in the resin (A), and the preferred ranges or content in the resin of the repeating units are the same as described for the resin (A).

In the case where the acid-decomposable resin other than the resin (A) is included, the content of the acid-decomposable resin in the composition according to the invention needs to satisfy the condition that the total content of the resin (A) and the acid-decomposable resin other than the resin (A) is within the above-described ranges. The mass ratio of the resin (A) and the acid-decomposable resin other than the resin (A) can be suitably adjusted to a range in which a good effect of the invention is exhibited, but the range of [resin (A)/acid-decomposable resin other than the resin (A)] is preferably from 99.9/0.1 to 10/90, and more preferably from 99.9/0.1 to 60/40.

The fact that the actinic ray-sensitive or radiation-sensitive resin composition in the invention contains only the resin (A) as the acid-decomposable resin is preferred from the viewpoint of more reliably achieving the effect of the invention.

[2] Compound (D) Having a Naphthalene Ring, a Biphenyl Ring, an Anthracene Ring, a Fluorenone Ring, an Anthrone Ring, a Xanthone Ring, a Thioxanthone Ring, a Vinyl Benzene Structure or a Diphenyl Sulfone Structure In the pattern forming method of the invention, as one embodiment, the actinic ray-sensitive or radiation-sensitive resin composition contains a compound (D) having more than one naphthalene ring, biphenyl ring, anthracene ring, fluorenone ring, anthrone ring, xanthone ring, thioxanthone ring, vinyl benzene structure or diphenyl sulfone structure.

The compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure is different from the compound (B) generating an acid upon irradiation with actinic rays or radiation as described later.

Regardless of whether or not the resin (A) has a repeating unit having a naphthyl group, a biphenyl group, an anthryl group, a fluorenone structure, an anthrone structure, a xanthone structure, a thioxanthone structure, a vinyl benzene structure or a diphenyl sulfone structure, the actinic ray-sensitive or radiation-sensitive resin composition may contain the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure.

The molecular weight of the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure is preferably 2000 or less, more preferably 1500 or less, and even more preferably 900 or less. Incidentally, normally, the molecular weight is 100 or more.

The compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure is a compound represented by any one of the following formulae (A1) to (A3).

[Chem. 29]

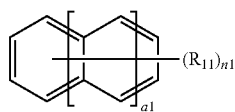
(A1)

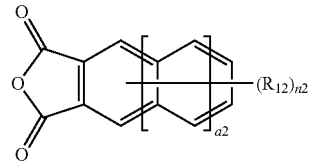
(A2)

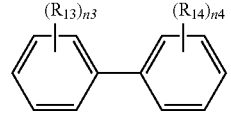
(A3)

In the above-described general formulae (A1), (A2), and (A3), $R_{11}$, $R_{12}$, $R_{13}$, and $R_{14}$ each independently represent a hydroxyl group, an alkyl group, an alkoxy group, an alkoxycarbonyl group, an alkylcarbonyl group, or a lactonyl oxy carbonyl group.

a1 represents 1 or 2.
a2 represents 1 or 2.
n1 represents an integer of 0 to 10
n2 represents an integer of 0 to 8.
n3 represents an integer of 0 to 5.
n4 represents an integer of 0 to 5.

When n1 is an integer of 2 or more, the plurality of $R_{11}$'s may be the same or may be different, and may be bonded to each other to form a ring.

When n2 is an integer of 2 or more, the plurality of $R_{12}$'s may be the same or may be different, and may be bonded to each other to form a ring.

When n3 is an integer of 2 or more, the plurality of $R_{13}$'s may be the same or may be different, and may be bonded to each other to form a ring.

When n4 is an integer of 2 or more, the plurality of $R_{14}$'s may be the same or may be different, and may be bonded to each other to form a ring.

The alkyl group of $R_{11}$, $R_{12}$, $R_{13}$, and $R_{14}$ is linear or branched, preferably has 1 to 10 carbon atoms, and preferred examples thereof include a methyl group, an ethyl group, an n-butyl group, and a t-butyl group.

The alkoxy group of $R_{11}$, $R_{12}$, $R_{13}$, and $R_{14}$ is linear or branched, preferably has 1 to 10 carbon atoms, and preferred examples thereof include a methoxy group, an ethoxy group, an n-propoxy group, and an n-butoxy group.

The alkoxycarbonyl group of $R_{11}$, $R_{12}$, $R_{13}$, and $R_{14}$ is linear or branched, preferably has 2 to 11 carbon atoms, and preferred examples thereof include a methoxycarbonyl group, an ethoxycarbonyl group, and an n-butoxycarbonyl group.

Specific examples of the alkyl group of the alkoxycarbonyl group of $R_{11}$, $R_{12}$, $R_{13}$, and $R_{14}$ are the same as those of the alkyl group of $R_{11}$, $R_{12}$, $R_{13}$, and $R_{14}$ described above.

As the lactonyl group of the lactonyl oxy carbonyl group of $R_{11}$, $R_{12}$, $R_{13}$, and $R_{14}$, a lactonyl group having a 5 to 7 membered ring is preferred, and a lactonyl group having a 5 or 6 membered ring is even more preferred.

It is preferred that the ring formed by a plurality of $R_{11}$'s being bonded together, the ring formed by a plurality of $R_{12}$'s being bonded together, the ring formed by a plurality of $R_{13}$'s being bonded together, and the ring formed by a plurality of $R_{14}$'s being bonded together be 5 or 6 membered rings respectively.

The ring formed by a plurality of $R_{11}$'s being bonded together, the ring formed by a plurality of $R_{12}$'s being bonded together, the ring formed by a plurality of $R_{13}$'s being bonded together, and the ring formed by a plurality of $R_{14}$'s being bonded together as each group of $R_{11}$, $R_{12}$, $R_{13}$, and $R_{14}$, may be further substituted, and examples of the substituent include a halogen atom (for example, a fluorine atom), a hydroxyl group, a carboxyl group, a cyano group, a nitro group, an alkoxy group, an alkoxyalkyl group, an alkoxycarbonyl group, and an alkoxycarbonyloxy group.

The alkoxy group includes, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

The alkoxyalkyl group includes, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

The alkoxycarbonyl group includes, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

The alkoxycarbonyloxy group includes, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

n1 is preferably an integer of 0 to 5, more preferably an integer of 0 to 3, and 0 or 1 is preferred.

n2 is preferably an integer of 0 to 5, more preferably an integer of 0 to 3, and 0 or 1 is preferred.

n3 is preferably an integer of 0 to 3, and 0 or 1 is preferred.

n4 is preferably an integer of 0 to 3, and 0 or 1 is preferred.

Since the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure can absorb the exposure light of the KrF excimer laser or the like, the influence of standing waves due to reflection of the exposure light from the substrate and the diffuse reflection of the exposure light due to an uneven portion in the uneven substrate can be reduced, and a pattern having high rectangularity can be formed.

In the invention, the content of the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure is preferably 0.1 to 6.0% by mass based on the total solid content of the actinic ray-sensitive or radiation-sensitive resin composition, more preferably 0.5 to 5.0% by mass, and even more preferably 1.0 to 4.5% by mass.

If the content of the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure is excessively large, the pattern shape may be deteriorated due to a decrease in the transmittance with respect to exposure light such as the KrF excimer laser.

The compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure may be a commercially available product or may be synthesized by a conventional method.

Specific examples of the compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure are shown below; however, the invention is not limited thereto. In the following specific examples, Me represents a methyl group and Et represents an ethyl group.

[Chem. 30]

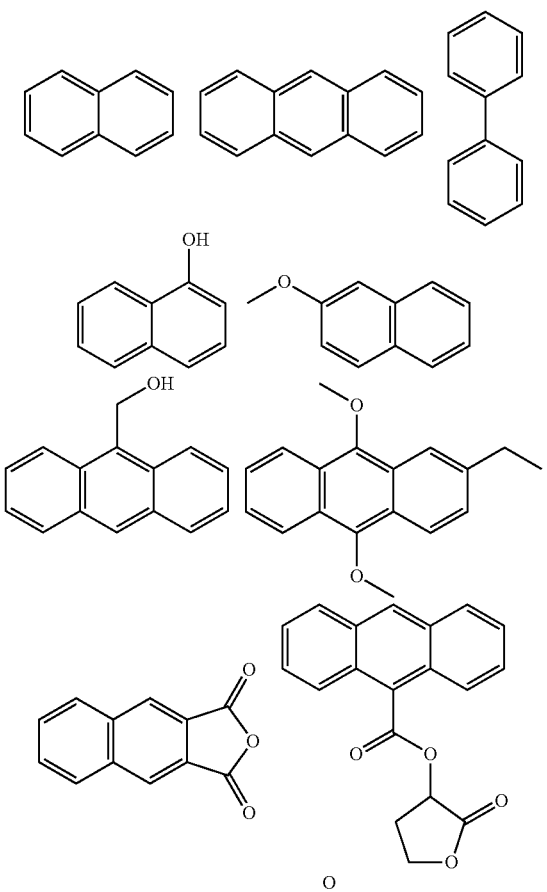

[Chem. 31]

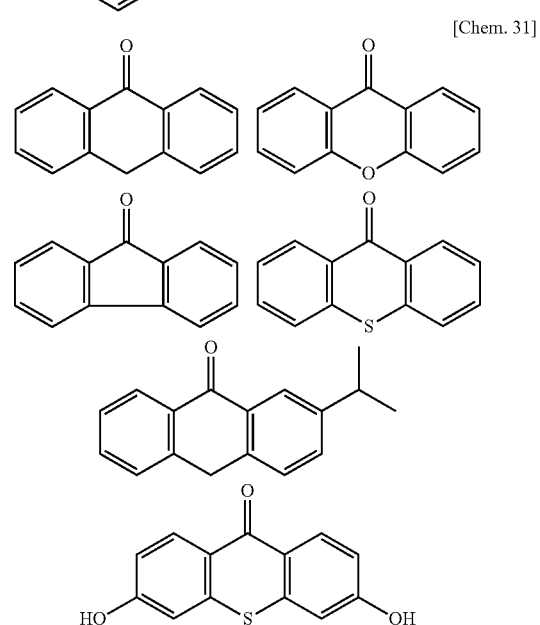

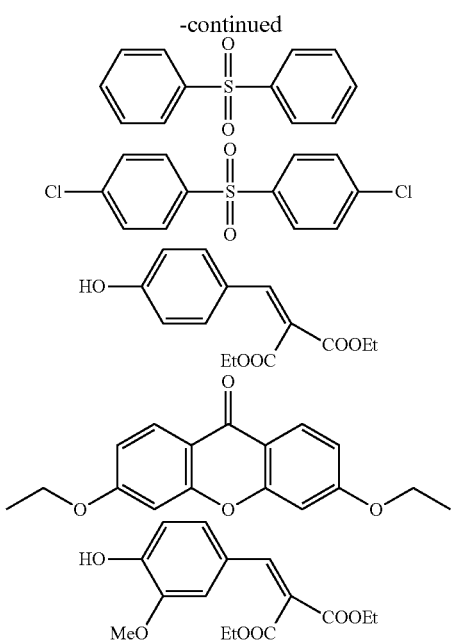

[3] Compound (B) Capable of Generating Acid Upon Irradiation with Actinic Rays or Radiation The actinic ray-sensitive or radiation-sensitive resin composition of the invention contains (B) a compound generating acid upon irradiation with actinic rays or radiation (below, referred to as "acid generator (B)"). As such an acid generator (B), photoinitiators for photo-cation polymerization, photoinitiators for photo-radical polymerization, photodecoloring agents of dyes, photo-discoloring agents, known compounds that generate an acid by irradiation with actinic rays or radiation, which are used in microresists, or the like, and mixtures thereof may be suitably selected and used.

Examples thereof include a diazonium salt, a phosphonium salt, a sulfonium salt, an iodonium salt, an imide sulfonate, an oxime sulfonate, a diazo disulfone, a disulfone, and an o-nitrobenzyl sulfonate, and the acid generator (B) preferably includes a sulfonium salt or an iodonium salt.

Further, use can be made of compounds obtained by introducing any of these groups or compounds generating an acid when irradiated with actinic rays or radiation into a polymer main chain or side chain, for example, compounds described in U.S. Pat. No. 3,849,137, DE3914407, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), JP1988-146029A (JP-S63-146029A), and the like.

Furthermore, use can also be made of compounds generating an acid upon being irradiated with light, described in U.S. Pat. No. 3,779,778 and EP126,712B.

As the acid generator (B), examples of preferred compounds among the compounds generating acid upon decomposing caused by irradiation with actinic rays or radiation include compounds represented by the following general formulae (ZI), (ZII), and (ZIII).

[Chem. 32]

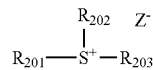

(ZI)

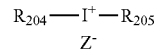

(ZII)

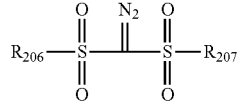

(ZIII)

In the above-described general formula (ZI), $R_{201}$, $R_{202}$ and $R_{203}$ each independently represent an organic group.

$Z^-$ represents a non-nucleophilic anion, preferred examples thereof including a sulfonate anion, a bis(alkylsulfonyl)amide anion, a tris (alkylsulfonyl)methide anion, $BF_4^-$, $PF_6^-$, $SbF_6^-$, or the like, and is preferably an organic anion containing a carbon atom. Preferable examples of the organic anions include the organic anions shown in the formulae AN1 to AN3 below.

[Chem. 33]

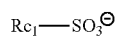

AN1

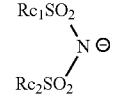

AN2

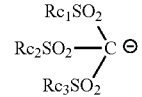

AN3

In the formulae AN1 to AN3, $Rc_1$ to $Rc_3$ each independently represent an organic group. The organic groups of $Rc_1$ to $Rc_3$ include ones having 1 to 30 carbon atoms, preferably alkyl groups which may be substituted, monocyclic or polycyclic cycloalkyl groups, heteroatom-containing cyclic groups, an aryl group, or a group in which a plurality of these are linked by a single bond or a linking group such as, —O—, —$CO_2$—, —S—, —$SO_3$—, or —$SO_2N(Rd_1)$-. Furthermore, the organic groups may form a ring structure with other bonded alkyl groups and aryl groups.

$Rd_1$ represents a hydrogen atom, or an alkyl group, and may form a ring structure with bonded alkyl groups and aryl groups.

The organic groups of $Rc_1$ to $Rc_3$ may be an alkyl group in which the first position is substituted with a fluorine atom, or a fluoroalkyl group, or a phenyl group substituted with a fluorine atom or a fluoroalkyl group. By having the fluorine atom or the fluoroalkyl group, the acidity of the acid generated by light irradiation increases and sensitivity is improved. When the carbon atoms in $Rc_1$ to $Rc_3$ number 5 or more, at least a single carbon atom is preferably substituted with a hydrogen atom, and the number of hydrogen atoms is more preferably greater than that of the fluorine atoms. By not having a perfluoroalkyl group having 5 or more carbon atoms, the ecological toxicity is reduced.

The organic group as $R_{201}$, $R_{202}$, and $R_{203}$ generally has 1 to 30 carbon atoms, and preferably 1 to 20 carbon atoms.

Further, two members of $R_{201}$ to $R_{203}$ may be bonded to each other to form a ring structure, and the ring may contain an oxygen atom, a sulfur atom, an ester bond, an amide bond or a carbonyl group.

Examples of the group formed by the combination of two members of $R_{201}$ to $R_{203}$ include an alkylene group (for example, a butylene group and a pentylene group).

Specific examples of the organic groups as $R_{201}$, $R_{202}$ and $R_{203}$ include the corresponding groups in compounds (ZI-1) and (ZI-2) which will be described later.

Moreover, the compound may be a compound having a plurality of structures represented by the general formula (ZI). For example, the compound may be a compound having a structure where at least one of $R_{201}$ to $R_{203}$ in the compound represented by the general formula (ZI) is bonded to at least one of $R_{201}$ to $R_{203}$ in another compound represented by the general formula (ZI).

As the component (ZI), the compounds (ZI-1) and (ZI-2) described below are more preferred.

The compound (ZI-1) is an arylsulfonium compound where at least one of $R_{201}$ to $R_{203}$ in the general formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining ones being an alkyl group.

Examples of the arylsulfonium compound include a triarylsulfonium compound, a diarylalkylsulfonium compound, and an aryldialkylsulfonium compound.

The aryl group of the arylsulfonium compound is preferably an aryl group such as a phenyl group, a naphthyl group, or a fluorene group, a heteroaryl group such as an indole residue, or a pyrrole residue is preferred, and a phenyl group or an indole residue is more preferred. In the case where the arylsulfonium compound has two or more aryl groups, these two or more aryl groups may be the same as or different from each other.

The alkyl group which is present, as necessary, in the arylsulfonium compound is preferably a linear, branched or cyclic alkyl group having 1 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, and alkyl group of $R_{201}$ to $R_{203}$ may have, as the substituent, an alkyl group (for example, having 1 to 15 carbon atoms), an aryl group (for example, having 6 to 14 carbon atoms), an alkoxy group (for example, having 1 to 15 carbon atoms), a halogen atom, a hydroxyl group or a phenylthio group. The substituent is preferably a linear, branched, or cyclic alkyl group having 1 to 12 carbon atoms, a linear, branched or cyclic alkoxy group having 1 to 12 carbon atoms, and most preferably an alkyl group having 1 to 4 carbon atoms, or an alkoxy group having 1 to 4 carbon atoms. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

Next, the compound (ZI-2) will be described.

The compound (ZI-2) is a compound of a case where $R_{201}$ to $R_{203}$ in formula (ZI) each independently represent an organic group containing no aromatic ring. Here, the aromatic ring also includes an aromatic ring containing a heteroatom.

The organic group containing no aromatic ring as $R_{201}$ to $R_{203}$ generally contains 1 to 30 carbon atoms, and preferably 1 to 20 carbon atoms.

$R_{201}$ to $R_{203}$ each independently preferably represent an alkyl group, a cycloalkyl group, a 2-oxoalkyl group, a 2-oxocycloalkyl group, an alkoxycarbonylmethyl group, an allyl group or a vinyl group, more preferably a linear or branched 2-oxoalkyl group, a 2-oxocycloalkyl group or an alkoxycarbonylmethyl group, and most preferably a linear or branched 2-oxoalkyl group.

Preferable examples of the alkyl group and the cycloalkyl group of $R_{201}$ to $R_{203}$ include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, and a norbornyl group).

The 2-oxoalkyl group as $R_{201}$ to $R_{203}$ may be either linear or branched and is preferably a group having >C=O at the 2-position of the above-described alkyl group.

The 2-oxocycloalkyl group as $R_{201}$ to $R_{203}$ is preferably a group having >C=O at the 2-position of the above-described cycloalkyl group.

The alkoxy group in the alkoxycarbonylmethyl group as $R_{201}$ to $R_{203}$ is preferably an alkoxy group having 1 to 5 carbon atoms (for example, a methoxy group, an ethoxy group, a propoxy group, a butoxy group, or a pentoxy group).

$R_{201}$ to $R_{203}$ may be further substituted with a halogen atom, an alkoxyl group (for example, having 1 to 5 carbon atoms), a hydroxyl group, a cyano group, or a nitro group.

Two members of $R_{201}$ to $R_{203}$ may be bonded to each other to form a ring structure, and the ring may contain an oxygen atom, a sulfur atom, an ester bond, an amide bond or a carbonyl group. Examples of the group formed by the combination of two members of $R_{201}$ to $R_{203}$ include an alkylene group (for example, a butylene group and a pentylene group).

Next, the general formulae (ZII) and (ZIII) will be described.

In general formulae (ZII) and (ZIII), $R_{204}$ to $R_{207}$ each independently represent an aryl group which may be substituted, an alkyl group which may be substituted or a cycloalkyl group which may be substituted.

Specific and preferred examples of the aryl group of $R_{204}$ to $R_{207}$ are the same as those described as the aryl group of $R_{201}$ to $R_{203}$ in the compound (ZI-1).

Specific and preferred examples of the alkyl group and cycloalkyl group of $R_{204}$ to $R_{207}$ are the same as those described as the linear, branched, or cyclic alkyl group of $R_{201}$ to $R_{203}$ in the compound (ZI-2).

$Z^-$ has the same meaning as $Z^-$ in the general formula (ZI).

As the acid generator (B), examples of preferred compounds among the compounds generating acid upon irradiation with actinic rays or radiation further include compounds represented by the following general formulae (ZIV), (ZV), and (ZVI).

[Chem. 34]

$$Ar_3-SO_2-SO_2-Ar_4 \quad \text{ZIV}$$

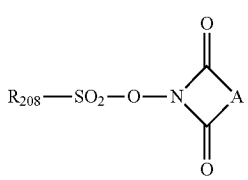

ZV

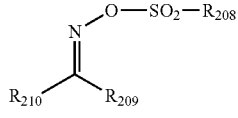

ZVI

In the general formulae (ZIV) to (ZVI), $Ar_3$ and $Ar_4$ each independently represent substituted or unsubstituted aryl group.

$R_{208}$ in the general formulae (ZV) and (ZVI) each independently represents a substituted or unsubstituted alkyl group, a substituted or unsubstituted cycloalkyl group, or a substituted or unsubstituted aryl group. In terms of increasing the strength of the generated acid, $R_{208}$ is preferably substituted by a fluorine atom.

$R_{209}$ and $R_{210}$ each independently represents a substituted or unsubstituted alkyl group, a substituted or unsubstituted cycloalkyl group, a substituted or unsubstituted aryl group, an alkylthio group or an electron withdrawing group.

In addition, $R_{209}$ and $R_{210}$ may be bonded to form a ring structure. These ring structures may include an oxygen atom, a sulfur atom, an alkylene group, alkenylene group, an arylene group, or the like.

$R_{209}$ is preferably a substituted or unsubstituted aryl group. $R_{210}$ is preferably an electron withdrawing group, more preferably a cyano group or a fluoroalkyl group.

A represents a substituted or unsubstituted alkylene group, a substituted or unsubstituted cycloalkylene group, a substituted or unsubstituted alkenylene group, or a substituted or unsubstituted arylene group.

Specific examples of the aryl group of $Ar_3$, $Ar_4$, $R_{208}$, $R_{209}$, and $R_{210}$ are the same as specific examples of the aryl group of $R_{201}$ to $R_{203}$ in the general formula (ZI-1).

Specific examples of the alkyl group and cycloalkyl group of $R_{208}$, $R_{209}$, and $R_{210}$ are the same as specific examples of the alkyl group and cycloalkyl group of $R_{201}$ to $R_{203}$ in the general formula (ZI-2), respectively.

Examples of the alkyl moiety of the alkylthio group for $R_{209}$ and $R_{210}$ include the same ones as specific examples of the alkyl group of $R_{201}$ to $R_{203}$ in the above-described general formula (ZI-2).

Examples of the alkylene group of A include alkylene groups having 1 to 12 carbon atoms (for example, a methylene group, an ethylene group, a propylene group, an isopropylene group, a butylene group, and an isobutylene group), examples of the cycloalkylene group of A include monocyclic or polycyclic cycloalkylene groups having 3 to 12 carbon atoms (for example, a cyclohexylene group, a norbornylene group, and an adamantylene group), examples of the alkenylene group of A include alkenylene groups having 2 to 12 carbon atoms (for example, an ethenylene group, a propenylene group, and a butenylene group), and examples of the arylene group of A include arylene groups having 6 to 10 carbon atoms (for example, a phenylene group, a tolylene group, and a naphthylene group), respectively.

Moreover, a compound having a plurality of structures represented by the general formula (ZVI) is also preferred in the invention. For example, either of $R_{209}$ or $R_{210}$ of the compound represented by the general formula (ZVI) may be a compound having a structure bonded with either of $R_{209}$ or $R_{210}$ of another compound represented by the general formula (ZVI).

In the compounds generating acid upon decomposing caused by irradiation with actinic rays or radiation, the acid generator (B) is more preferably a compound represented by the general formula (ZIII) to (ZVI) from the viewpoint of a good solubility with respect to a developer containing the organic solvent of the unexposed portions and the tendency not to generate development defects, that is, preferably a non-ionic compound. Among these, the compound is more preferably a compound represented by the general formula (ZV) or (ZVI).

In addition, from the viewpoint of improving the acid generating efficiency and the acid strength, the acid generator (B) preferably has a structure generating an acid containing a fluorine atom.

Specific examples of the acid generator (B) are shown below; however, the invention is not limited thereto.

[Chem. 35]

(B1) 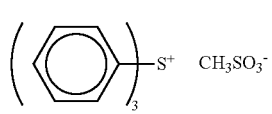

(B2) 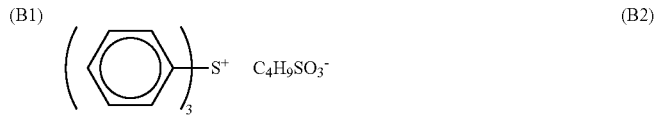

(B3) 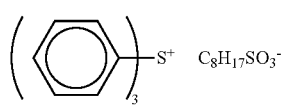

(B4) 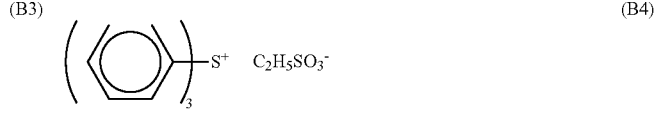

(B5) 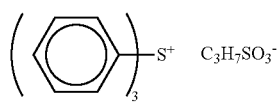

(B6) 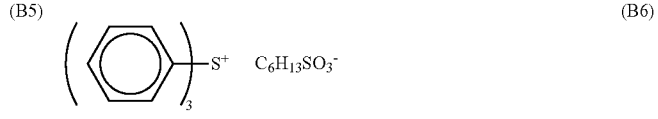

(B7) 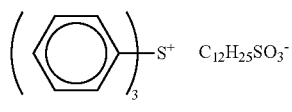

(B8) 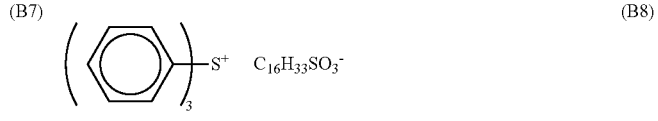

(B9) 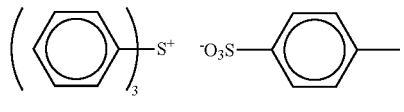

(B10) 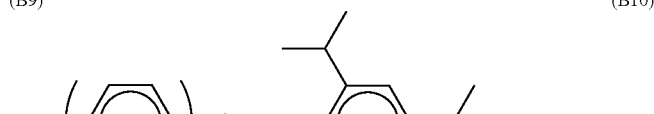

-continued
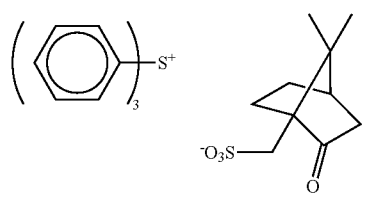 (B11)
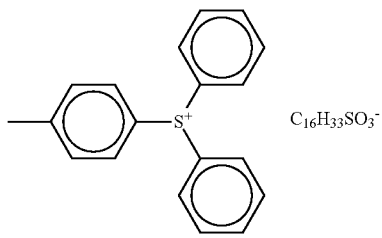 (B12)
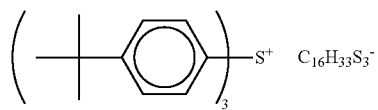 (B13)
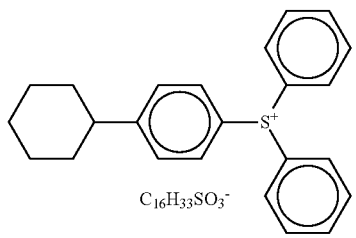 (B14)
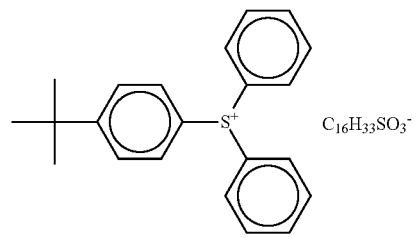 (B15)
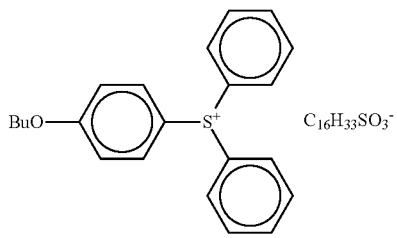 (B16)
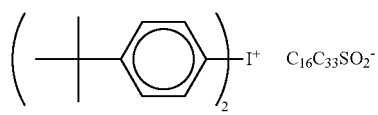 (B17)
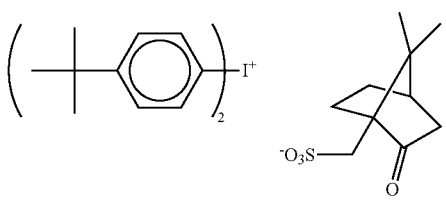 (B18)
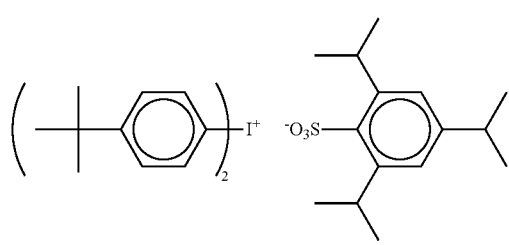 (B19)
[Chem 36]
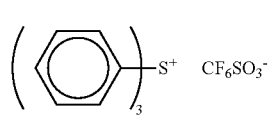 (B20)
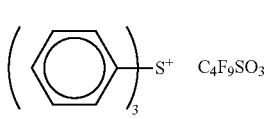 (B21)
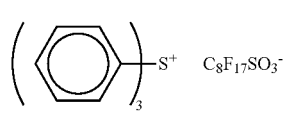 (B22)
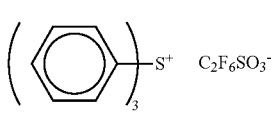 (B23)
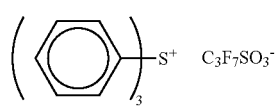 (B24)
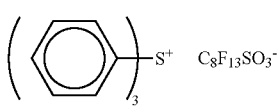 (B25)

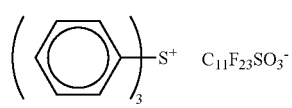 (B26)
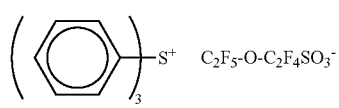 (B27)
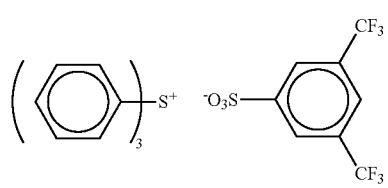 (B28)
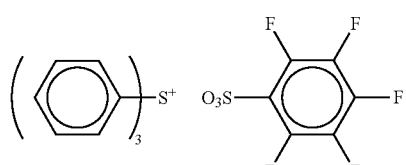 (B29)
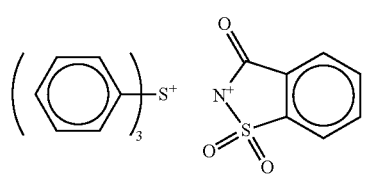 (B30)
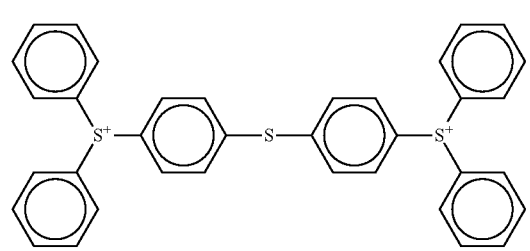 (B31)
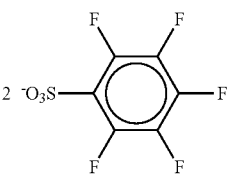
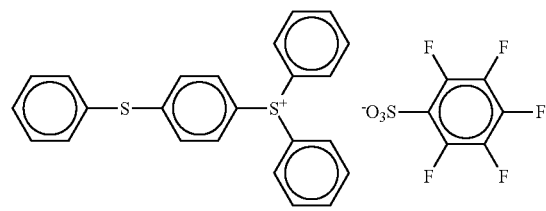 (B32)
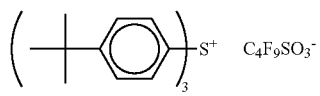 (B33)
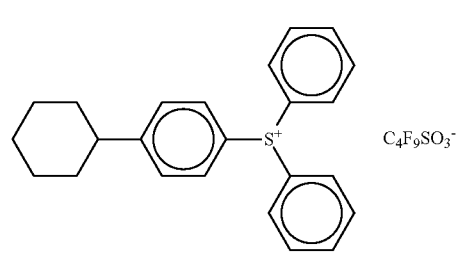 (B34)
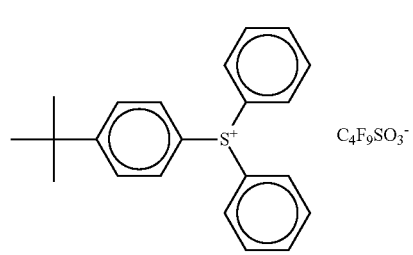 (B35)
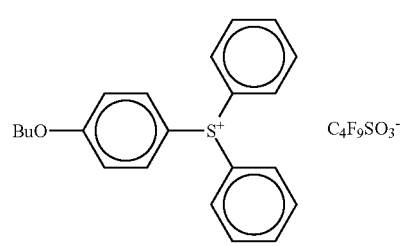 (B36)
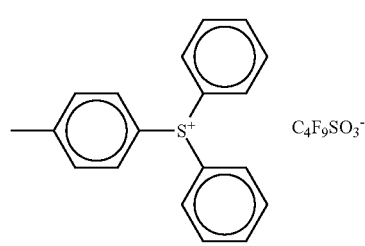 (B37)

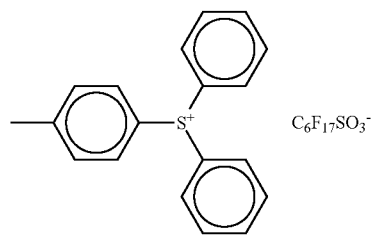
(B38)
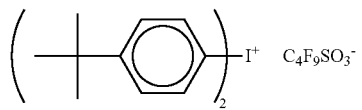
(B39)
(B40)
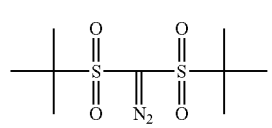
[Chem. 37]
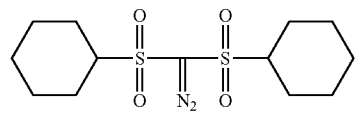
(B41)  (B42)
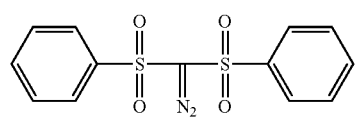
(B43)
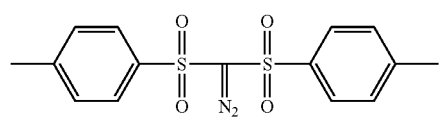
(B44)
[Chem. 38]
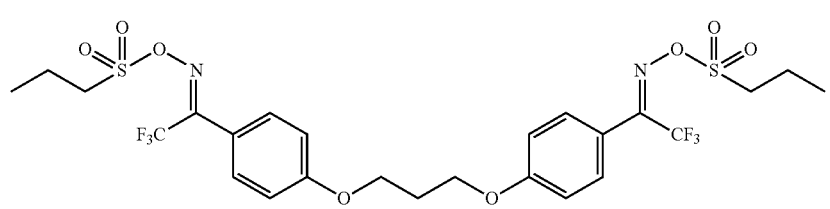
(B45)
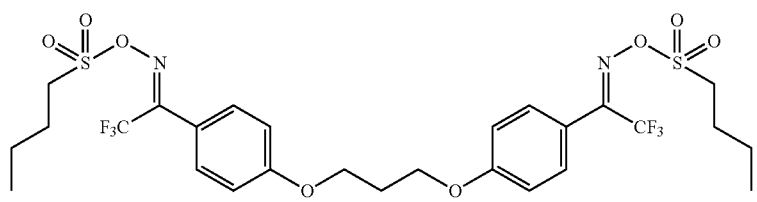
(B46)
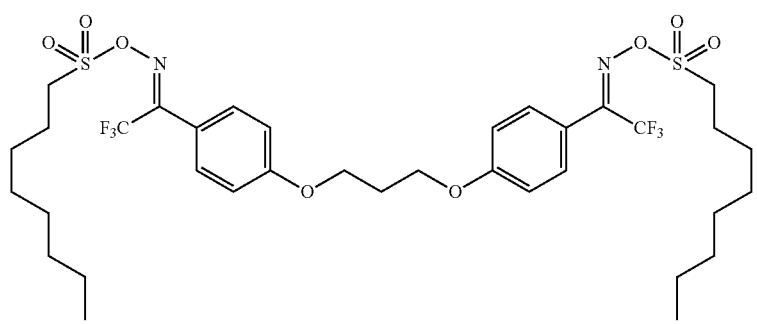
(B47)

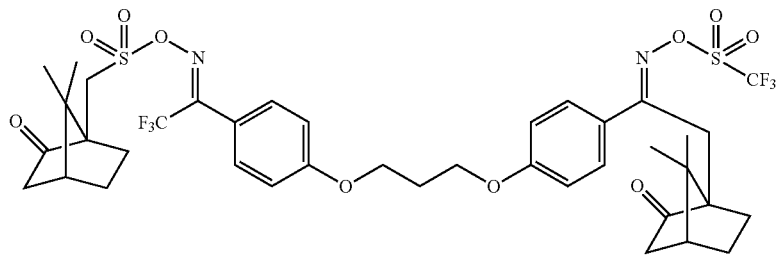
(B48)
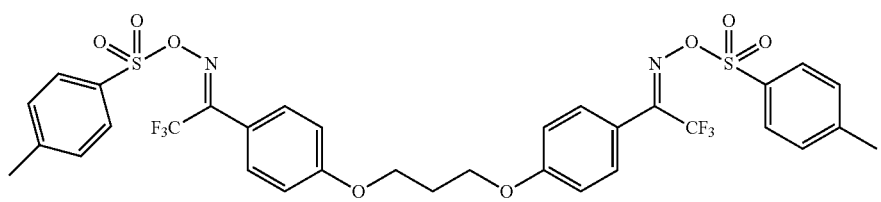
(B49)
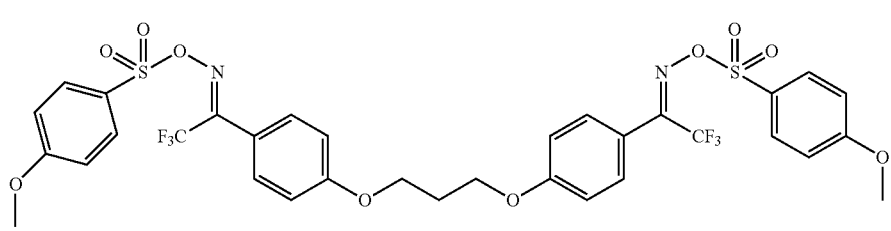
(B50)
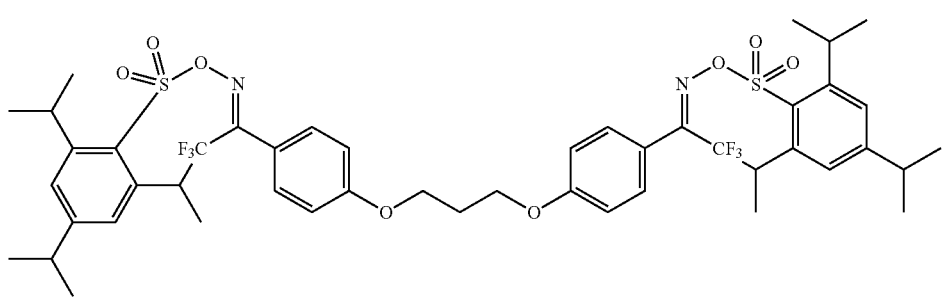
(B51)
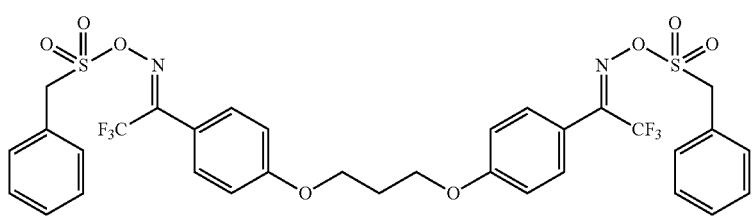
(B52)
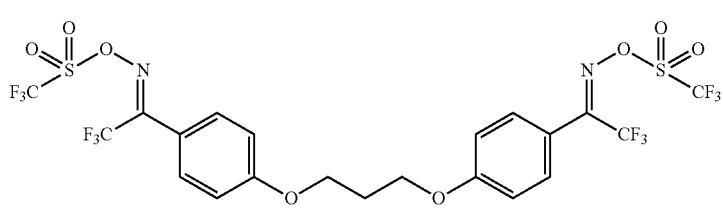
(B53)
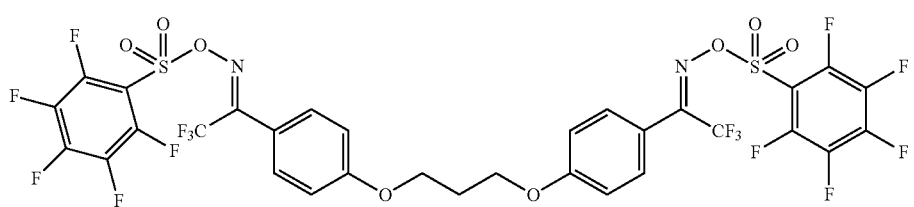
(B54)

-continued
(B55)
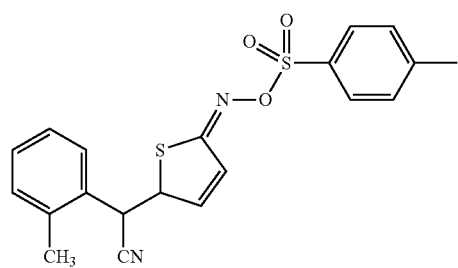
(B56)
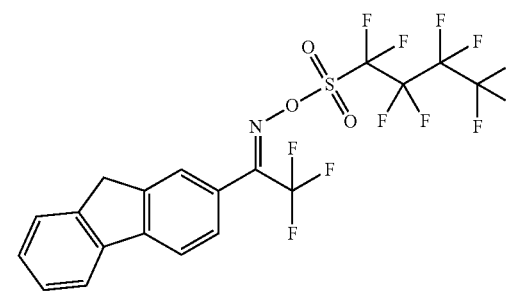
(B57)
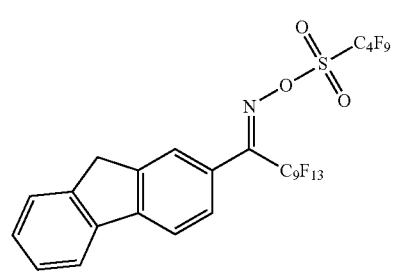
(B58)
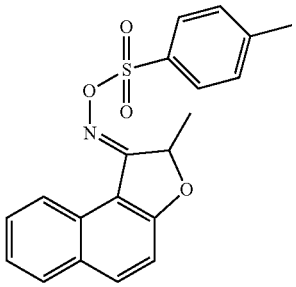
(B59)
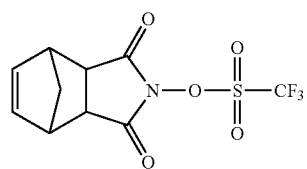
[Chem. 39]
(B60)
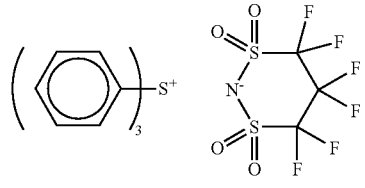
(B61)
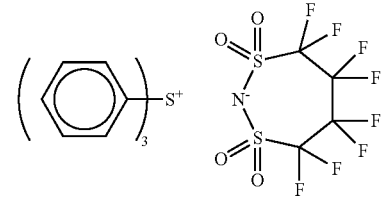
(B62)
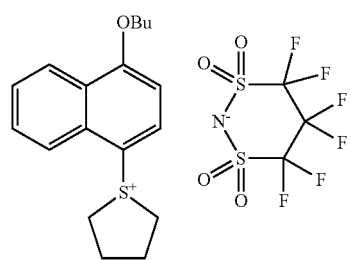
(B63)
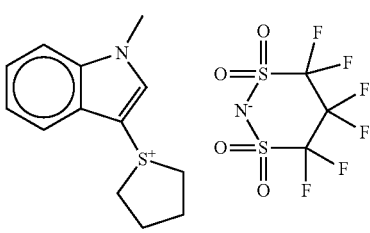
(B64)
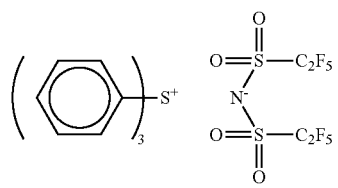
(B65)
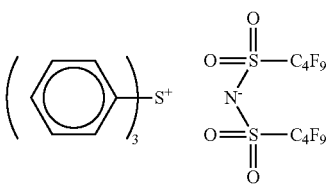

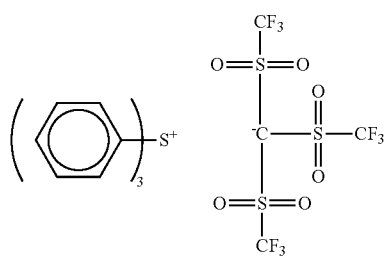 (B66)

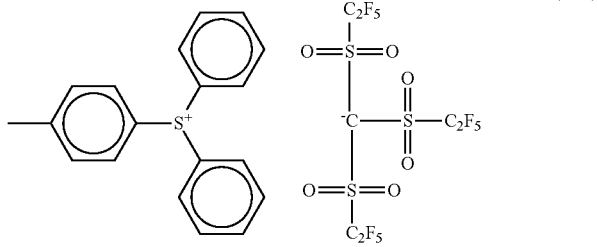 (B67)

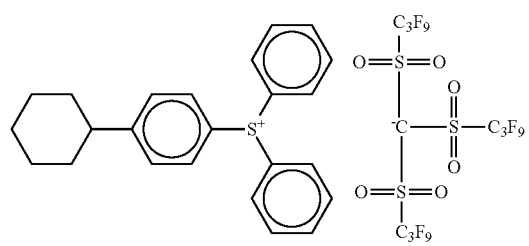 (B68)

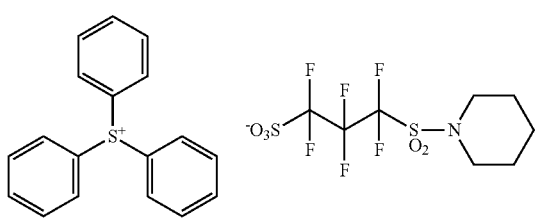 (B69)

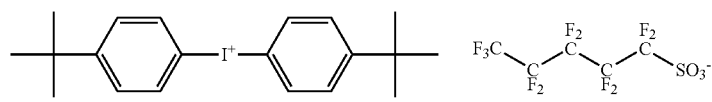 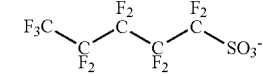 (B70)

The acid generator (B) may be used alone or in combination of two or more thereof. When used in a combination of two or more, a combination of compounds generating two different types of organic acid having two or more total atoms excluding hydrogen atoms is preferred.

For example, from the viewpoint of improving the acid generating efficiency and the acid strength, examples include an embodiment in which a compound having a structure generating an acid containing a fluorine atom and a compound not containing such a structure are combined.

The content of the acid generator (B) in the composition is preferably 0.1 to 20% by mass, more preferably 0.5 to 15% by mass, and even more preferably 1 to 10% by mass with the total solid content of the actinic ray-sensitive or radiation-sensitive resin composition as a reference.

[4] Solvent (C)

Examples of the solvent which can be used at the time of preparing the actinic ray-sensitive or radiation-sensitive resin composition in the invention include an organic solvent such as alkylene glycol monoalkyl ether carboxylate, alkylene glycol monoalkyl ether, alkyl lactate, alkyl alkoxypropionate, cyclic lactone (preferably having 4 to 10 carbon atoms), monoketone compound (preferably having 4 to 10 carbon atoms) which may contain a ring, alkylene carbonate, alkyl alkoxyacetate, and alkyl pyruvate.

Specific examples of these solvents are the same as those described in paragraphs [0441] to [0455] of US2008/0187860A.

In the invention, a mixed solvent prepared by mixing a solvent containing a hydroxyl group in the structure and a solvent not containing a hydroxyl group may be used as the organic solvent.

The solvent containing a hydroxyl group and the solvent not containing a hydroxyl group may be appropriately selected from the compounds exemplified above, but the solvent containing a hydroxyl group is preferably, for example, an alkylene glycol monoalkyl ether or an alkyl lactate, more preferably propylene glycol monomethyl ether (PGME, alternative name, 1-methoxy-2-propanol), or ethyl lactate. Further, the solvent not containing a hydroxyl group is preferably, for example, an alkylene glycol monoalkyl ether acetate, an alkyl alkoxypropionate, a monoketone compound which may contain a ring, a cyclic lactone or an alkyl acetate, more preferably propylene glycol monomethyl ether acetate (PGMEA, alternative name, 1-methoxy-2-acetoxypropanol), ethyl ethoxypropionate, 2-heptanone, γ-butyrolactone, cyclohexanone, or butyl acetate, and most preferably propylene glycol monomethyl ether acetate, ethyl ethoxypropionate or 2-heptanone.

The mixing ratio (by mass) of the solvent containing a hydroxyl group to the solvent not containing a hydroxyl group is from 1/99 to 99/1, preferably from 10/90 to 90/10, and more preferably from 20/80 to 60/40. A mixed solvent in which the solvent not containing a hydroxyl group is contained in an amount of 50% by mass or more is particularly preferred in view of coating uniformity.

The solvent is preferably a mixed solvent of two or more kinds of solvent containing propylene glycol monomethyl ether acetate, and more preferably a solvent of propylene glycol monomethyl ether acetate alone, or a mixed solvent of two or more kinds, containing propylene glycol monomethyl ether acetate.

[5] Basic Compound (E)

The actinic ray-sensitive or radiation-sensitive resin composition in the invention may contain a basic compound (E) in order to reduce the change in performance with aging from exposure to heating.

Preferred examples of the basic compound include compounds having structures represented by the following formulae (A) to (E).

[Chem. 40]

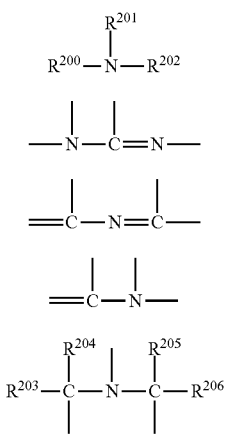

In the general formulae (A) and (E),
$R^{200}$, $R^{201}$, and $R^{202}$ may be the same as or different from each other, and each independently represents a hydrogen atom, an alkyl group (preferably having 1 to 20 carbon atoms), a cycloalkyl group (preferably 3 to 20 carbon atoms), or an aryl group (having 6 to 20 carbon atoms), in which $R^{201}$ and $R^{202}$ may be bonded to each other to form a ring; and $R^{203}$, $R^{204}$, $R^{205}$, and $R^{206}$ may be the same as or different from each other, and each independently represents an alkyl group having 1 to 20 carbon atoms.

The alkyl group having a substituent as the alkyl group is preferably an aminoalkyl group having 1 to 20 carbon atoms, a hydroxyalkyl group having 1 to 20 carbon atoms, or a cycloalkyl group having 1 to 20 carbon atoms.

The alkyl group in the general formulae (A) and (E) is more preferably unsubstituted.

Preferred examples of the compound include guanidine, aminopyrrolidine, pyrazole, pyrazoline, piperazine, aminomorpholine, aminoalkylmorpholine, and piperidine, and more preferred examples of the compound include a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undeca-7-ene. Examples of the compound having an onium hydroxide structure include triarylsulfonium hydroxide, phenacylsulfonium hydroxide, and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide, and 2-oxopropylthiophenium hydroxide. The compound having an onium carboxylate structure is a compound where the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound further include a phenoxy group-containing amine compound, a phenoxy group-containing ammonium salt compound, a sulfonic acid ester group-containing amine compound, and a sulfonic acid ester group-containing ammonium salt compound.

As for the phenoxy group-containing amine compound, the phenoxy group-containing ammonium salt compound, the sulfonic acid ester group-containing amine compound, and the sulfonic acid ester group-containing ammonium salt compound, it is preferred that at least one alkyl group be bonded to the nitrogen atom. Further, it is preferred that the compound have an oxygen atom in the alkyl chain to form an oxyalkylene group. The number of the oxyalkylene groups within the molecule is 1 or more, preferably from 3 to 9, and more preferably from 4 to 6. Among the oxyalkylene groups, the structures of —$CH_2CH_2O$—, —$CH(CH_3)CH_2O$—, or —$CH_2CH_2CH_2O$— are preferred.

Specific examples of the ammonium salt compound having the phenoxy group-containing amine compound, the phenoxy group-containing ammonium salt compound, the sulfonic acid ester group-containing amine compound, and the sulfonic acid ester group-containing ammonium salt compound include, but are not limited to, Compounds (C1-1) to (C3-3) illustrated in paragraph [0066] in the specification of US2007/0224539A.

The actinic ray-sensitive or radiation-sensitive resin composition in the invention may or may not contain the basic compound, but in the case of the basic compound being contained, the amount of the basic compound used is usually from 0.001 to 10% by mass, and preferably from 0.01 to 5% by mass, based on the solid content of the actinic ray-sensitive or radiation-sensitive resin composition.

The ratio between the acid generator and the basic compound used in the composition is preferably a ratio of acid generator/basic compound (molar ratio)=2.5 to 300. That is, the molar ratio is preferably 2.5 or more from the viewpoint of sensitivity and resolution, and preferably 300 or less from the viewpoint of inhibiting the reduction in resolution due to thickening of the resist pattern with aging after exposure until heat treatment. The acid generator/basic compound (molar ratio) is more preferably from 5.0 to 200, and still more preferably from 7.0 to 150.

[6] Surfactant (F)

The actinic ray-sensitive or radiation-sensitive resin composition in the invention may or may not further contain a surfactant, and in the case where it contains a surfactant, it is preferred to include any one fluorine-based and/or silicon-based surfactant (a fluorine-based surfactant, a silicon-based surfactant or a surfactant containing both fluorine atoms and silicon atoms) or two or more kinds thereof.

When the actinic ray-sensitive or radiation-sensitive resin composition in the invention contains the surfactant, a resist pattern with good sensitivity, resolution and adherence as well as few development defects can be obtained in using an exposure light source of 250 nm or less, and in particular, 220 nm or less.

Examples of the fluorine-based and/or silicon-based surfactant include the surfactants described in paragraph [0276] in the specification of US2008/0248425A, such as EFtop EF301 and EF303 (manufactured by Shin-Akita Kasei K.

K.); Florad FC430, 431, and 4430 (manufactured by Sumitomo 3M Inc.); Megaface F171, F173, F176, F189, F113, F110, F177, F120, and R08 (manufactured by Dainippon Ink & Chemicals, Inc.); Surflon S-382, SC101, 102, 103, 104, 105, and 106, and KH-20 (manufactured by Asahi Glass Co., Ltd.); Troysol S-366 (manufactured by Troy Chemical); GF-300, and GF-150 (manufactured by Toagosei Chemical Industry Co., Ltd.); Surflon S-393 (manufactured by Seimi Chemical Co., Ltd.); EFtop EF121, EF122A, EF122B, RF122C, EF125M, EF135M, EF351, EF352, EF801, EF802, and EF601 (manufactured by JEMCO Inc.); PF636, PF656, PF6320, and PF6520 (manufactured by OMNOVA); and FTX-204G, 208G, 218G, 230G, 204D, 208D, 212D, 218D, and 222D (manufactured by NEOS Co., Ltd.). In addition, a polysiloxane polymer KP-341 (manufactured by Shin-Etsu Chemical Co., Ltd.) may also be used as the silicon-based surfactant.

Furthermore, other than those known surfactants above, a surfactant using a polymer having a fluoro-aliphatic group derived from a fluoro-aliphatic compound which is produced by a telomerization method (also called a telomer method) or an oligomerization method (also called an oligomer method), may also be used. The fluoro-aliphatic compound can be synthesized by the method described in JP2002-90991A.

Examples of the above-described type of surfactant include Megaface F178, F-470, F-473, F-475, F-476, and F-472 (manufactured by Dainippon Ink & Chemicals, Inc.), a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene))acrylate (or methacrylate), and a (poly(oxypropylene))acrylate (or methacrylate).

Moreover, a surfactant other than the fluorine-based and/or silicon-based surfactant, described in paragraph [0280] in the specification of US2008/0248425A, may also be used in the invention.

The surfactants may be used singly or in combination of several kinds thereof.

The actinic ray-sensitive or radiation-sensitive resin composition of the invention may or may not contain a surfactant; however, in a case where the actinic ray-sensitive or radiation-sensitive resin composition contains a surfactant, the usage amount of the surfactant is preferably 0.0001 to 2% by mass, and more preferably 0.0005 to 1% by mass based on the total content of the actinic ray-sensitive or radiation-sensitive resin composition (excluding the solvent).

[7] Other Additives (G)

The actinic ray-sensitive or radiation-sensitive resin composition in the invention may or may not contain an onium carboxylate. Examples of the onium carboxylate include those described in paragraphs [0605] to [0606] in the specification of US2008/0187860A.

These onium carboxylates can be synthesized by reacting sulfonium hydroxide, iodonium hydroxide, ammonium hydroxide, and carboxylic acid with silver oxide in a suitable solvent.

In the case where the actinic ray-sensitive or radiation-sensitive resin composition contains onium carboxylate, the content of the onium carboxylate is generally from 0.1 to 20% by mass, preferably 0.5 to 10% by mass, and still more preferably 1 to 7% by mass, based on the total solid content of the composition.

The actinic ray-sensitive or radiation-sensitive resin composition of the invention may further contain, for example, a dye, a plasticizer, a photosensitizer, a light absorber, an alkali-soluble resin, a dissolution inhibitor, a compound for accelerating dissolution in a developer (for example, a phenol compound having a molecular weight of 1000 or less, or a carboxyl group-containing alicyclic or aliphatic compound), or the like, if desired.

The phenol compound having a molecular weight of 1000 or less can be easily synthesized by a person skilled in the art by referring to the methods described, for example, in JP1992-122938A (JP-H04-122938A), JP1990-28531A (JP-H02-28531A), U.S. Pat. No. 4,916,210B, EP219,294B, and the like.

Examples of the carboxyl group-containing alicyclic or aliphatic compound include a carboxylic acid derivative having a steroid structure, such as cholic acid, deoxycholic acid, and lithocholic acid, an adamantanecarboxylic acid derivative, adamantanedicarboxylic acid, cyclohexanecarboxylic acid, and cyclohexanedicarboxylic acid; however, the invention is not limited thereto.

The actinic ray-sensitive or radiation-sensitive resin composition in the invention is preferably used in a film thickness of 30 to 250 nm, and more preferably from 30 to 200 nm, from the viewpoint of improving the resolving power. Such a film thickness can be obtained by setting the solid concentration in the actinic ray-sensitive or radiation-sensitive resin composition to an appropriate range, thereby imparting an appropriate viscosity and improving the coatability and the film-forming property.

The solid content concentration of the actinic ray-sensitive or radiation-sensitive resin composition for use in the invention is usually from 1.0 to 15% by mass, preferably from 2.5 to 13% by mass, and more preferably from 3.0 to 12% by mass. By setting the solid content concentration in this range, the resist solution can be uniformly coated on a substrate, and furthermore a resist pattern having a high resolution and a rectangular profile, and which is excellent in etching resistance can be formed. The reasons therefor are not clearly known, but it is considered that by setting the solid content concentration to 10% by mass or less, and preferably 5.7% by mass or less, the materials, particularly the photo-acid generator, in the resist solution are inhibited from aggregating, and as a result, a uniform resist film can be formed.

The solid content concentration is a weight percentage of the weight of the resist components excluding the solvents, based on the total weight of the actinic ray-sensitive or radiation-sensitive resin composition.

The actinic ray-sensitive or radiation-sensitive resin composition of the invention is used, for example, after the above components are dissolved in a predetermined organic solvent, filtered using a filter, and then applied onto a predetermined support (substrate). The filter used in the filtration is preferably made of polytetrafluoroethylene, polyethylene, or nylon having a pore size of 0.1 μm or less, more preferably 0.05 μm or less, and still more preferably 0.03 μm or less. In the filtration using a filter, for example, cyclic filtration may be carried out as described in JP2002-62667A or filtration with serial or parallel connection of plural kinds of filters may be carried out. Further, the composition may be filtered plural times. In addition to the filtration using a filter, the composition may be subjected to a deaeration treatment or the like.

Pattern Forming Method

The pattern forming method of the invention (negative type pattern forming method) includes at least:
(i) forming a resist film using an actinic ray-sensitive or radiation-sensitive resin composition,
(ii) exposing the film; and
(iii) developing using a developer.

The exposure in (ii) may be liquid-immersion exposure.

The pattern forming method of the invention preferably includes (iv) heating after the (ii) exposure.

The pattern forming method of the invention may further include (v) developing using an alkali developer.

The pattern forming method of the invention may include (ii) exposure plural times.

The pattern forming method of the invention may include (iv) heating plural times.

The resist film is formed from the actinic ray-sensitive or radiation-sensitive resin composition according to the invention, and more specifically, it is preferably formed on a substrate. In the pattern forming method of the invention, the processes of forming a film from the actinic ray-sensitive or radiation-sensitive resin composition on a substrate; exposing the film; and developing may be carried out by a generally known method.

After preparing the film and before the exposing, a prebake process (PB; Prebake) is also preferably included. In addition, after the exposing and before the developing, heating (PEB; Post Exposure Bake) is also preferably included.

Regarding the heating temperature, heating of any of PB and PEB is preferably at a temperature of 70 to 130° C., and more preferably at a temperature of 80 to 120° C.

The heating time is preferably 30 to 300 seconds, more preferably 30 to 180 seconds, and still more preferably 30 to 90 seconds.

Heating may be carried out by a unit included in a normal exposure/development apparatus, and may also be carried out using a hot plate or the like.

By the baking, the reaction of the exposed portion is accelerated and the sensitivity or pattern profile is improved.

Examples of the wavelength of the light source used in the exposure apparatus of the invention include a KrF excimer laser (248 nm), an EUV (13 nm), an electron beam, or the like, and a KrF excimer laser is preferred.

In the invention, the substrate on which the film is formed is not particularly limited, and a substrate generally used for lithography in the production of a semiconductor device such as an IC, a liquid crystal device or a circuit board such as a thermal head and further in other photofabrication processes, such as an inorganic substrate, for example, silicon, SiN, SiO$_2$, and SiN and a coating-type inorganic substrate, for example, SOG, can be used.

The pattern forming method of the invention can use an uneven substrate as the substrate in the fine processing such as usage in ion implantation, for example.

The uneven substrate is a substrate in which at least one uneven shape is formed on the substrate.

The film thickness of the laminate film formed on the above-described uneven substrate refers to the height from the bottom surface on the uneven substrate to the top surface of the formed resist film.

The height from the bottom surface of the uneven substrate to the top surface of the uneven shape is preferably smaller than the film thickness of the resist film, for example, less than 200 nm.

For example, in a case of fine processing such as usage in ion implantation, a substrate in which fins and gates are patterned on a flat substrate can be used as the uneven substrate. The film thickness of the resist film coated with the actinic ray-sensitive or radiation-sensitive resin composition and formed on the uneven substrate patterned with fins and gates in this manner refers to the height from the bottom surface on the uneven substrate as described above to the top surface of the formed resist film, not to the height from the upper surface of the fins or gates to the upper surface of the formed resist film.

As the size (width, length, height, or the like), spacing, structure, configuration, or the like, of the fins and gates, for example, the ones described in pages 25 to 29 of "Cutting-edge FinFET processing and integration technology" Journal of the institute of Electronics, Information and Communication Engineers Vol. 91 No. 1 2008, or Jpn. J. Appl. Phys. Vol. 42 (2003) pp. 4142-4146 Part1 No. 6B June 2003 "Fin-Type Double-Gate Metal-Oxide-Semiconductor Field-Effect Transistors Fabricated by Orientation-Dependent Etching and Electron Beam Lithography" can be appropriately applied.

The pattern forming method of the invention does not require an antireflection film from the viewpoint of achieving the effect of the invention; however, an organic antireflection film may be formed between the film and the substrate as necessary.

For example, the antireflection film may be provided at the lower layer of the resist. The antireflection film used may be either an inorganic film type such as titanium, titanium dioxide, titanium nitride, chromium oxide, carbon or amorphous silicon, or an organic film type formed of a light absorber and a polymer material. In the former case, the provision of a vacuum deposition apparatus, a CVD apparatus, a sputtering apparatus, or the like is necessary in the film forming. As the organic antireflection film, examples include ones formed of a condensate of a diphenylamine derivative and a formaldehyde modified melamine resin, an alkali-soluble resin, and a light-absorbing agent described in JP1995-69611B (JP-H07-69611B); a reactant of a maleic anhydride copolymer and a diamine type light-absorbing agent described in US5294680A; ones containing a resin binder and a methylol melamine-based heat cross-linking agent described in JP1994-118631A (JP-H06-118631A); an acrylic resin-type antireflection film having a carboxylic acid group, an epoxy group, and a light-absorbing group in the same molecule described in JP1994-118656A (JP-H06-118656A); ones formed of methylol melamine and a benzophenone-based light-absorbing agent described in JP1996-87115A (JP-H08-87115A); and ones in which a low molecular weight light-absorbing agent is attached to a polyvinyl alcohol resin described in JP1996-179509A (JP-H08-179509A); and the like.

In addition, as the organic antireflection film, a commercially available organic antireflection film such as DUV30 Series and DUV-40 Series manufactured by Brewer Science, Inc. and AR-2, AR-3 and AR-5 manufactured by Shipley Co., Ltd. can also be used.

In addition, as necessary, the antireflection film can be used on the upper layer of the resist.

Examples of the antireflection film include AQUATAR-II, AQUATAR-III, AQUATAR-VII, and the like manufactured by AZ Electronic Materials Corp.

As the developer (hereinafter also referred to as an organic developer) in the development with a developer including an organic solvent in the pattern forming method of the invention, a polar solvent such as a ketone-based solvent, an ester-based solvent, an alcohol-based solvent, an amide-based solvent, and an ether-based solvent, or a hydrocarbon-based solvent may be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methylethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of the alcohol-based solvent include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, and methoxymethyl butanol.

Examples of the ether-based solvent include, in addition to the glycol ether-based solvents above, dioxane, and tetrahydrofuran.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene and xylene, and aliphatic hydrocarbon-based solvents such as pentane, hexane, octane, and decane.

A plurality of these solvents may be mixed, or the solvent may be used by mixing with a solvent other than those described above or water. However, in order to sufficiently bring out the effects of the invention, the water content of the entire developer is preferably less than 10% by mass, and it is more preferred to include substantially no water.

That is, the content of the organic solvent in the organic developer is preferably from 90% by mass to 100% by mass, and more preferably from 95% by mass to 100% by mass, based on the total amount of the developer.

In particular, the organic developer is preferably a developer containing at least one organic solvent selected from a group consisting of a ketone-based solvent, an ester-based solvent, an alcohol-based solvent, an amide-based solvent, and an ether-based solvent.

The vapor pressure at 20° C. of the organic developer is preferably 5 kPa or less, more preferably 3 kPa or less, and particularly preferably 2 kPa or less. By setting the vapor pressure of the organic developer to 5 kPa or less, evaporation of the developer on a substrate or in a development cup is inhibited and the temperature uniformity in the wafer plane is enhanced, as a result, the dimensional uniformity in the wafer plane is improved.

Specific examples having a vapor pressure of 5 kPa or less include ketone-based solvents such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenyl acetone, and methyl isobutyl ketone; ester-based solvents such as butyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate, and propyl lactate; alcohol-based solvents such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, and methoxymethyl butanol; ether-based solvents such as tetrahydrofuran; amide-based solvents such as N-methyl-2-pyrrolidone, N,N-dimethylacetamide, N,N-dimethylformamide; aromatic hydrocarbon-based solvents such as toluene and xylene, and aliphatic hydrocarbon-based solvents such as octane, and decane. Specific examples having a vapor pressure of 2 kPa or less, which is a particularly preferred range, include ketone-based solvents such as 1-octanone, 2-octanone, 1-nonanone, 2-nonanone, 4-heptanone, 2-hexanone, diisobutyl ketone, cyclohexanone, methylcyclohexanone, and phenyl acetone; ester-based solvents such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, ethyl lactate, butyl lactate, and propyl lactate; alcohol-based solvents such as n-butyl alcohol, sec-butyl alcohol, tert-butyl alcohol, isobutyl alcohol, n-hexyl alcohol, n-heptyl alcohol, n-octyl alcohol and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, and methoxymethyl butanol; amide-based solvents such as N-methyl-2-pyrrolidone, N,N-dimethylacetamide, N,N-dimethylformamide; aromatic hydrocarbon-based solvents such as xylene; and aliphatic hydrocarbon-based solvents such as octane, and decane.

An appropriate amount of a surfactant may be added to the organic developer, if desired.

The surfactant is not particularly limited but, for example, an ionic or nonionic fluorine-based and/or silicon-based surfactant can be used. Examples of such a fluorine-based and/or silicon-based surfactant include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720B, 5,360,692B, 5,529,881B, 5,296,330B, 5,436,098B, 5,576,143B, 5,294,511B, and 5,824,451B. A nonionic surfactant is preferred. The nonionic surfactant is not particularly limited, but use of a fluorine-based surfactant or a silicon-based surfactant is more preferred.

The amount of the surfactant used is usually from 0.001 to 5% by mass, preferably from 0.005 to 2% by mass, and more preferably from 0.01 to 0.5% by mass, based on the total amount of the developer.

Regarding the developing method, for example, a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on a substrate surface (spraying method), a method of continuously discharging the developer on the substrate rotating at a constant speed while scanning the developer discharging nozzle at a constant rate (dynamic dispense method), or the like may be applied.

In the case where the above-described various developing methods include a step of discharging the developer toward the resist film from a development nozzle of a developing apparatus, the discharge pressure of the developer discharged (the flow velocity per unit area of the developer discharged) is preferably 2 mL/sec/mm$^2$ or less, more preferably 1.5 mL/sec/mm$^2$ or less, and still more preferably 1 mL/sec/mm$^2$ or less. The flow velocity is not particularly limited in the lower limit, but from the viewpoint of throughput, is preferably 0.2 mL/sec/mm$^2$ or more.

By setting the discharge pressure of the discharged developer to the range above, pattern defects attributable to the resist residue after development can be greatly reduced.

Details of this mechanism are not clearly known, but it is considered that it may be that, due to the discharge pressure in the above-described range, the pressure imposed on the resist film by the developer is small and the resist film or resist pattern is kept from inadvertent chipping or collapse.

Here, the discharge pressure (mL/sec/mm$^2$) of the developer is a value at the outlet of a development nozzle in a developing apparatus.

Examples of the method for adjusting the discharge pressure of the developer include a method of adjusting the discharge pressure by a pump or the like, and a method of supplying the developer from a pressurized tank and adjusting the pressure to change the discharge pressure.

Further, after the development step using a developer including an organic solvent, stopping of the development by replacement with another solvent may be carried out.

After the development step using a developer including an organic solvent, washing with a rinsing liquid is preferably included.

The rinsing liquid used in the rinsing step with a rinsing liquid including an organic solvent after the development using a developer including an organic solvent is not particularly limited as long as it does not dissolve the resist pattern, and a solution including an ordinary organic solvent may be used. As the rinsing liquid, a rinsing liquid including at least one organic solvent selected from a group consisting of a hydrocarbon-based solvent, a ketone-based solvent, an ester-based solvent, an alcohol-based solvent, an amide-based solvent, and an ether-based solvent is preferably used. Specific examples of the hydrocarbon-based solvent, the ketone-based solvent, the ester-based solvent, the alcohol-based solvent, the amide-based solvent, and the ether-based solvent include those described above for the developer including an organic solvent.

After the development step using a developer including an organic solvent, more preferably, washing with a rinsing liquid containing at least one organic solvent selected from the group consisting of a ketone-based solvent, an ester-based solvent, an alcohol-based solvent, and an amide-based solvent is carried out; still more preferably, washing with a rinsing liquid containing an alcohol-based solvent or an ester-based solvent is carried out; particularly preferably, washing with a rinsing liquid containing a monohydric alcohol is carried out; and most preferably, washing with a rinsing liquid containing a monohydric alcohol having 5 or more carbon atoms is carried out.

Here, the monohydric alcohol used in the rinsing step includes linear, branched, and cyclic monohydric alcohols, and specifically 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like may be used. As the particularly preferred monohydric alcohol having or more carbon atoms, 1-hexanol, 2-hexanol, 4-methyl-2-pentanol, 1-pentanol, 3-methyl-1-butanol, or the like may be used.

A plurality of these respective components may be mixed or the solvent may be used by mixing it with an organic solvent other than those described above.

The water content in the rinsing liquid is preferably 10% by mass or less, more preferably 5% by mass or less, and particularly preferably 3% by mass or less. By setting the water content to 10% by mass or less, good development characteristics can be obtained.

The vapor pressure at 20° C. of the rinsing liquid used after the development using a developer including an organic solvent is preferably from 0.05 kPa to 5 kPa, more preferably from 0.1 kPa to 5 kPa, and most preferably from 0.12 kPa to 3 kPa. By setting the vapor pressure of the rinsing liquid to a value ranging from 0.05 kPa to 5 kPa, the temperature uniformity in the wafer plane is enhanced and moreover, swelling due to permeation of the rinsing liquid is inhibited, as a result, the dimensional uniformity in the wafer plane is improved.

The rinsing liquid may also be used after adding a surfactant in an appropriate amount.

In the rinsing, the wafer that has been subjected to development using a developer including an organic solvent is washed using the above-described rinsing liquid including an organic solvent. The method for the washing treatment is not particularly limited, but examples of the method which can be applied include a method of continuously discharging the rinsing liquid on the substrate spinning at a fixed speed (rotation coating method), a method of dipping the substrate in a bath filled with the rinsing liquid for a fixed time (dipping method), and a method of spraying the rinsing liquid on the substrate (spraying method). Above all, it is preferred to perform the washing treatment by the spin coating method and after the washing, remove the rinsing liquid from the substrate surface by spinning the substrate at a rotational speed of 2000 rpm to 4000 rpm. Further, it is also preferred to include heating (Post Bake) after the rinsing. The developer and the rinsing liquid remaining between the patterns and inside the patterns are removed by the baking. The heating after the rinsing is carried out at usually from 40 to 160° C., and preferably from 70 to 95° C., and for usually from 10 seconds to 3 minutes, and preferably from 30 seconds to 90 seconds.

In the case where the pattern forming method of the invention further includes development using an alkali developer, examples of the alkali developer include alkaline aqueous solutions of inorganic alkali such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

Further, an alcohol and a surfactant may be each added in an appropriate amount to the alkaline aqueous solution and used.

The alkali concentration of the alkali developer is usually from 0.1 to 20% by mass.

The pH of the alkali developer is usually from 10.0 to 15.0.

In particular, a 2.38%-by-mass aqueous tetramethylammonium hydroxide solution is preferred.

As for the rinsing liquid in the rinsing treatment carried out after the alkali development, pure water is used, and the pure water may be used after adding a surfactant in an appropriate amount thereto.

Further, after the development treatment or the rinsing treatment, a treatment of removing the developer or the rinsing liquid adhering on the pattern by a supercritical fluid may be carried out.

In addition, the invention relates to a method for manufacturing an electronic device, including the pattern forming method of the invention as described above, and an electronic device prepared by the preparation method.

The electronic device of the invention is suitably mounted on an electric/electronic device (domestic appliances, OA• medium-related devices, optical devices, communication devices, and the like).

EXAMPLES

Hereinafter, more detailed description will be given according to Examples of the invention, but the present invention is not limited to the following Examples.

Synthesis Example 1

Synthesis of Resin (Pol-1)

Under a nitrogen stream, 27.0 parts by mass of cyclohexanone was charged into a three-necked flask, and the flask was heated at 80° C. Next, a monomer (9.4 parts by mass) corresponding to following Unit 1-1, a monomer (13.9 parts by mass) corresponding to following Unit 2-1, a monomer (28.8 parts by mass) corresponding to following Unit 3-1, and a monomer (5.8 parts by mass) corresponding to following Unit 4-10 were dissolved in cyclohexanone (108.0 parts by mass), and a monomer solution was prepared. Furthermore, 2.1 parts by mass of 2,2'-dimethyl azobisisobutyrate [V-601, manufactured by Wako Pure Chemical Industries, Ltd.] were added to the monomer solution, and the dissolved solution was added dropwise into the above-described flask over 6 hours. After the completion of dropwise addition, the mixture was further reacted at 80° C. for 2 hours. The reaction solution was cooled and then added dropwise to a mixed solvent of a large amount of methanol/water (mass ratio: 8/2), and when the precipitated precipitate was collected by filtration and dried, 43.9 parts by mass of the resin (Pol-1) was acquired. The weight average molecular weight of the obtained resin (Pol-1) was 16800, the degree of dispersion (Mw/Mn) was 1.68, and the composition ratio measured by $^{13}$C-NMR was 20/20/45/15.

The same operation as for synthesis example 1 was performed and resins (Pol-2) to (Pol-20) were synthesized.

In the following Tables 1 to 4, the repeating units, the composition ratios (molar ratios), and the weight average molecular weights, and the degrees of dispersion are shown for the resins (Pol-1) to (Pol-20).

TABLE 1

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-1 | Unit1-1 (20) | Unit2-1 (20) | Unit3-1 (45) | — | Unit4-10 (15) | 16800 | 1.68 |
| Pol-2 | Unit1-5 (15) | Unit2-3 (40) | Unit3-2 (40) | Unit3-5 (5) | — | 18100 | 1.59 |

TABLE 1-continued

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-3 | Unit1-6 (10) | Unit2-4 (25) | Unit3-3 (50) | — | Unit4-1 (15) | 24100 | 1.66 |
| Pol-4 | Unit1-8 (25) | Unit2-7 (15) | Unit3-6 (60) | — | — | 26300 | 1.61 |
| Pol-5 | Unit1-7 (20) | Unit2-2 (10) | Unit3-2 (50) | Unit3-7 (20) | — | 19300 | 1.58 |
| Pol-6 | Unit1-3 (40) | Unit2-5 (5) | Unit3-4 (45) | — | Unit4-5 (10) | 15600 | 1.65 |

TABLE 2
| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-7 | 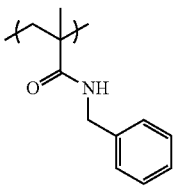<br>Unit1-4<br>(20) | 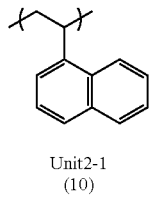<br>Unit2-1<br>(10) | 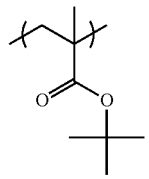<br>Unit3-1<br>(70) | — | — | 31200 | 1.60 |
| Pol-8 | 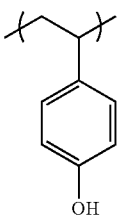<br>Unit1-2<br>(35) | 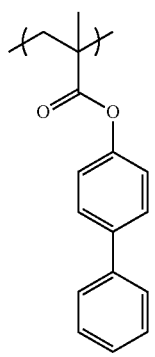<br>Unit2-6<br>(5) | 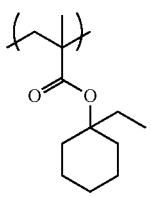<br>Unit3-6<br>(50) | 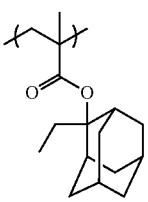<br>Unit3-8<br>(10) | — | 28600 | 1.56 |
| Pol-9 | 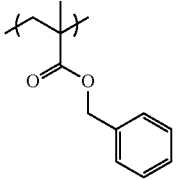<br>Unit1-5<br>(10) | — | 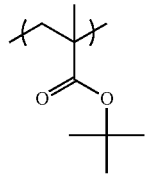<br>Unit3-1<br>(45) | — | 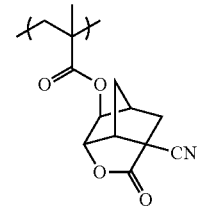<br>Unit4-2<br>(15) | 24800 | 1.67 |
| Pol-10 | 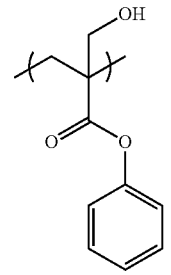<br>Unit1-8<br>(30) | — | 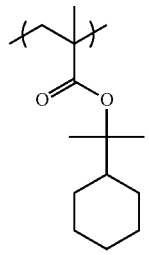<br>Unit3-3<br>(40) | 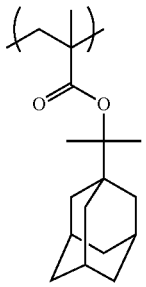<br>Unit3-7<br>(10) | 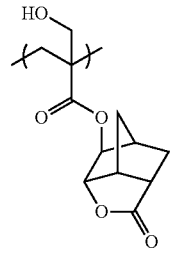<br>Unit4-9<br>(20) | 22100 | 1.58 |

TABLE 2-continued

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-11 | Unit1-3 (30) | — | Unit3-2 (50) | Unit3-6 (20) | — | 30200 | 1.62 |
| Pol-12 | Unit1-1 (30) | — | Unit3-5 (60) | — | Unit4-7 (10) | 19700 | 1.63 |

TABLE 3

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-13 | Unit1-7 (30) | Unit2-6 (10) | Unit3-9 (40) | — | Unit4-8 (20) | 21300 | 1.61 |
| Pol-14 | Unit1-4 (45) | Unit2-2 (5) | Unit3-3 (40) | — | Unit4-11 (10) | 25100 | 1.63 |

TABLE 3-continued

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-15 | 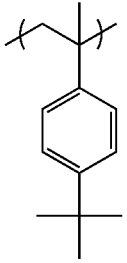<br>Unit1-3<br>(50) | — | 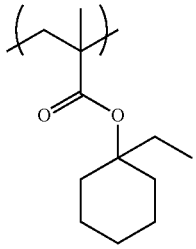<br>Unit3-6<br>(40) | — | 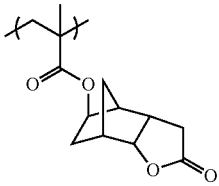<br>Unit4-3<br>(10) | 16300 | 1.58 |
| Pol-16 | 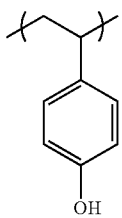<br>Unit1-2<br>(50) | — | 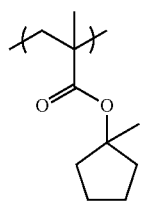<br>Unit3-4<br>(40) | — | 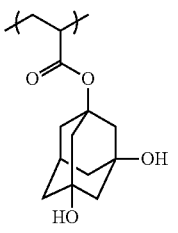<br>Unit4-6<br>(10) | 19700 | 1.66 |
| Pol-17 | 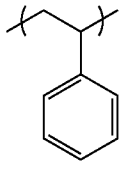<br>Unit1-1<br>(40) | 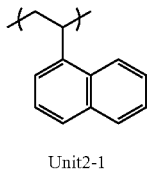<br>Unit2-1<br>(10) | 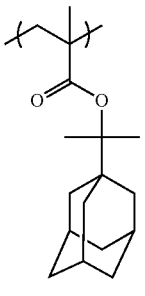<br>Unit3-7<br>(30) | — | 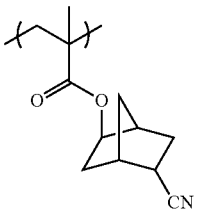<br>Unit4-4<br>(20) | 23800 | 1.68 |

TABLE 4

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-18 | 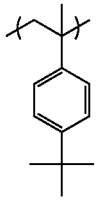<br>Unit1-3<br>(40) | — | 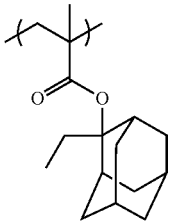<br>Unit3-8<br>(30) | — | <br>Unit4-11<br>(30) | 31000 | 1.63 |

TABLE 4-continued

| Resin | Unit 1 (Molar ratio) | Unit 2 (Molar ratio) | Unit 3-a (Molar ratio) | Unit 3-b (Molar ratio) | Unit 4 (Molar ratio) | Mw | Degree of dispersion |
|---|---|---|---|---|---|---|---|
| Pol-19 | Unit1-2 (60) | Unit2-1 (20) | Unit3-10 (20) | — | — | 25000 | 1.56 |
| Pol-20 | Unit1-2 (80) | — | Unit3-10 (20) | — | — | 24500 | 1.55 |

Examples 1 to 27 and Comparative Examples 1 to 3

Preparation of Actinic Ray-Sensitive or Radiation-Sensitive Resin Composition

The components shown in Table 5 below were dissolved in a solvent to prepare a resist solution for each Example. Each solution was filtered through a polyethylene filter having a pore size of 0.03 μm to prepare an actinic ray-sensitive or radiation-sensitive resin composition (resin composition) with a solid content density of 5.98% by mass.

TABLE 5

| Resist Composition | Resin-A (mass %)* | Resin-B (mass %) | Acid generator-A (mass %) | Acid generator-B (mass %) | Basic compound (mass %) | Compound (D) (mass %) | Surfactant (mass %) | Solvent (mass ratio) |
|---|---|---|---|---|---|---|---|---|
| Res-1 | Pol-1 (74.56) | Pol-4 (18.54) | PAG-1 (5.64) | — | N-1 (0.86) | — | W-6 (0.30) | SL-1/SL-5 (80/20) |
| Res-2 | Pol-2 (92.32) | — | PAG-2 (6.03) | — | N-3 (1.35) | — | W-1 (0.30) | SL-1/SL-2 (60/40) |
| Res-3 | Pol-3 (92.83) | — | PAG-3 (6.11) | — | N-2 (1.05) | — | — | SL-1/SL-3 (90/10) |
| Res-4 | Pol-5 (91.39) | — | PAG-5 (4.96) | — | N-4 (1.35) | Ad-1 (2.00) | W-2 (0.30) | SL-1/SL-5 (70/30) |
| Res-5 | Pol-6 (89.21) | — | PAG-8 (6.53) | — | N-2 (1.46) | Ad-6 (2.50) | W-3 (0.30) | SL-1/SL-4 (60/40) |
| Res-6 | Pol-7 (91.93) | — | PAG-8 (4.11) | — | N-1 (0.66) | Ad-5 (3.00) | W-5 (0.30) | SL-1 (100) |
| Res-7 | Pol-8 (90.61) | — | PAG-3 (5.57) | PAG-4 (1.05) | N-3 (0.97) | Ad-4 (1.50) | W-6 (0.30) | SL-1/SL-6 (80/20) |
| Res-8 | Pol-9 (90.29) | — | PAG-2 (5.13) | PAG-7 (0.97) | N-1 (0.81) | Ad-7 (2.50) | W-4 (0.30) | S-L-1/SL-2 (90/10) |
| Res-9 | Pol-10 (89.38) | — | PAG-1 (5.64) | — | N-2 (0.98) | Ad-6 (4.00) | — | SL-1/SL-5 (70/30) |
| Res-10 | Pol-11 (88.74) | — | PAG-3 (6.11) | — | N-3 (1.35) | Ad-2 (3.50) | W-2 (0.30) | SL-1/SL-4 (70/30) |
| Res-11 | Pol-12 (89.57) | — | PAG-3 (6.11) | — | N-1 (1.02) | Ad-1 (3.00) | W-6 (0.30) | SL-1/SL-5 (90/10) |
| Res-12 | Pol-13 (93.73) | — | PAG-5 (4.96) | — | N-2 (1.01) | — | W-1 (0.30) | SL-1/SL-5 (80/20) |
| Res-13 | Pol-14 (91.41) | — | PAG-2 (6.03) | — | N-3 (1.46) | Ad-3 (0.80) | W-4 (0.30) | SL-1/SL-5 (70/30) |
| Res-14 | Pol-15 (93.99) | — | PAG-8 (4.11) | — | N-4 (1.40) | Ad-4 (0.50) | — | SL-1/SL-7 (95/5) |
| Res-15 | Pol-16 (93.36) | — | PAG-1 (5.64) | — | — | Ad-1 (0.70) | W-6 (0.30) | SL-1/SL-4 (60/40) |
| Res-16 | Pol-17 (92.65) | — | PAG-2 (6.03) | — | N-1 (1.02) | — | W-3 (0.30) | SL-1/SL-6 (90/10) |

TABLE 5-continued

| Resist Composition | Resin-A (mass %)* | Resin-B (mass %) | Acid generator-A (mass %) | Acid generator-B (mass %) | Basic compound (mass %) | Compound (D) (mass %) | Surfactant (mass %) | Solvent (mass ratio) |
|---|---|---|---|---|---|---|---|---|
| Res-17 | Pol-18 (92.70) | — | PAG-2 (6.03) | — | N-1 (0.97) | — | W-6 (0.30) | SL-1/SL-5 (70/30) |
| Res-18 | Pol-19 (93.72) | — | PAG-5 (4.96) | — | N-2 (1.02) | — | W-4 (0.30) | SL-5/SL-4 (70/30) |
| Res-18 | Pol-20 (90.59) | — | PAG-1 (5.64) | — | N-3 (0.97) | Ad-1 (2.50) | W-4 (0.30) | SL-1/SL-4 (60/40) |
| Res-20 | Pol-4 (88.00) | — | PAG-1 (10.00) | — | N-2 (0.70) | Ad-8 (1.00) | W-6 (0.30) | SL-1 (100) |
| Res-21 | Pol-12 (85.00) | — | PAG-2 (5.00) | PAG-1 (5.00) | N-2 (0.70) | Ad-9 (4.00) | W-6 (0.30) | SL-1/SL-5 (80/20) |
| Res-22 | Pol-12 (87.00) | — | PAG-7 (10.00) | PAG-1 (1.00) | N-2 (0.70) | Ad-10 (1.00) | W-3 (0.30) | SL-1/SL-5 (60/40) |
| Res-23 | Pol-12 (53.00) | Pol-3 (30.00) | PAG-1 (10.00) | PAG-8 (5.00) | N-2 (0.70) | Ad-11 (1.00) | W-6 (0.30) | SL-1 (100) |
| Res-24 | Pol-12 (90.50) | — | PAG-2 (6.00) | PAG-8 (1.00) | N-3 (0.70) | Ad-12 (1.50) | W-2 (0.30) | SL-1 (100) |
| Res-25 | Pol-12 (91.00) | — | PAG-2 (6.00) | — | N-3 (0.70) | Ad-13 (2.00) | W-6 (0.30) | SL-1/SL-5 (80/20) |
| Res-26 | Pol-12 (89.00) | — | PAG-2 (6.00) | — | N-3 (0.70) | Ad-14 (4.00) | W-2 (0 39) | SL-1/SL-5 (60/40) |
| Res-27 | Pol-12 (92.00) | — | PAG-2 (6.00) | — | N-3 (0.70) | Ad-15 (1.00) | W-2 (0.30) | SL-1/SL-5 (80/20) |
| Res-28 | Pol-12 (92.00) | — | PAG-2 (6.00) | — | N-3 (0.70) | Ad-16 (1.00) | W-1 (0.30) | SL-1/SL-5 (60/40) |
| Res-29 | Pol-12 (92.00) | — | PAG-2 (3.00) | — | N-3 (0.70) | Ad-17 (4.00) | W-1 (0.30) | SL-1/SL-5 (80/20) |
| Res-30 | Pol-12 (91.00) | — | PAG-2 (6.00) | — | N-3 (0.70) | Ad-18 (2.00) | W-1 (0.30) | SL-1/SL-5 (60/40) |

* In the Table, (mass %) is a value based on the total solid content of the composition.

Components and reference numerals in the above Table 5 are as follows.
Acid Generator

[Chem. 41]

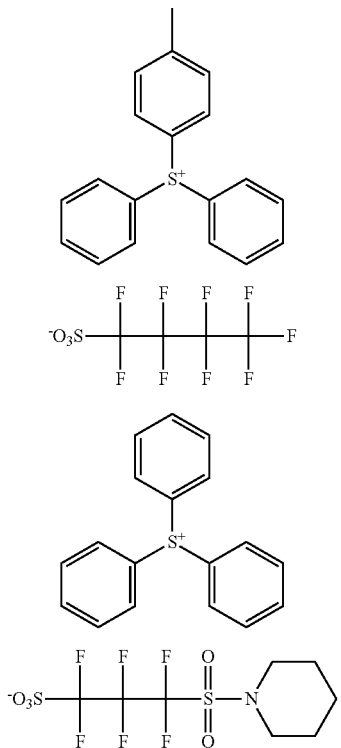

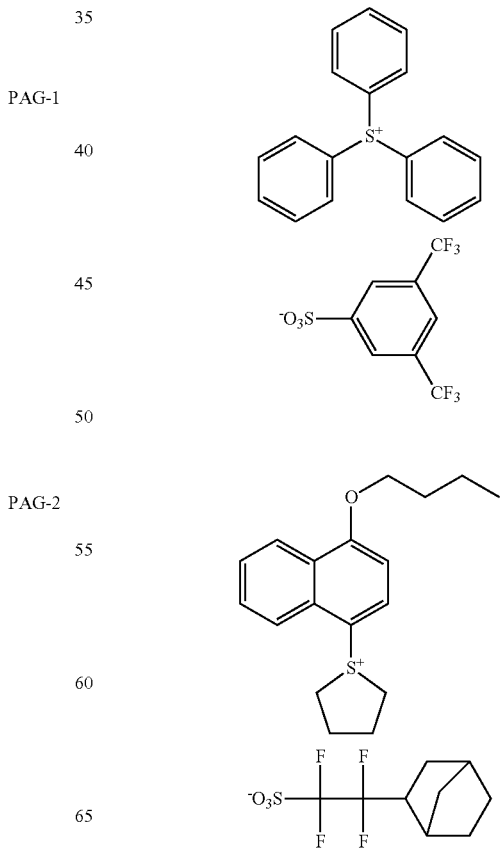

PAG-5
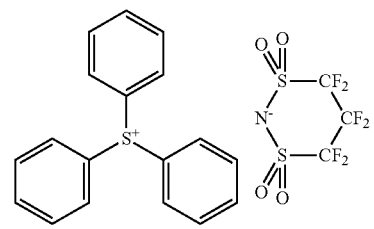
PAG-6
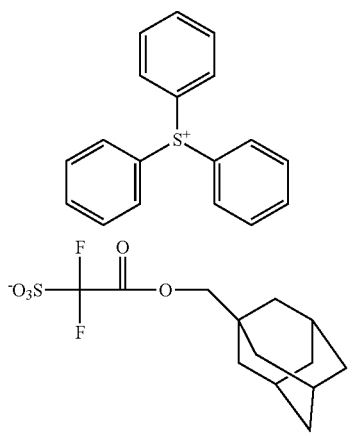
PAG-7
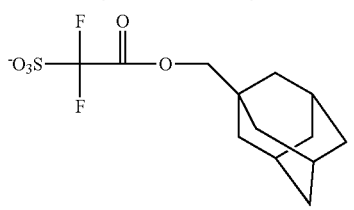
PAG-8
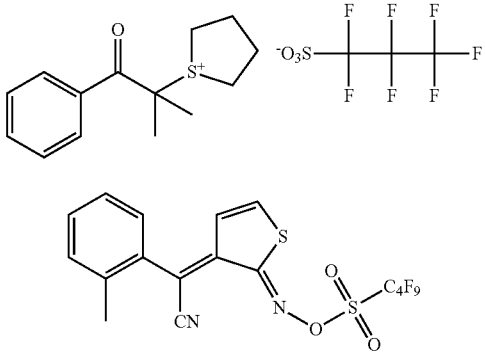
Basic compound
[Chem. 42]
N-1
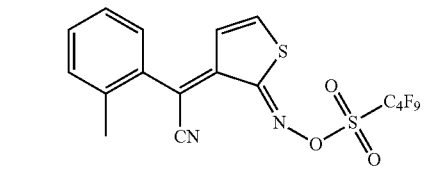
N-2
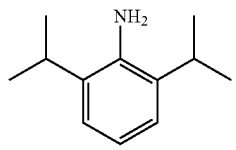
N-3
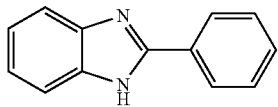
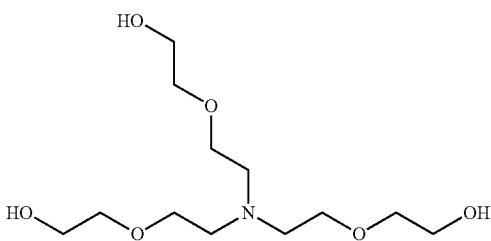
N-4
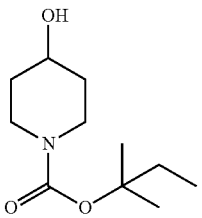
Compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure
[Chem. 43]
Ad-1
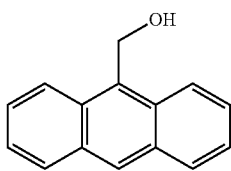
Ad-2
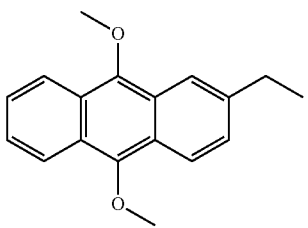
Ad-3
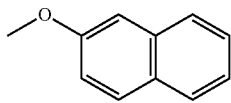
Ad-4
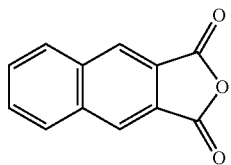
Ad-5
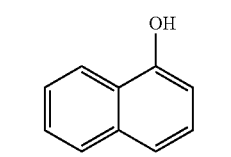
Ad-6
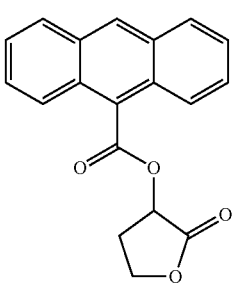

-continued

Ad-7 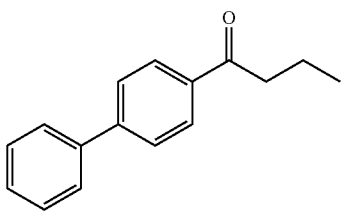

[Chem. 44]

Ad-8 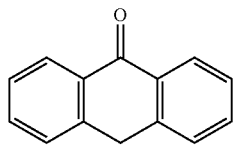

Ad-9 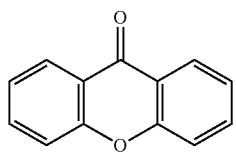

Ad-10 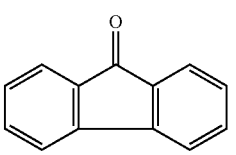

Ad-11 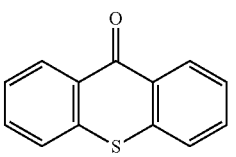

Ad-12 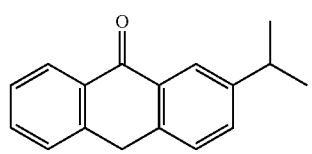

Ad-13 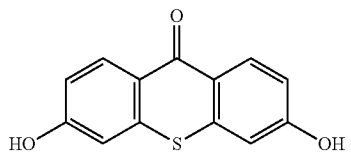

Ad-14 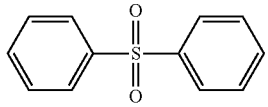

Ad-15 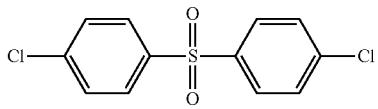

Ad-16 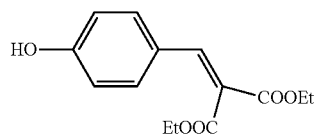

Ad-17 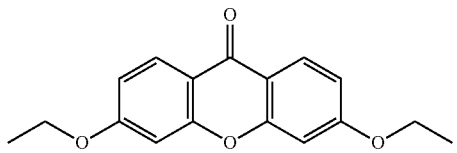

Ad-18 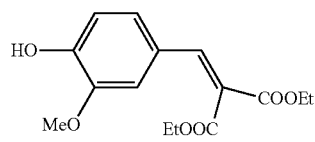

Surfactant
W-1: Megaface F176 (manufactured by Dainippon Ink & Chemicals, Inc.; fluorine-based)
W-2: Megaface R08 (manufactured by Dainippon Ink & Chemicals, Inc.; fluorine- and silicone-based)
W-3: Polysiloxane Polymer KP-341 (manufactured by Shin-Etsu Chemical Co., Ltd.; silicone-based)
W-4: Troysol S-366 (manufactured by Troy Chemical Co., Ltd.)
W-5: KH-20 (manufactured by Asahi Glass Co., Ltd.)
W-6: PolyFox PF-6320 (manufactured by OMNOVA Solutions Inc.; fluorine-based)
Solvent
SL-1: Propylene glycol monomethyl ether acetate (PGMEA)
SL-2: Propylene glycol monomethyl ether propionate
SL-3: Ethyl lactate
SL-4: Propylene glycol monomethyl ether (PGME)
SL-5: Cyclohexanone
SL-6: γ-butyrolactone
SL-7: Propylene carbonate The prepared actinic ray-sensitive or radiation-sensitive resin composition was evaluated according to the following method.

Exposure Latitude (EL)

The resist compositions shown in the above Table were coated on a silicon wafer (Bare-Si) and baking (PreBake; PB) was performed under the conditions shown in the following Table to form a resist film having a film thickness of 200 nm. Pattern exposure was performed on the obtained wafer using a KrF excimer laser scanner (NA0.80) through an exposure mask having a shield portion width of 170 nm and an opening portion width of 170 nm. Thereafter, after baking (Post Exposure Bake; PEB) under the conditions shown in the following Table, developing was performed for 30 seconds with the organic developer shown in the following Table, then, after rinsing with the rinsing liquid shown in the following Table (however, rinsing was not performed for those having no description of a rinsing liquid in the following Table), a line and space (1:1) pattern was obtained by rotating the wafer for 30 seconds at a rotation speed of 4000 rpm.

An exposure amount forming a line and space (1:1) resist pattern with a space width of 170 nm is set as the optimum exposure amount, an exposure amount width in which the pattern size when the exposure amount is changed is 170 nm±10% allowance is determined, and the value thereof is displayed as a percentage after being divided by the optimum exposure amount. The higher the value, the smaller the performance variations due to changes in exposure amount, whereby the exposure latitude becomes favorable.

Minimum Trench Width

Regarding the changes of the pattern size during the changing of the exposure amount in the above-described pattern, the trench width in the exposure amount immediately before the generation of a link with the bridge or the pattern bottom portion was set to the minimum trench width (nm). This is favorable since the smaller the value, the finer the trench that can be formed. However, for Comparative Example 2 and 3, evaluation was performed using an exposure mask having a shield width of 170 nm and an opening portion width of 170 nm.

Pattern Shape

The cross-sectional shape of the resist pattern in the obtained line and space (1:1) having a space width of 170 nm was observed using a scanning electron microscope (S-4800) manufactured by Hitachi High-Technologies Corporation, and the presence or absence of a standing wave was confirmed.

In a pattern with no standing wave, the dimensions of the outermost surface of the pattern and the substrate interface were expressed as a ratio, and the pattern shape was evaluated according to the following five grades. The closer the value is to 1.00, the greater the rectangularity, which is favorable.

A: 0.90 or more to less than 1.10
B-1: 0.80 or more to less than 0.90
B-2: 1.10 or more to less than 1.20
C-1: less than 0.80
C-2: 1.20 or more

LWR

The resist pattern in the obtained line and space (1:1) having a space width of 170 nm was observed using a length measuring scanning electron microscope (SEM Hitachi Ltd., S-9380II), the space width of 50 points (equally spaced) of a range of 2 μm in the longitudinal direction of the space pattern was measured, and 3σ was computed from the standard deviation, whereby measurement was performed. A smaller value indicates a higher performance.

Developing Defects

The resist compositions shown in the above Table were coated on a silicon wafer (Bare-Si) and baking (PreBake; PB) was performed under the conditions shown in the following Table to form a resist film having a film thickness of 200 nm. Pattern exposure was performed on the obtained wafer using a KrF excimer laser scanner (NA 0.80). Thereafter, after baking (Post Exposure Bake; PEB) under the conditions shown in the following Table, developing was performed for 30 seconds with the organic developer (however, an alkali developer for Comparative Examples 2 and 3 (2.38% TMAH aqueous solution)) shown in the following Table, then, after rinsing with the rinsing liquid shown in the following Table (however, rinsing was not performed for those having no description of a rinsing liquid in the following Table), a line and space pattern having a half pitch of 170 nm was obtained by rotating the wafer for 30 seconds at a rotation speed of 4000 rpm.

The number of defects of the obtained pattern (number per single sheet of 8-inch silicon wafer) was quantified, and evaluation was performed in the following manner.

A: 0 to 20
B: 21 to 50
C: 51 or more

The results are shown in Table 6 below.

Here, the reference numerals of the developer and the rinsing liquid in the following Table are as follows.

Developer and Rinsing Liquid
D-1: Butyl acetate
D-2: Pentyl acetate
D-3: 2-heptanone
D-4: 1-hexanol
D-5: 4-methyl-2-pentanol
D-6: decane
D-7: octane
D-8: 1-hexanol
D-9: 2.38% TMAH aqueous solution
D-10: pure water

TABLE 6

| | Resist Composition | PB | PEB | Developer | Rinsing liquid | EL(%) | Minimum trench width (nm) | Standing wave | Shape | LWR (nm) | Developing defects |
|---|---|---|---|---|---|---|---|---|---|---|---|
| Example 1 | Res-1 | 100° C./60 seconds | 120° C./60 seconds | D-1 | D-5 | 26.8 | 88.3 | No | A | 5.1 | A |
| Example 2 | Res-2 | 110° C./60 seconds | 110° C./60 seconds | D-2 | — | 29.9 | 95.3 | No | A | 5.3 | A |
| Example 3 | Res-3 | 105° C./50 seconds | 105° C./60 seconds | D-1 | — | 30.7 | 86.7 | No | A | 5.1 | A |
| Example 4 | Res-4 | 95° C./60 seconds | 110° C./50 seconds | D-3 | — | 27.9 | 90.2 | No | A | 5.0 | A |
| Example 5 | Res-5 | 100° C./50 seconds | 110° C./60 seconds | D-1 | D-4 | 29.0 | 91.3 | No | A | 5.5 | A |
| Example 6 | Res-6 | 100° C./60 seconds | 120° C./60 seconds | D-2 | — | 30.5 | 89.0 | No | A | 5.1 | A |
| Example 7 | Res-7 | 105° C./60 seconds | 100° C./60 seconds | D-1 | — | 27.1 | 95.2 | No | A | 5.3 | A |
| Example 8 | Res-8 | 100° C./60 seconds | 110° C./60 seconds | D-1 | D-5 | 28.6 | 93.4 | No | A | 5.3 | A |
| Example 9 | Res-9 | 100° C./60 seconds | 115° C./60 seconds | D-3 | — | 26.9 | 96.7 | No | A | 5.4 | A |
| Example 10 | Res-10 | 95° C./60 seconds | 120° C./60 seconds | D-3 | D-5 | 28.0 | 90.5 | No | A | 5.1 | A |
| Example 11 | Res-11 | 110° C./60 seconds | 110° C./60 seconds | D-1 | — | 29.1 | 97.8 | No | A | 5.5 | A |
| Example 12 | Res-12 | 120° C./60 seconds | 110° C./50 seconds | D-2 | D-8 | 24.3 | 104.2 | No | B-2 | 6.1 | B |
| Example 13 | Res-13 | 100° C./50 seconds | 120° C./60 seconds | D-1 | D-6 | 21.3 | 103.4 | No | B-2 | 5.8 | B |

TABLE 6-continued

| | Resist Composition | PB | PEB | Developer | Rinsing liquid | EL(%) | Minimum trench width (nm) | Standing wave | Pattern shape Shape | LWR (nm) | Developing defects |
|---|---|---|---|---|---|---|---|---|---|---|---|
| Example 14 | Res-14 | 110° C./60 seconds | 105° C./60 seconds | D-1 | — | 23.1 | 101.3 | No | B-2 | 6.3 | B |
| Example 15 | Res-15 | 100° C./60 seconds | 110° C./60 seconds | D-1 | D-7 | 22.8 | 102.3 | No | B-2 | 6.0 | B |
| Example 16 | Res-16 | 100° C./50 seconds | 120° C./60 seconds | D-2 | — | 21.5 | 105.1 | No | B-2 | 6.2 | B |
| Example 17 | Res-20 | 90° C./60 seconds | 100° C./60 seconds | D-1 | D-5 | 25.0 | 90.0 | No | A | 5.5 | A |
| Example 18 | Res-21 | 100° C./60 seconds | 105° C./60 seconds | D-1 | | 24.0 | 88.0 | No | A | 5.8 | A |
| Example 19 | Res-22 | 100° C./60 seconds | 100° C./60 seconds | D-1 | — | 23.0 | 92.0 | No | A | 5.9 | A |
| Example 20 | Res-23 | 100° C./60 seconds | 100° C./60 seconds | D-1 | — | 26.0 | 91.0 | No | A | 5.7 | A |
| Example 21 | Res-24 | 100° C./60 seconds | 90° C./60 seconds | D-1 | — | 25.0 | 89.0 | No | A | 6.0 | A |
| Example 22 | Res-25 | 100° C./60 seconds | 85° C./60 seconds | D-1 | D-8 | 24.0 | 93.0 | No | A | 6.1 | A |
| Example 23 | Res-26 | 100° C./60 seconds | 100° C./60 seconds | D-1 | D-5 | 23.0 | 87.0 | No | A | 5.9 | A |
| Example 24 | Res-27 | 90° C./60 seconds | 100° C./60 seconds | D-1 | D-5 | 26.0 | 89.0 | No | A | 5.8 | A |
| Example 25 | Res-28 | 90° C./60 seconds | 100° C./60 seconds | D-1 | | 24.0 | 88.0 | No | A | 6.0 | A |
| Example 26 | Res-29 | 100° C./60 seconds | 100° C./60 seconds | D-1 | | 25.0 | 88.0 | No | A | 6.1 | A |
| Example 27 | Res-30 | 100° C./60 seconds | 100° C./60 seconds | D-1 | | 25.0 | 87.0 | No | A | 5.9 | A |
| Comparative Example 1 | Res-17 | 95° C./60 seconds | 115° C./60 seconds | D-1 | — | 20.6 | 110.5 | Yes | — | 6.9 | C |
| Comparative Example 2 | Res-18 | 100° C./60 seconds | 120° C./60 seconds | D-9 | D-10 | 19.4 | 139.5 | Yes | — | 7.1 | C |
| Comparative Example 3 | Res-19 | 105° C./60 seconds | 115° C./60 seconds | D-9 | D-10 | 18.3 | 133.9 | No | C-1 | 6.3 | B |

As is apparent from Table 6, for the resin of the Comparative Example 1 which has a repeating unit having an acid-decomposable group and a repeating unit having an aromatic group; however, does not have a repeating unit having a naphthyl group, a biphenyl group, an anthryl group, a fluorenone structure, an anthrone structure, a xanthone structure, a thioxanthone structure, a vinyl benzene structure or a diphenyl sulfone structure, it is understood that a standing wave was generated and unevenness appeared on the side wall of the pattern, therefore, the obtained resist pattern was not smooth, the minimum trench width was large, the number of development defects was large, and the EL and LWR were both inferior.

For Comparative Example 2 which used an alkali developer, that is, for the resist pattern obtained by positive type developing, it is understood that a standing wave was generated and unevenness appeared on the side wall of the pattern, therefore, the obtained resist pattern was not smooth, the number of development defects was large, the EL and LWR were both inferior, the minimum trench width was particularly large, and fine trench forming was difficult to perform.

For Comparative Example 3 which used the compound (D) having an anthryl group, obtained by the positive type developing, it is understood that the generation of a standing wave was inhibited but the pattern shape was insufficient, the number of development defects was large, the EL and LWR were both inferior, the minimum trench width was particularly large, and fine trench forming was difficult to perform.

Meanwhile, for Examples 1 to 27 which are resins using at least one of a resin (A) having a repeating unit having a naphthyl group, a biphenyl group, an anthryl group, a fluorenone structure, an anthrone structure, a xanthone structure, a thioxanthone structure, a vinyl benzene structure or a diphenyl sulfone structure, or a compound (D) having a naphthalene ring, an anthracene ring, a fluorenone ring, an anthrone ring, a xanthone ring, a thioxanthone ring, a vinyl benzene structure or a diphenyl sulfone structure, it is understood that a standing wave was not generated, the rectangularity of the pattern was also high, the minimum trench width was small, the number of development defects was small, and the EL and LWR were both superior.

In addition, for the Examples 1 to 11 and 11 to 27 in which the content of the repeating units having the napthyl group or the like is 15 to 45 mol % based on all of the repeating units in the resin (A), or the content of the compound (D) having a naphthalene ring or the like is 1.0 to 4.5% by mass in the total solid content of the resin composition, it is understood that the rectangularity of the pattern was particularly high, the minimum trench width was also particularly small, the number of defects was also particularly small, and the EL and LWR were also particularly excellent.

The present application is a continuation application of International Application No. PCT/JP2012/081427, filed Nov. 28, 2012, which claims priority to Japanese Patent Application No. 2011-263003, filed Nov. 30, 2011, and Japanese Patent Application No. 2012-254323, filed Nov. 20, 2012. The contents of these applications are incorporated herein by reference in their entirety.

What is claimed is:

1. A pattern forming method comprising:
   (i) forming a film using an actinic ray-sensitive or radiation-sensitive resin composition containing a resin (A) having a repeating unit having a group generating a polar group upon being decomposed by the action of an acid, and a repeating unit having an aromatic group, a compound (B) generating an acid upon irradiation with actinic rays or radiation, and a solvent (C);
   (ii) exposing the film; and
   (iii) developing the exposed film using a developer including an organic solvent to form a negative tone pattern,
   wherein the repeating unit having an aromatic group is a repeating unit represented by the following general formula (II):

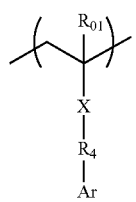

(II)

wherein, in general formula (II), $R_{01}$ represents a hydrogen atom or an alkyl group, X represents a single bond or a divalent linking group, Ar represents an unsubstituted naphthyl group, a naphthyl group having at least one of substituent selected from the group consisting of a linear or branched alkyl group having 1 to 4 carbon atoms, a cycloalkyl group having 3 to 10 carbon atoms, an aryl group having 6 to 10 carbon atoms, a halogen atom, a cyano group, an amino group and a nitro group, a biphenyl group, an anthryl group, a fluorenone structure, an anthrone structure, a xanthone structure, a thioxanthone structure, a vinyl benzene structure or a diphenyl sulfone structure, and $R_4$ represents a single bond or an alkylene group, a biphenyl group, an anthryl group, a fluorenone structure, an anthrone structure, a xanthone structure, a thioxanthone structure, a vinyl benzene structure or a diphenyl sulfone structure.

2. The pattern forming method according to claim 1, wherein the repeating unit having a group generating a polar group upon being decomposed by an action of an acid is a repeating unit represented by the following general formula (I):

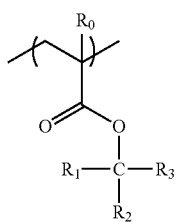

(I)

wherein, in general formula (I), $R_0$ represents a hydrogen atom or an alkyl group, $R_1$ to $R_3$ each independently represents an alkyl group or a cycloalkyl group, and two of $R_1$ to $R_3$ may be combined to form a monocyclic or polycyclic cycloalkyl group.

3. The pattern forming method according to claim 1, wherein, in the general formula (II), X is —COO— or —CONH—.

4. The pattern forming method according to claim 1, wherein the resin (A) further comprises a unit having a structure of the following formula (III), wherein the unit is present in the resin in an amount of 20 mol% or less:

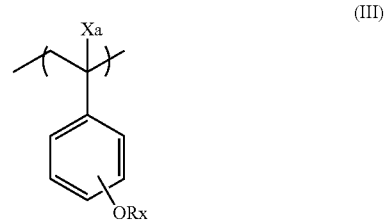

(III)

wherein, in general formula (III),

Xa represents a hydrogen atom or an alkyl group, and

Rx represents a hydrogen atom or a group which leaves upon being decomposed by an action of an acid.

5. The pattern forming method according to claim 4, wherein the amount of the unit having the structure of the formula (III) is 0 mol%.

6. The pattern forming method according to claim 1, wherein the content of the aromatic group-containing repeating unit of general formula (II) is 5 to 65 mol%, based on all the repeating units in the resin (A).

7. The pattern forming method according to claim 1, wherein the content of the repeating unit having a group generating a polar group upon being decomposed by an action of an acid is 35 mol% or more, based on all the repeating units in the resin (A).

8. The pattern forming method according to claim 1, wherein the exposure in step (ii) is exposure using a KrF excimer laser.

9. The pattern forming method according to claim 1, wherein the developer is a developer including at least one organic solvent selected from a group consisting of a ketone-based solvent, an ester-based solvent, an alcohol-based solvent, an amide-based solvent, and an ether-based solvent.

10. The pattern forming method according to claim 1, wherein the content of the organic solvent in the developer is from 90% by mass to 100% by mass.

11. An actinic ray-sensitive or radiation-sensitive resin composition used in the pattern forming method according to claim 1, the composition comprising:

a resin (A) having a repeating unit having a group generating a polar group upon being decomposed by the action of an acid, and a repeating unit having an aromatic group;

a compound (B) generating an acid upon irradiation with actinic rays or radiation; and a solvent (C), wherein the repeating unit having an aromatic group is a repeating unit represented by the following general formula (II),

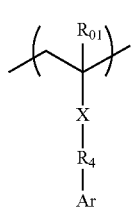

(II)

wherein, in general formula (II), $R_{01}$ represents a hydrogen atom or an alkyl group, X represents a single bond or a divalent linking group, Ar represents an unsubstituted naphthyl group, a naphthyl group having at least one of substituents selected from the group consisting of a linear or branched alkyl group having 1 to 4 carbon atoms, a cycloalkyl group having 3 to 10 carbon atoms, an aryl group having 6 to 10 carbon atoms, a halogen atom, a cyano group, an amino group and a nitro group, a biphenyl group, an anthryl group, a fluorenone structure, an anthrone structure, a xanthone structure, a thioxanthone structure, a vinyl benzene structure or a diphenyl sulfone structure, and $R_4$ represents a single bond or an alkylene group, a biphenyl group, an anthryl group, a fluorenone structure, an anthrone structure, a xanthone structure, a thioxanthone structure, a vinyl benzene structure or a diphenyl sulfone structure.

12. A resist film formed with the actinic ray-sensitive or radiation-sensitive resin composition according to claim 11.

13. A method for manufacturing an electronic device comprising:

providing a substrate, and applying the pattern forming method according to claim 1 to the substrate.

14. An electronic device prepared by the method for manufacturing an electronic device according to claim 13.

15. A pattern forming method comprising:

(i) forming a film using an actinic ray-sensitive or radiation-sensitive resin composition containing a resin (A) having a repeating unit having a group generating a polar group upon being decomposed by the action of an acid, and a repeating unit having an aromatic group, a compound (B) generating an acid upon irradiation with actinic rays or radiation, and a solvent (C);

(ii) exposing the film; and (iii) developing the exposed film using a developer including an organic solvent to form a negative tone pattern, wherein, the actinic ray-sensitive or radiation-sensitive resin composition further comprises a compound (D) selected from the group consisting of a compound represented by formula (A1), a compound represented by formula (A2), a compound represented by formula (A3), a compound represented by formula (Ad-8), a compound represented by formula (Ad-10), a compound represented by formula (Ad-12), a compound represented by formula (Ad-16), a compound represented by formula (Ad-18), a compound having a xanthone ring, a compound having a thioxanthon ring, and a compound having a diphenyl sulfone structure,

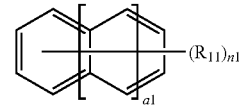

(A1)

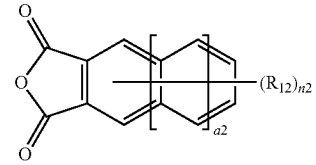

(A2)

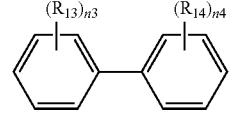

(A3)

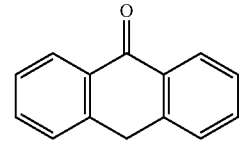

Ad-8

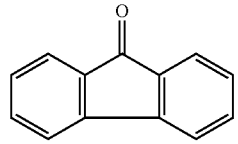

Ad-10

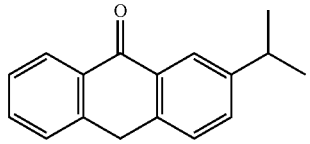

Ad-12

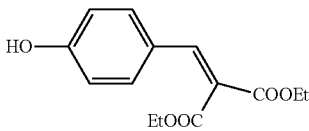

Ad-16

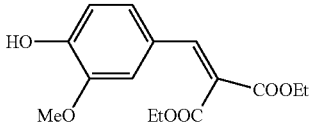

Ad-18 wherein, in the formulae (A1), (A2), and (A3), $R_{11}$, $R_{12}$, $R_{13}$, and $R_{14}$ each independently represents a hydroxyl group, an alkyl group, an alkoxy group, an alkoxycarbonyl group, an alkylcarbonyl group, or a lactonyl oxy carbonyl group, a1 represents 1 or 2, a2 represents 1 or 2, n1 represents an integer of 0 to 10, n2 represents an integer of 0 to 8, n3 represents an integer of 0 to 5, and n4 represents an integer of 0 to 5.

16. The pattern forming method according to claim 15, wherein the repeating unit having a group generating a polar group upon being decomposed by an action of an acid is a repeating unit represented by the following general formula (I):

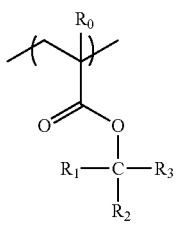

(I)

wherein in general formula (I), $R_0$ represents a hydrogen atom or an alkyl group, $R_1$ to $R_3$ each independently represents an alkyl group or a cycloalkyl group, and two of $R_1$ to $R_3$ may be combined to form a monocyclic or polycyclic cycloalkyl group.

17. The pattern forming method according to claim 15, wherein the content of the compound (D) is 0.1 to 6.0% by mass, based on the total solids content of the actinic ray-sensitive or radiation-sensitive resin composition.

18. The pattern forming method according to claim 15, wherein the exposure in step (ii) is exposure using a KrF excimer laser.

19. The pattern forming method according to claim 15, wherein the developer is a developer including at least one organic solvent selected from a group consisting of a ketone-based solvent, an ester-based solvent, an alcohol-based solvent, an amide-based solvent, and an ether-based solvent.

20. The pattern forming method according to claim 15 wherein the content of the organic solvent in the developer is from 90% by mass to 100% by mass.

21. An actinic ray-sensitive or radiation-sensitive resin composition used in the pattern forming method according to claim 19, the composition comprising:

a resin (A) having a repeating unit having a group generating a polar group upon being decomposed by the action of an acid, and a repeating unit having an aromatic group;

a compound (B) generating an acid upon irradiation with actinic rays or radiation; and a solvent (C), wherein, the actinic ray-sensitive or radiation-sensitive resin composition further comprises a compound (D) selected from the group consisting of a compound represented by formula (A1), a compound represented by formula (A2), a compound represented by formula (A3), a compound represented by formula (Ad-8), a compound represented by formula (Ad-10), a compound represented by formula (Ad-12), a compound represented by formula (Ad-16), a compound represented by formula (Ad-18), a compound having a xanthone ring, a compound having a thioxanthon ring and a compound having a diphenyl sulfone structure,

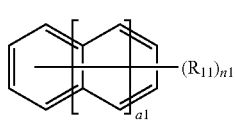

(A1)

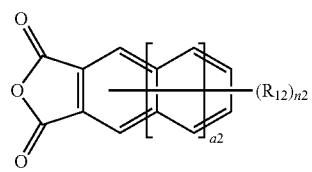

(A2)

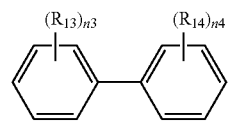

(A3)

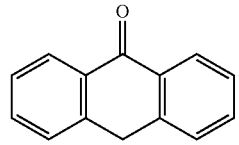

Ad-8

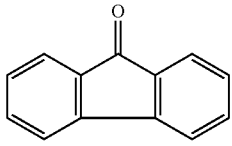

Ad-10

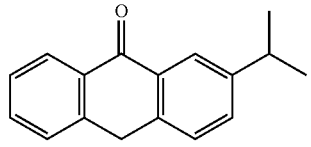

Ad-12

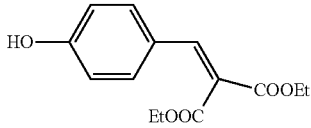

Ad-16

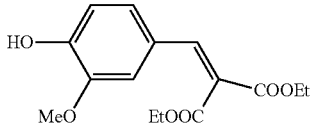

Ad-18 wherein, in the formulae (A1), (A2), and (A3), $R_{11}$, $R_{12}$, $R_{13}$, and $R_{14}$ each independently represents a hydroxyl group, an alkyl group, an alkoxy group, an alkoxycarbonyl group, an alkylcarbonyl group, or a lactonyl oxy carbonyl group, a1 represents 1 or 2, a2 represents 1 or 2, n1 represents an integer of 0 to 10, n2 represents an integer of 0 to 8, n3 represents an integer of 0 to 5, and n4 represents an integer of 0 to 5.

22. A method for manufacturing an electronic device comprising:

providing a substrate, and applying the pattern forming method according to claim 15 to the substrate.

23. A pattern forming method comprising:

(i) forming a film using an actinic ray-sensitive or radiation-sensitive resin composition containing a resin (A) having a repeating unit having a group generating a polar group upon being decomposed by the action of an acid, and a repeating unit having an aromatic group, a compound (B) generating an acid upon irradiation with actinic rays or radiation, a solvent (C), and a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure;

(ii) exposing the film; and (iii) developing the exposed film using a developer including an organic solvent to form a negative tone pattern, wherein the actinic ray-sensitive or radiation-sensitive resin composition further comprises a basic compound (E).

24. The pattern forming method according to claim 23, wherein the repeating unit having a group generating a polar group upon being decomposed by an action of an acid is a repeating unit represented by the following general formula (I):

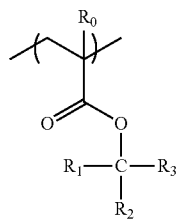

wherein in general formula (I), $R_0$ represents a hydrogen atom or an alkyl group, $R_1$ to $R_3$ each independently represents an alkyl group or a cycloalkyl group, and two of $R_1$ to $R_3$ may be combined to form a monocyclic or polycyclic cycloalkyl group.

25. The pattern forming method according to claim 23, wherein the content of the compound (D) is 0.1 to 6.0% by mass, based on the total solids content of the actinic ray-sensitive or radiation-sensitive resin composition.

26. The pattern forming method according to claim 23, wherein the exposure in step (ii) is exposure using a KrF excimer laser.

27. The pattern forming method according to claim 23, wherein the developer is a developer including at least one organic solvent selected from a group consisting of a ketone-based solvent, an ester-based solvent, an alcohol-based solvent, an amide-based solvent, and an ether-based solvent.

28. The pattern forming method according to claim 23, wherein the content of the organic solvent in the developer is from 90% by mass to 100% by mass.

29. An actinic ray-sensitive or radiation-sensitive resin composition used in the pattern forming method according to claim 23, the composition comprising:

a resin (A) having a repeating unit having a group generating a polar group upon being decomposed by the action of an acid, and a repeating unit having an aromatic group;

a compound (B) generating an acid upon irradiation with actinic rays or radiation;

a solvent (C); and a compound (D) having a naphthalene ring, a biphenyl ring, an anthracene ring, a fluorenone ring, an anthrone ring, a xanthone ring, a thioxanthone ring, a vinyl benzene structure or a diphenyl sulfone structure, wherein the actinic ray-sensitive or radiation-sensitive resin composition further comprises a basic compound (E).

30. A method for manufacturing an electronic device comprising:

providing a substrate, and applying the pattern forming method according to claim 23 for the substrate.

* * * * *